US012666954B2

(12) United States Patent
Park

(10) Patent No.: US 12,666,954 B2
(45) Date of Patent: Jun. 23, 2026

(54) SEMICONDUCTOR DEVICE INCLUDING VARIABLE RESISTANCE PATTERN AND ELECTRONIC SYSTEM INCLUDING THE SEMICONDUCTOR DEVICE

(71) Applicant: SAMSUNG ELECTRONICS CO., LTD., Suwon-si (KR)

(72) Inventor: Hyunmog Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 466 days.

(21) Appl. No.: 18/198,081

(22) Filed: May 16, 2023

(65) Prior Publication Data
US 2024/0105603 A1 Mar. 28, 2024

(30) Foreign Application Priority Data
Sep. 22, 2022 (KR) ........................ 10-2022-0120094

(51) Int. Cl.
*H10W 20/41* (2026.01)
*H10B 41/10* (2023.01)
(Continued)

(52) U.S. Cl.
CPC .......... *H10W 20/435* (2026.01); *H10B 41/10* (2023.02); *H10B 41/27* (2023.02);
(Continued)

(58) Field of Classification Search
CPC ............. H01L 23/5283; H01L 23/5226; H01L 25/0652; H01L 2225/06524; H10B 41/10;
(Continued)

(56) References Cited

U.S. PATENT DOCUMENTS 9,202,819 B2 * 12/2015 Lee ...................... H10D 30/693
11,233,063 B2 1/2022 Jang et al.
(Continued)

FOREIGN PATENT DOCUMENTS

EP 3 772 062 A1 2/2021
KR 10-2020-0038138 A 4/2020
(Continued)

OTHER PUBLICATIONS

Communication dated Nov. 11, 2024, issued by the European Patent Office in European Application No. 23182637.1.
(Continued)

*Primary Examiner* — Galina G Yushina
(74) *Attorney, Agent, or Firm* — Sughrue Mion, PLLC

(57) ABSTRACT

A semiconductor device is provided. The semiconductor device includes: gate lines spaced apart from each other between a conductive layer and a conductive pad; and a channel structure extending through the gate lines. The channel structure includes: a channel region which defines a columnar space, and includes a first channel end in contact with the conductive pad and a second channel end in contact with the conductive layer; and a variable resistance pattern including an outer sidewall and a first end, the outer sidewall overlapping first gate lines, from among the gate lines, in a horizontal direction with the channel region therebetween, the first end being spaced apart from the first channel end of the channel region, and the variable resistance pattern being offset from, in the vertical direction, at least one second gate line that is closest, from among the gate lines, to the conductive pad.

20 Claims, 42 Drawing Sheets

(51) Int. Cl.

| | |
|---|---|
| *H10B 41/27* | (2023.01) |
| *H10B 41/35* | (2023.01) |
| *H10B 41/40* | (2023.01) |
| *H10B 43/10* | (2023.01) |
| *H10B 43/27* | (2023.01) |
| *H10B 43/35* | (2023.01) |
| *H10B 43/40* | (2023.01) |
| *H10B 80/00* | (2026.01) |
| *H10W 20/42* | (2026.01) |
| *H10W 90/00* | (2026.01) |
| *H10W 90/20* | (2026.01) |

(52) U.S. Cl.
CPC ............. *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H10B 80/00* (2023.02); *H10W 20/42* (2026.01); *H10W 90/00* (2026.01); *H10W 90/20* (2026.01)

(58) Field of Classification Search
CPC ........ H10B 41/27; H10B 41/35; H10B 41/40; H10B 80/00; H10B 63/84; H10B 63/35; H10B 43/35; H10B 43/10; H10B 43/27; H10N 70/24; H10N 70/8265; H10N 70/8833; H10N 70/2534; H10N 70/826; H10W 20/435; H10W 20/42; H10W 90/00; H10W 90/20
See application file for complete search history.

(56) References Cited

U.S. PATENT DOCUMENTS

| | | | |
|---|---|---|---|
| 2010/0117143 | A1 | 5/2010 | Lee et al. |
| 2011/0235408 | A1* | 9/2011 | Minemura ........... H10N 70/826 257/E47.002 |
| 2011/0316063 | A1* | 12/2011 | Tang ...................... G11C 16/10 257/314 |
| 2013/0328005 | A1* | 12/2013 | Shin ....................... H10B 63/34 257/1 |
| 2014/0145137 | A1* | 5/2014 | Ju ....................... H10N 70/8833 257/2 |
| 2016/0343442 | A1 | 11/2016 | Masuoka et al. |
| 2020/0395412 | A1* | 12/2020 | Lee ...................... H10N 70/881 |
| 2021/0036002 | A1* | 2/2021 | Lee ........................ H10B 43/27 |
| 2021/0151101 | A1 | 5/2021 | Lee et al. |
| 2021/0217473 | A1* | 7/2021 | Cho ..................... G11C 13/004 |
| 2021/0265565 | A1 | 8/2021 | Hayakawa et al. |
| 2021/0399017 | A1 | 12/2021 | Sun et al. |
| 2022/0020818 | A1 | 1/2022 | Kim et al. |
| 2022/0077235 | A1 | 3/2022 | Kim et al. |
| 2023/0077589 | A1* | 3/2023 | Choi ................. H10N 70/8836 257/4 |
| 2023/0292500 | A1* | 9/2023 | Choi ...................... H10B 20/60 |

FOREIGN PATENT DOCUMENTS

| | | |
|---|---|---|
| KR | 10-2020-0142173 A | 12/2020 |
| KR | 10-2021-0107304 A | 9/2021 |
| KR | 10-2022-0031835 A | 3/2022 |

OTHER PUBLICATIONS

Communication issued Jan. 31, 2024 by the European Patent Office in European Patent Application No. 23182637.1.
Communication dated Mar. 19, 2026, issued by the Korean Ministry of Intellectual Property in Korean Application No. 10-2022-0120094.

* cited by examiner

CHH 187
132
134
132

134
132

510

II–II'

SEMICONDUCTOR DEVICE INCLUDING VARIABLE RESISTANCE PATTERN AND ELECTRONIC SYSTEM INCLUDING THE SEMICONDUCTOR DEVICE

CROSS-REFERENCE TO RELATED APPLICATION

This application is based on and claims priority to Korean Patent Application No. 10-2022-0120094, filed on Sep. 22, 2022, in the Korean Intellectual Property Office, the disclosure of which is incorporated by reference herein in its entirety.

BACKGROUND

The present disclosure relates to a semiconductor device and an electronic system including the semiconductor device, and more particularly, to a semiconductor device, which includes a nonvolatile vertical memory device including a variable resistance pattern, and an electronic system including the semiconductor device.

Electronic systems which store data may use semiconductor devices capable of storing large amounts of data, and thus, methods of increasing the data storage capacity of semiconductor devices are being studied. For example, semiconductor devices may include three-dimensionally arranged memory cells instead of two-dimensionally arranged memory cells to increase the data storage capacity.

SUMMARY

Example embodiments provide a semiconductor device that includes three-dimensionally arranged memory cells and has a structure that provides improved electrical characteristics.

Example embodiments also provide an electronic system that includes a semiconductor device with three-dimensionally arranged memory cells and a structure that provides improved electrical characteristics.

According to an aspect of an example embodiment, a semiconductor device includes: a conductive layer; a conductive pad spaced apart from the conductive layer in a vertical direction; a plurality of gate lines spaced apart from each other in the vertical direction between the conductive layer and the conductive pad; and a channel structure extending in the vertical direction through the plurality of gate lines. The channel structure includes: a channel region which defines a columnar space, and includes a first channel end in contact with the conductive pad and a second channel end in contact with the conductive layer; and a variable resistance pattern including an outer sidewall and a first end, the outer sidewall overlapping a plurality of first gate lines, from among the plurality of gate lines, in a horizontal direction with the channel region therebetween, the first end being spaced apart from the first channel end of the channel region in the vertical direction, and the variable resistance pattern being offset from, in the vertical direction, at least one second gate line, from among the plurality of gate lines, that is adjacent to the conductive pad.

According to another aspect of an example embodiment, a semiconductor device includes: a common source line; a conductive pad spaced apart from the common source line in a vertical direction; a plurality of gate lines spaced apart from each other in the vertical direction between the common source line and the conductive pad; and a channel structure extending in the vertical direction through the plurality of gate lines. The plurality of gate lines include a first select gate line adjacent to the conductive pad, a second select gate line adjacent to the common source line, and a plurality of word lines between the first select gate line and the second select gate line. The channel structure includes: a channel region, which includes a first channel end contacting the conductive pad and a second channel end contacting the common source line; a gate dielectric film between the channel region and the plurality of gate lines; and a variable resistance pattern including an outer sidewall and a first end, the outer sidewall facing the plurality of word lines in a horizontal direction with the channel region and the gate dielectric film therebetween, and the first end being spaced apart from the first channel end of the channel region in the vertical direction and offset from the first select gate line in the vertical direction.

According to yet another aspect of an example embodiment, an electronic system includes: a semiconductor device on a substrate; and a controller provided on the substrate and electrically connected with the semiconductor device. The semiconductor device includes: a conductive layer; a conductive pad spaced apart from the conductive layer in a vertical direction; a plurality of gate lines spaced apart from each other in the vertical direction between the conductive layer and the conductive pad; and a channel structure extending in the vertical direction through the plurality of gate lines. The channel structure includes: a channel region which defines a columnar space, and includes a first channel end in contact with the conductive pad and a second channel end in contact with the conductive layer; and a variable resistance pattern including an outer sidewall and a first end, the outer sidewall overlapping a plurality of first gate lines, from among the plurality of gate lines, in a horizontal direction with the channel region therebetween, the first end being spaced apart from the first channel end of the channel region in the vertical direction, and the variable resistance pattern being offset from, in the vertical direction, at least one second gate line, from among the plurality of gate lines, that is adjacent to the conductive pad.

BRIEF DESCRIPTION OF DRAWINGS

The above and other aspects and features will be more apparent from the following description of example embodiments, taken in conjunction with the accompanying drawings, in which:

FIGS. 10A, 10B, and 10C are respectively cross-sectional views illustrating a semiconductor device according to some example embodiments;

DETAILED DESCRIPTION

Figure 1:
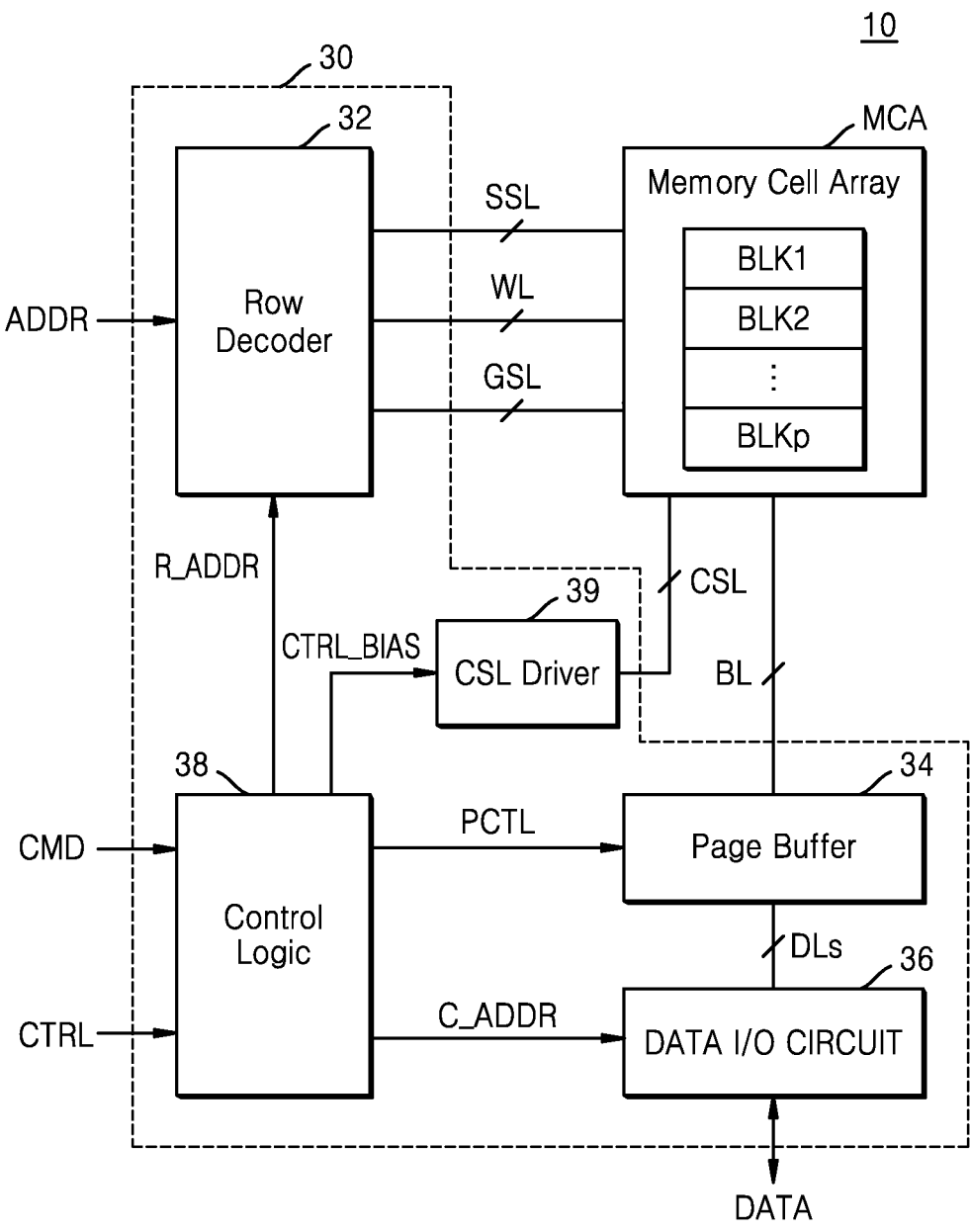
FIG. 1 is a block diagram of a semiconductor device according to some example embodiments.

Example embodiments will be described with reference to the accompanying drawings. Like components are denoted by like reference numerals throughout the specification, and repeated descriptions thereof are omitted. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present.

FIG. 1 is a block diagram of a semiconductor device 10 according to some example embodiments.

Referring to FIG. 1, the semiconductor device 10 may include a memory cell array MCA and a peripheral circuit 30. The memory cell array MCA includes a plurality of memory cell blocks BLK1, BLK2, . . . , and BLKp. Each of the plurality of memory cell blocks BLK1, BLK2, . . . , and BLKp may include a plurality of memory cells. A memory cell block BLK1, BLK2, . . . , or BLKp may be connected to the peripheral circuit 30 via a bit line BL, a word line WL, a string select line SSL, and a ground select line GSL.

The peripheral circuit 30 may include a row decoder 32, a page buffer 34, a data input/output circuit 36, a control logic 38, and a common source line driver 39. The peripheral circuit 30 may further include various circuits, such as a voltage generation circuit for generating various voltages required for operations of the semiconductor device 10, an error correction circuit for correcting errors in data read from the memory cell array MCA, an input/output interface, and the like.

The memory cell array MCA may be connected to the row decoder 32 via the word line WL, the string select line SSL, and the ground select line GSL and may be connected to the page buffer 34 via the bit line BL. In the memory cell array MCA, each of the plurality of memory cells, which are included in the plurality of memory cell blocks BLK1, BLK2, . . . , and BLKp, may include a flash memory cell. The memory cell array MCA may include a three-dimensional memory cell array. The three-dimensional memory cell array may include a plurality of NAND strings, and each of the plurality of NAND strings may include a plurality of memory cells respectively connected to a plurality of word lines WL that are vertically stacked.

The peripheral circuit 30 may receive an address ADDR, a command CMD, and a control signal CTRL from outside the semiconductor device 10 and may transmit data DATA to and receive the data DATA from a device external to the semiconductor device 10.

The row decoder 32 may select at least one of the plurality of memory cell blocks BLK1, BLK2, . . . , and BLKp in response to the address ADDR from outside the semiconductor device 10 and may select the word line WL, the string select line SSL, and the ground select line GSL of the selected memory cell block. The row decoder 32 may transfer a voltage for performing a memory operation to the word line WL of the selected memory cell block.

The page buffer 34 may be connected to the memory cell array MCA via the bit line BL. The page buffer 34 may apply a voltage according to the data DATA, which is intended to be stored in the memory cell array MCA, to the bit line BL by operating as a write driver during a program operation and may sense the data DATA, which is stored in the memory cell array MCA, by operating as a sense amplifier during a read operation. The page buffer 34 may operate according to a control signal PCTL provided by the control logic 38.

The data input/output circuit 36 may be connected with the page buffer 34 via a plurality of data lines DLs. The data input/output circuit 36, during the program operation, may receive the data DATA from a memory controller and may provide program data DATA to the page buffer 34, based on a column address C_ADDR provided by the control logic 38. The data input/output circuit 36, during the read operation, may provide read data DATA stored in the page buffer 34 to the memory controller, based on the column address C_ADDR provided by the control logic 38.

The data input/output circuit 36 may transfer an address or a command, which is input thereto, to the control logic 38 or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and provide the column address C_ADDR to the data input/output circuit 36. The control logic 38 may generate various internal control signals, which are used in the semiconductor device 10, in response to the control signal CTRL. For example, when a memory operation, such as a program operation or an erase operation, is performed, the control logic 38 may adjust levels of voltages respectively provided to the word line WL and the bit line BL.

The common source line driver 39 may be connected to the memory cell array MCA via a common source line CSL. The common source line driver 39 may apply a common source voltage (for example, a power supply voltage) or a ground voltage to the common source line CSL, based on a control signal CTRL BIAS of the control logic 38.

Figure 2A:
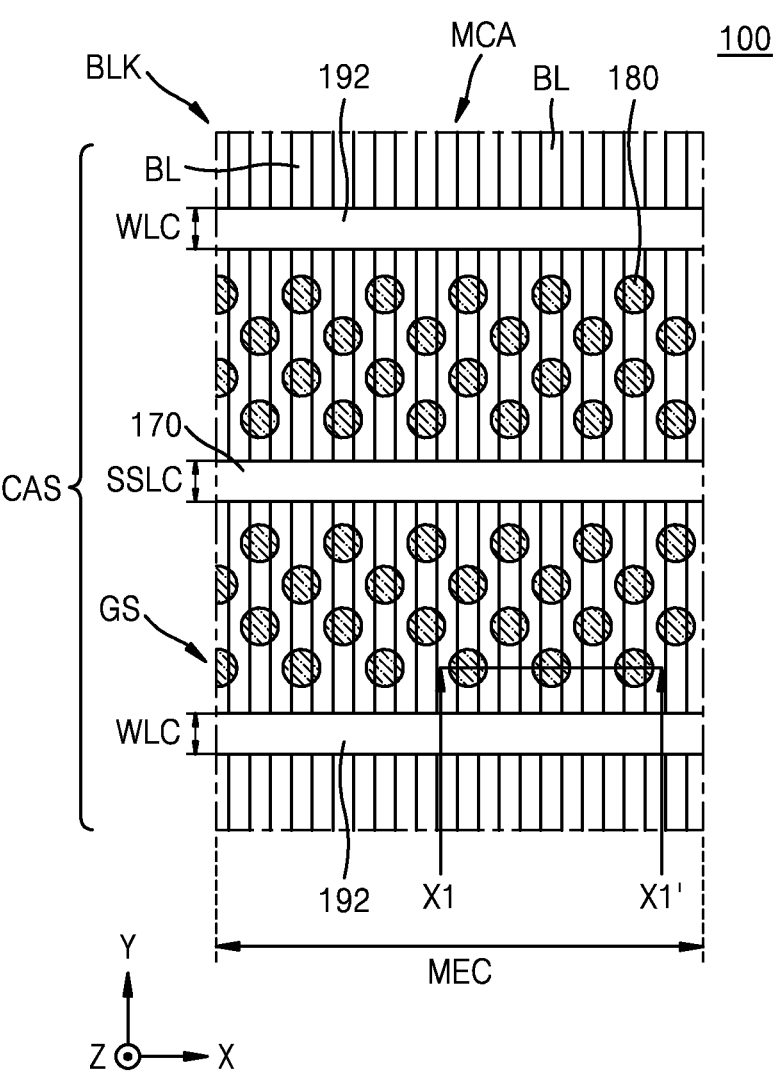
FIG. 2A is a planar layout of a cell array structure of a semiconductor device according to some example embodiments.
Figure 2B:
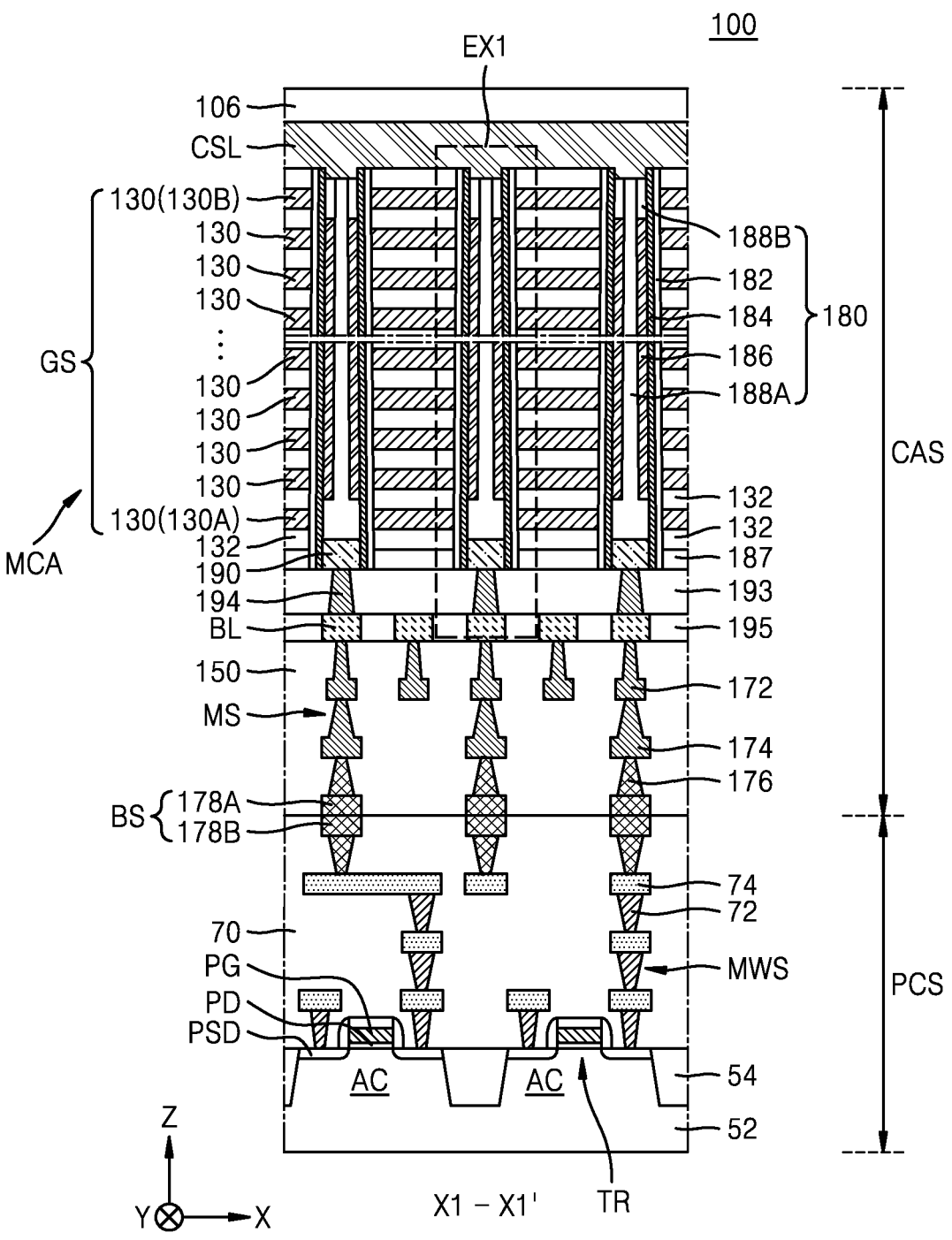
FIG. 2B is a cross-sectional view illustrating respective portions of a peripheral circuit structure and a cell array structure of the semiconductor device shown in FIG. 2A.
Figure 2C:
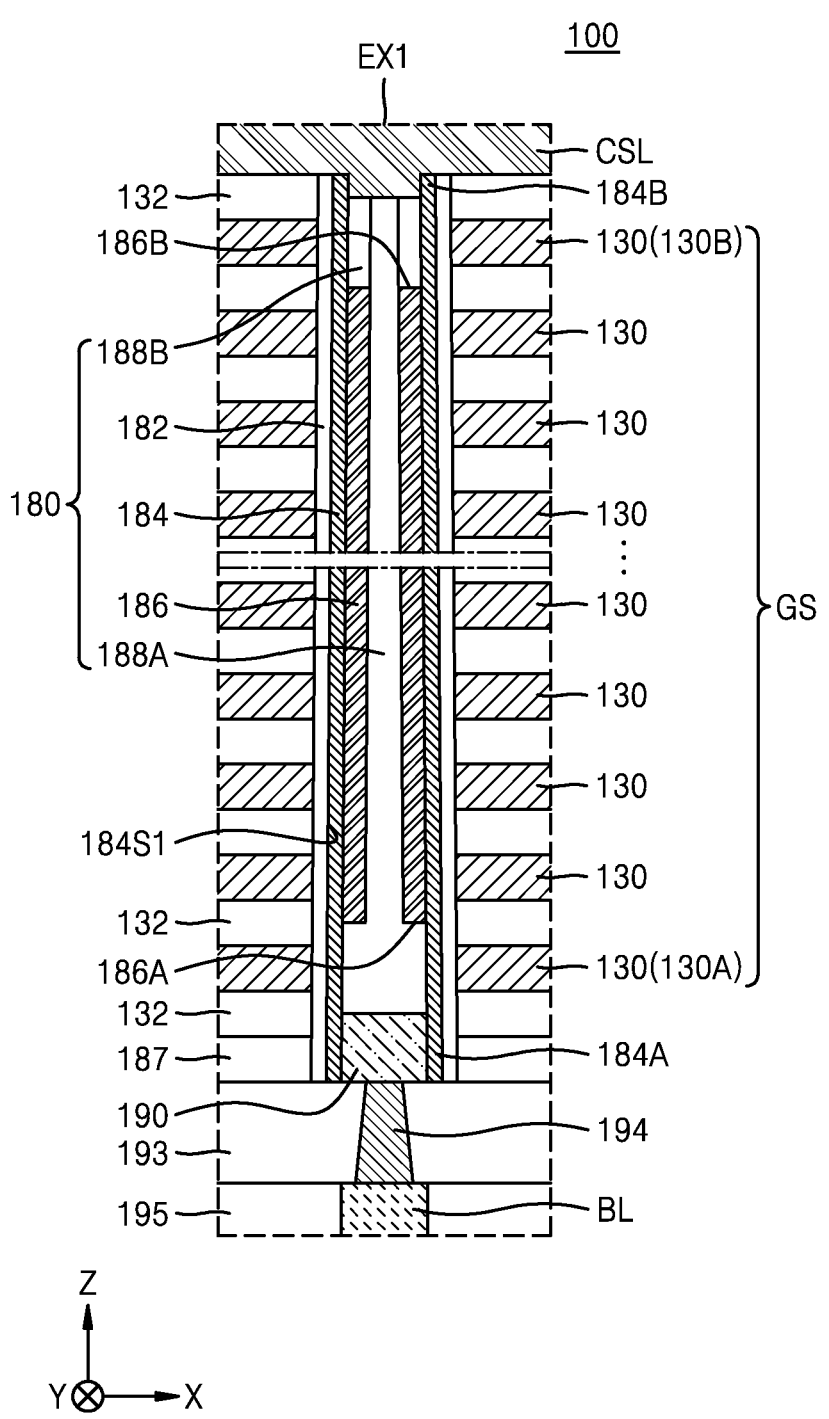
FIG. 2C is an enlarged cross-sectional view of a region EX1 of FIG. 2B.

FIG. 2A is a planar layout illustrating some components of a cell array structure CAS of a semiconductor device 100 according to some example embodiments. FIG. 2B is a cross-sectional view illustrating respective portions of a peripheral circuit structure PCS and the cell array structure CAS of the semiconductor device 100. FIG. 2C is an enlarged cross-sectional view illustrating a region EX1 of FIG. 2B. FIGS. 2A and 2B each illustrate some components of a memory cell block BLK that corresponds to one selected from the plurality of memory cell blocks BLK1, BLK2, . . . , and BLKp shown in FIG. 1.

Referring to FIGS. 2A to 2C, the semiconductor device 100 may include the cell array structure CAS and the peripheral circuit structure PCS, which overlap each other in a vertical direction (Z direction). The cell array structure CAS may include a memory cell area MEC in which the memory cell array MCA is arranged.

In some example embodiments, the semiconductor device 100 may have a chip-to-chip (C2C) structure. The C2C structure may be a structure obtained by forming the cell array structure CAS on a first wafer, forming the peripheral circuit structure PCS on a second wafer that is different from the first wafer, and connecting the cell array structure CAS and the peripheral circuit structure PCS to each other by a bonding method. For example, the bonding method may refer to a method of bonding a first bonding metal pad 178A, which is formed in an uppermost metal layer of the cell array structure CAS, to a second bonding metal pad 178B, which is formed in an uppermost metal layer of the peripheral circuit structure PCS, to allow the first bonding metal pad 178A and the second bonding metal pad 178B to be electrically connected to each other. In some example embodiments, each of the first bonding metal pad 178A and the second bonding metal pad 178B includes copper (Cu), and the bonding method is a Cu—Cu bonding method. In some example embodiments, each of the first bonding metal pad 178A and the second bonding metal pad 178B may include aluminum (Al) or tungsten (W).

The cell array structure CAS may include the common source line CSL, and the memory cell array MCA arranged on the common source line CSL. The memory cell array MCA may include a gate stack GS including a plurality of gate lines 130, which are arranged between the common source line CSL and the peripheral circuit structure PCS. The plurality of gate lines 130 of the gate stack GS may extend in a horizontal direction that is parallel to the common source line CSL, and may overlap each other in the vertical direction (Z direction). The plurality of gate lines 130 may include the plurality of word lines WL, the ground select line GSL, and the string select line SSL, which are shown in FIG. 1.

The peripheral circuit structure PCS may include a substrate 52, a plurality of circuits formed on the substrate 52, and a multilayer wiring structure MWS for connecting the plurality of circuits to each other or connecting the plurality of circuits to components in the memory cell area MEC of the cell array structure CAS.

The substrate 52 may include a semiconductor substrate. For example, the substrate 52 may include Si, Ge, or SiGe. An active region AC may be defined in the substrate 52 by a device isolation film 54. A plurality of transistors TR constituting a plurality of circuits may be formed on the active region AC. Each of the plurality of transistors TR may include a gate dielectric film PD and a gate PG, which are sequentially stacked in the stated order on the substrate 52, and a plurality of ion-implanted regions PSD formed in the active region AC on both sides of the gate PG. Each of the plurality of ion-implanted regions PSD may constitute a source region or a drain region of the transistor TR.

The multilayer wiring structure MWS of the peripheral circuit structure PCS may include a plurality of contact plugs 72 and a plurality of conductive lines 74. At least some of the plurality of conductive lines 74 may be electrically connected to the transistor TR. The plurality of contact plugs 72 may connect each of the plurality of transistors TR to some selected from the plurality of conductive lines 74. The plurality of transistors TR and the multilayer wiring structure MWS, which are included in the peripheral circuit structure PCS, may be covered by an interlayer dielectric 70. The interlayer dielectric 70 may include a silicon oxide film, a silicon nitride film, an SiON film, an SiOCN film, or a combination thereof.

The plurality of circuits of the peripheral circuit structure PCS may include the various circuits of the peripheral circuit 30, which are described with reference to FIG. 1. In some example embodiments, the peripheral circuit structure PCS may further include additional circuit elements, such as a resistor and a capacitor. The plurality of transistors TR, the plurality of contact plugs 72, and the plurality of conductive lines 74, which are included in the peripheral circuit structure PCS, may constitute the plurality of circuits. Each of the plurality of transistors TR may be electrically connected to the memory cell area MEC via the multilayer wiring structure MWS.

As shown in FIG. 2B, the gate stack GS may include the plurality of gate lines 130 arranged under the common source line CSL to overlap each other in the vertical direction (Z direction) and be apart from each other in the vertical direction (Z direction). A plurality of conductive pads 190 may be arranged apart from the common source line CSL in the vertical direction (Z direction) with the plurality of gate lines 130 therebetween. Each common source line CSL may be apart from the peripheral circuit structure PCS in the vertical direction (Z direction) with the memory cell area MEC therebetween. Herein, the common source line CSL may be referred to as a conductive layer.

The plurality of gate lines 130 may include a first select gate line 130A, which is closest to the plurality of conductive pads 190, and a second select gate line 130B, which is closest to the common source line CSL. Among the plurality of gate lines 130, a plurality of gate lines 130 arranged between the first select gate line 130A and the second select gate line 130B may respectively constitute the word lines WL (see FIG. 1) of a memory cell block in the memory cell area MEC. The first select gate line 130A may constitute the string select line SSL (see FIG. 1). The second select gate line 130B may constitute the ground select line GSL (see FIG. 1).

Each of the plurality of gate lines 130 may include a metal, a conductive metal nitride, a metal silicide, an impurity-doped semiconductor, or a combination thereof. For example, each of the plurality of gate lines 130 may include, but is not limited to, tungsten, nickel, cobalt, tantalum, tungsten nitride, titanium nitride, tantalum nitride, doped polysilicon, tungsten silicide, nickel silicide, cobalt silicide, tantalum silicide, or a combination thereof.

The plurality of conductive pads 190 and the common source line CSL may each include a semiconductor material, a metal, a conductive metal nitride, or a combination thereof. For example, the plurality of conductive pads 190 and the common source line CSL may each include, but are not limited to, doped polysilicon, tungsten, titanium, tantalum, copper, aluminum, titanium nitride, tantalum nitride, tungsten nitride, or a combination thereof.

The cell array structure CAS may include a plurality of channel structures 180, each passing through the plurality of gate lines 130 in the vertical direction (Z direction). Each of the plurality of channel structures 180 may include a gate dielectric film 182, a channel region 184, a variable resistance pattern 186, and a first insulating pattern 188A, which are sequentially stacked in the stated order in a direction from the plurality of gate lines 130 toward the center of the channel structure 180, and also include a second insulating pattern 188B surrounding an end of the first insulating pattern 188A, which is adjacent to the common source line CSL.

The gate dielectric film 182 may be arranged between the plurality of gate lines 130 and the channel region 184 and face a sidewall of each of the plurality of gate lines 130. In some example embodiments, the gate dielectric film 182 may include silicon oxide, silicon nitride, silicon oxynitride, or a combination thereof.

The channel region 184 may include a semiconductor material. For example, the channel region 184 may include doped polysilicon.

The variable resistance pattern 186 may include a variable resistance material that exhibits resistance characteristics varying according to voltages applied thereto. Depending upon an electric field formed on the variable resistance pattern 186, a conductive filament may be formed in the variable resistance pattern 186 due to the behavior of oxygen in the variable resistance material of the variable resistance pattern 186, and the resistance of the variable resistance pattern 186 may be changed due to the conductive filament. Depending upon whether the conductive filament is formed, the variable resistance pattern 186 may be in a low-resistance state or a high-resistance state, and thus, information of 1 or 0 may be written to the semiconductor device 100.

In some example embodiments, the variable resistance material of the variable resistance pattern 186 may include a metal oxide including oxygen vacancies. For example, the variable resistance pattern 186 may include, but is not limited to, $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_{2O5}$, $La_2O_3$, $Gd_2O_3$, $CuO$, $MoO_3$, $Cr_2O_3$, $MnO_2$, or a combination thereof.

The variable resistance pattern 186 may have a thickness that is greater than that of each of the gate dielectric film 182 and the channel region 184. In some example embodiments, each of the gate dielectric film 182 and the channel region 184 may have, but is not limited to, a thickness of about 2 nm to about 10 nm, for example, about 4 nm to about 6 nm, in a horizontal direction (for example, an X direction). In some example embodiments, the variable resistance pattern 186 may have, but is not limited to, a thickness of about 10 nm to about 20 nm, for example, about 12 nm to about 18 nm, in the horizontal direction (for example, the X direction).

The channel region 184 may have a cylindrical shape to define a columnar space therein, the columnar space extending lengthwise in the vertical direction (Z direction). The channel region 184 may have a first channel end 184A contacting one conductive pad 190 selected from the plurality of conductive pads 190, and a second channel end 184B contacting the common source line CSL.

The variable resistance pattern 186 may include an outer sidewall facing some gate lines 130, which are selected from the plurality of gate lines 130, in the horizontal direction (for example, the X direction) with the gate dielectric film 182 and the channel region 184 therebetween. Herein, the gate lines 130 facing the outer sidewall of the variable resistance pattern 186 may be referred to as first gate lines and may respectively constitute the word lines WL (see FIG. 1) of a memory cell block in the memory cell area MEC.

The variable resistance pattern 186 may include a first end 186A that is more recessed toward the inside of the columnar space than the first channel end 184A of the channel region 184 and is offset, in the vertical direction (for example, the Z direction), from at least one other gate line 130A, which is selected from the plurality of gate lines 130 and adjacent to a conductive pad 190, in the horizontal direction (for example, the X direction). Herein, the at least one other gate line 130A that is offset, in the vertical direction (for example, the Z direction), from the variable resistance pattern 186 may be referred to as a second gate line or a first select gate line and may constitute the string select line SSL (see FIG. 1) of the memory cell block.

The variable resistance pattern 186 may include a second end 186B that is more recessed toward the inside of the columnar space than the second channel end 184B of the channel region 184 and is offset, in the vertical direction (for example, the Z direction), from at least one yet other gate line 130B, which is selected from the plurality of gate lines 130 and adjacent to the common source line CSL, in the horizontal direction (for example, the X direction). Herein, the at least one yet other gate line 130B is offset, in the vertical direction (for example, the Z direction), from the variable resistance pattern 186 may be referred to as a third gate line or a second select gate line and may constitute the ground select line GSL (see FIG. 1) of the memory cell block.

Although FIGS. 2B and 2C illustrate an example in which the plurality of gate lines 130 include one gate line 130A and one gate line 130B, example embodiments are not limited to the example shown in FIG. 2B. The respective numbers of gate lines 130A and gate lines 130B, which are included in the plurality of gate lines 130, may be variously selected as needed. In this regard, additional gate lines 130 may be offset, in the vertical direction (for example, the Z direction), from the variable resistance pattern 186.

The first insulating pattern 188A and the second insulating pattern 188B may constitute an insulating structure. Each of the first insulating pattern 188A and the second insulating pattern 188B may be arranged in the columnar space defined by the channel region 184, and the first insulating pattern 188A may be surrounded by the variable resistance pattern 186. The second insulating pattern 188B may fill a space between the variable resistance pattern 186 and the common source line CSL. The second insulating pattern 188B may have a surface contacting the channel region 184. Each of the first insulating pattern 188A and the second insulating pattern 188B may include, but is not limited to, a silicon nitride film.

The variable resistance pattern 186 may contact a first inner surface 184S1 of the channel region 184, which is apart from the first channel end 184A and the second channel end 184B, in the columnar space defined by the channel region 184.

The first insulating pattern 188A constituting the insulating structure may be arranged in the columnar space defined by the channel region 184, and may contact the channel region 184 between the first channel end 184A and the first inner surface 184S1 of the channel region 184. The first insulating pattern 188A may face the gate line 130A in the horizontal direction (for example, the X direction) with the gate dielectric film 182 and the channel region 184 therebetween.

The second insulating pattern 188B constituting the insulating structure may be arranged in the columnar space defined by the channel region 184, and may contact the channel region 184 between the second channel end 184B and the first inner surface 184S1 of the channel region 184. Herein, a portion of the inner surface of the channel region 184, which contacts the second insulating pattern 188B, may be referred to as a second inner surface. The second insulating pattern 188B may face the gate line 130B in the horizontal direction (for example, the X direction) with the gate dielectric film 182 and the channel region 184 therebetween.

In the horizontal direction (for example, the X direction), a maximum width of the insulating structure, which is constituted by the first insulating pattern 188A and the second insulating pattern 188B, may be greater than a maximum width of the variable resistance pattern 186.

The first end 186A of the variable resistance pattern 186 may be apart from the conductive pad 190 in the vertical direction (Z direction), and the conductive pad 190 may contact the first channel end 184A in the columnar space defined by the channel region 184. The conductive pad 190 may have a surface contacting the first channel end 184A, and a surface contacting the first insulating pattern 188A.

The second end 186B of the variable resistance pattern 186 may be apart from the common source line CSL in the vertical direction (Z direction), and the common source line CSL may contact the second channel end 184B in the columnar space defined by the channel region 184. The common source line CSL may have a surface contacting the second channel end 184B, a surface contacting the first insulating pattern 188A, and a surface contacting the second insulating pattern 188B.

In the cell array structure CAS, a plurality of bit lines BL may be arranged over the plurality of channel structures 180. A plurality of bit line contact pads 194 may be arranged between the plurality of channel structures 180 and the plurality of bit lines BL. The conductive pad 190, which is arranged on one end of each of the plurality of channel structures 180, may be connected to one bit line BL corresponding thereto from among the plurality of bit lines BL via a bit line contact pad 194. The plurality of bit line contact pads 194 may be insulated from each other by a first upper insulating film 193. The plurality of bit lines BL may be insulated from each other by a second upper insulating film 195. The plurality of bit line contact pads 194 and the plurality of bit lines BL may each include a metal, a conductive metal nitride, or a combination thereof. For example, the plurality of bit line contact pads 194 and the plurality of bit lines BL may each include tungsten, titanium, tantalum, copper, aluminum, titanium nitride, tantalum nitride, tungsten nitride, or a combination thereof. Each of the first upper insulating film 193 and the second upper insulating film 195 may include a silicon oxide film, a silicon nitride film, or a combination thereof.

As shown in FIG. 2B, each of the plurality of bit lines BL may be connected to a wiring structure MS. The wiring structure MS may include a first upper wiring layer 172, a second upper wiring layer 174, and a third upper wiring layer 176. Each of the first upper wiring layer 172, the second upper wiring layer 174, and the third upper wiring layer 176 may include tungsten, titanium, tantalum, copper, aluminum, titanium nitride, tantalum nitride, tungsten nitride, or a combination thereof.

A plurality of first bonding metal pads 178A may be arranged on an upper surface of the cell array structure CAS, which is adjacent to the peripheral circuit structure PCS. The plurality of bit lines BL may be connected to the plurality of first bonding metal pads 178A via the wiring structure MS. In the cell array structure CAS, each of the wiring structure MS and the plurality of first bonding metal pads 178A may be covered by an interlayer dielectric 150. The interlayer dielectric 150 may include a silicon oxide film, a silicon nitride film, or a combination thereof.

The peripheral circuit structure PCS may be apart from the plurality of channel structures 180 with the plurality of bit lines BL therebetween. The peripheral circuit structure PCS may include a plurality of second bonding metal pads 178B arranged on the multilayer wiring structure MWS. The plurality of second bonding metal pads 178B may be connected to the plurality of circuits of the peripheral circuit structure PCS. In the peripheral circuit structure PCS, an interlayer dielectric 70 may cover the plurality of transistors TR, the plurality of contact plugs 72, the plurality of conductive lines 74, and the plurality of second bonding metal pads 178B.

The plurality of second bonding metal pads 178B may be respectively bonded to and electrically connected to the plurality of first bonding metal pads 178A of the cell array structure CAS. The plurality of first bonding metal pads 178A and the plurality of second bonding metal pads 178B may constitute a plurality of bonding structures BS. The plurality of bit lines BL may be connected to at least one circuit selected from the plurality of circuits of the peripheral circuit structure PCS via a bonding structure BS including a first bonding metal pad 178A and a second bonding metal pad 178B.

In some example embodiments, the plurality of contact plugs 72 and the plurality of conductive lines 74 in the peripheral circuit structure PCS may each include, but are not limited to, tungsten, aluminum, copper, or a combination thereof. The device isolation film 54 may include a silicon oxide film, a silicon nitride film, or a combination thereof. The interlayer dielectric 70 may include a silicon oxide film, a silicon nitride film, or a combination thereof. The plurality of first bonding metal pads 178A and the plurality of second bonding metal pads 178B, which constitute the plurality of bonding structures BS, may each include copper, aluminum, or tungsten.

As shown in FIG. 2A, in the cell array structure CAS, a plurality of word line cut regions WLC may extend in a first horizontal direction (X direction). The plurality of word line cut regions WLC may define the width of the gate stack GS in a second horizontal direction (Y direction). The plurality of word line cut regions WLC may each be filled with a word line cut structure 192. The word line cut structure 192 may include an insulating film, polysilicon, a metal film, or a combination thereof. In some example embodiments, the word line cut structure 192 may include, but is not limited to, a silicon oxide film, a silicon nitride film, a polysilicon film, a tungsten film, or a combination thereof.

In the memory cell array MCA, two string select lines SSL (see FIG. 1) adjacent to each other in the second horizontal direction (Y direction) may be apart from each other with a string select line cut region SSLC therebetween. The string select line cut region SSLC may be filled with an insulating film 170. The insulating film 170 may include an oxide film, a nitride film, or a combination thereof. In some example embodiments, at least a portion of the string select line cut region SSLC may be filled with an air gap. As used herein, the term "air" may refer to the atmosphere, or other gases that may be present during a fabrication process.

As shown in FIG. 2B, in the cell array structure CAS, an insulating film 132 may be arranged between the common source line CSL and the plurality of gate lines 130 and between the plurality of gate lines 130. A gate line 130 closest to the conductive pad 190 from among the plurality of gate lines 130 may be covered by the insulating film 132 and an intermediate insulating film 187. The plurality of channel structures 180 may pass through the plurality of gate lines 130, a plurality of insulating films 132, and the intermediate insulating film 187 in the vertical direction (Z direction). The plurality of insulating films 132 and the intermediate insulating film 187 may each include silicon oxide, silicon nitride, or SiON.

In the memory cell area MEC, the plurality of channel structures 180 may be arranged to be connected to the common source line CSL while extending in the vertical direction (Z direction) through the plurality of gate lines 130 and the plurality of insulating films 132. The plurality of channel structures 180 may be arranged apart from each other at certain intervals in the first horizontal direction (X direction) and the second horizontal direction (Y direction).

Although FIGS. 2B and 2C illustrate an example in which the channel structure 180 includes the gate dielectric film 182 and the gate dielectric film 182 has a shape extending lengthwise in the vertical direction (Z direction) along the channel region 184, example embodiments are not limited thereto, and the gate dielectric film 182 may be variously modified. For example, a portion of the gate dielectric film 182 may extend lengthwise in the vertical direction (Z direction) along the channel region 184, and another portion of the gate dielectric film 182 may be arranged to cover an upper surface, a lower surface, and a sidewall of each of the plurality of gate lines 130.

The common source line CSL may be covered by an insulating film 106. The insulating film 106 may include a silicon oxide film. The insulating film 106 may be covered by a protective film. The protective film may include, but is not limited to, a polyimide material film, such as a photosensitive polyimide (PSPI).

In the semiconductor device 100 described with reference to FIGS. 2A to 2C, the variable resistance pattern 186 faces some gate lines 130 selected from the plurality of gate lines 130 in the horizontal direction (for example, the X direction) with the gate dielectric film 182 and the channel region 184 therebetween, whereas the variable resistance pattern 186 may have the first end 186A and the second end 186B, which are respectively more recessed toward the inside of the columnar space defined by the channel region 184 than the first channel end 184A and the second channel end 184B of the channel region 184, such that the variable resistance pattern 186 is offset, in the vertical direction (for example, the Z direction), from the first select gate line 130A adjacent to the conductive pad 190 and/or the second select gate line 130B adjacent to the common source line CSL, in the horizontal direction (for example, the X direction).

As a comparison example, in the case where the variable resistance pattern 186 extends lengthwise in the vertical direction (Z direction) together with the channel region 184 such that the variable resistance pattern 186 is arranged between the channel region 184 and the first select gate line 130A and between the channel region 184 and the second select gate line 130B, when a portion of the variable resistance pattern 186, which faces the plurality of gate lines 130 used as the word lines WL (see FIG. 1), has a change in resistance thereof due to continuous operations of the word lines WL, there may be a defect in which select transistors including the first select gate line 130A and/or the second select gate line 130B adjacent to the word lines WL suffer from an unintended shift of a threshold voltage.

In the semiconductor device 100, the variable resistance pattern 186 has a smaller length in the vertical direction (Z direction) than the channel region 184 such that the variable resistance pattern 186 is not arranged between the channel region 184 and the first select gate line 130A and between the channel region 184 and the second select gate line 130B. Therefore, because the defect in which the select transistors including the first select gate line 130A and/or the second select gate line 130B suffer from an unintended shift of a threshold voltage may be prevented, the select transistors including the first select gate line 130A and/or the second select gate line 130B may stably operate, and thus, electrical characteristics of the semiconductor device 100 may improve.

Figure 3:
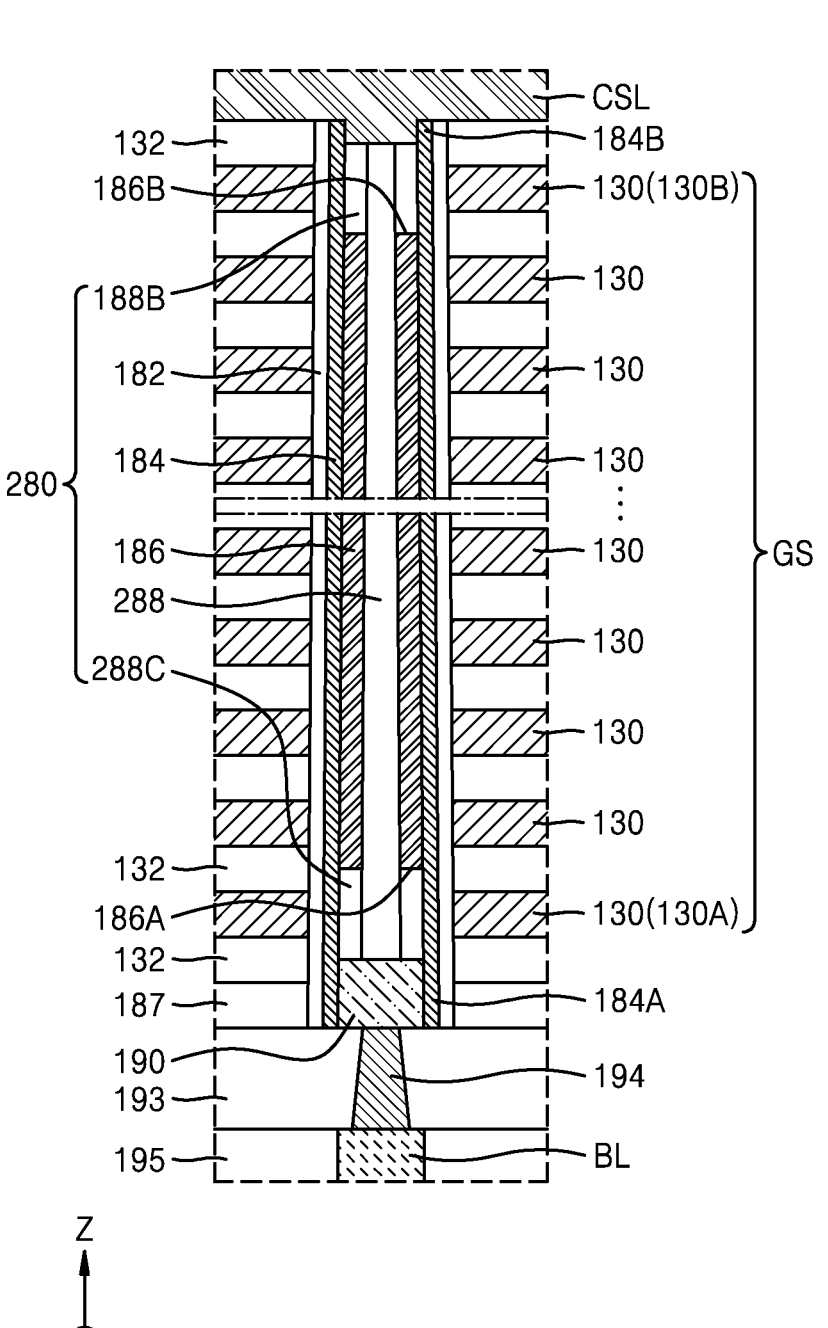
FIG. 3 is a cross-sectional view illustrating a semiconductor device according to some example embodiments.

FIG. 3 is a cross-sectional view illustrating a semiconductor device 200 according to some example embodiments. FIG. 3 illustrates an enlarged configuration of a region of the semiconductor device 200, which corresponds to the region EX1 of FIG. 2B.

Referring to FIG. 3, the semiconductor device 200 has a substantially similar configuration as the semiconductor device 100 described with reference to FIGS. 2A to 2C. However, the semiconductor device 200 includes a channel structure 280 passing through the plurality of gate lines 130 in the vertical direction (Z direction). The channel structure 280 has a substantially similar configuration as the channel structure 180 described with reference to FIGS. 2A to 2C. However, the channel structure 280 may include a first insulating pattern 288 surrounded by the variable resistance pattern 186, the second insulating pattern 188B surrounding one end of the first insulating pattern 288 adjacent to the common source line CSL, and a third insulating pattern 288C surrounding the other end of the first insulating pattern 288 adjacent to the conductive pad 190, in the columnar space defined by the channel region 184. The first insulating pattern 288, the second insulating pattern 188B, and the third insulating pattern 288C may constitute the insulating structure.

Each of the first insulating pattern 288, the second insulating pattern 188B, and the third insulating pattern 288C may be arranged in the columnar space defined by the channel region 184, and the first insulating pattern 288 may be surrounded by the variable resistance pattern 186. The second insulating pattern 188B may fill the space between the variable resistance pattern 186 and the common source line CSL. The third insulating pattern 288C may fill a space between the variable resistance pattern 186 and the conductive pad 190. The second insulating pattern 188B and the third insulating pattern 288C may each have a surface contacting the channel region 184. Each of the first insulating pattern 288, the second insulating pattern 188B, and the third insulating pattern 288C may include, but is not limited to, a silicon nitride film.

The conductive pad 190 may have a surface contacting the first channel end 184A, a surface contacting the first insulating pattern 288, and a surface contacting the third insulating pattern 288C.

Figure 4:
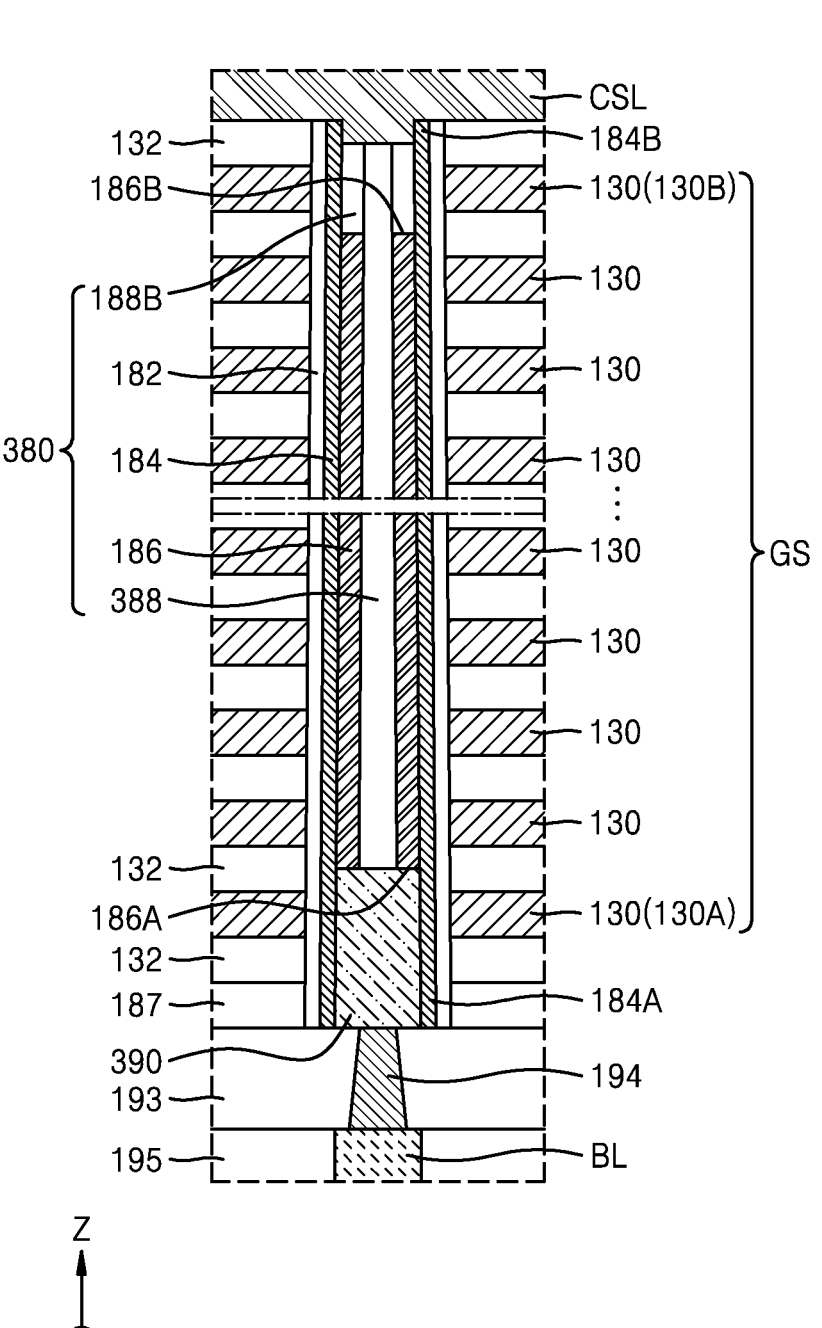
FIG. 4 is a cross-sectional view illustrating a semiconductor device according to some example embodiments.

FIG. 4 is a cross-sectional view illustrating a semiconductor device 300 according to some example embodiments. FIG. 4 illustrates an enlarged configuration of a region of the semiconductor device 300, which corresponds to the region EX1 of FIG. 2B.

Referring to FIG. 4, the semiconductor device 300 has a substantially similar configuration as the semiconductor device 100 described with reference to FIGS. 2A to 2C. However, the semiconductor device 300 includes a channel structure 380 passing through the plurality of gate lines 130 in the vertical direction (Z direction). The channel structure 380 has a configuration substantially similar to the channel structure 180 described with reference to FIGS. 2A to 2C. However, the channel structure 380 may include a first insulating pattern 388 surrounded by the variable resistance pattern 186, and the second insulating pattern 188B surrounding one end of the first insulating pattern 388 adjacent to the common source line CSL, in the columnar space defined by the channel region 184. The first insulating pattern 388 and the second insulating pattern 188B may constitute the insulating structure.

A conductive pad 390 may have a surface contacting the first channel end 184A of the channel region 184, a surface contacting the first end 186A of the variable resistance pattern 186, and a surface contacting the first insulating pattern 388 of the insulating structure, in the columnar space defined by the channel region 184.

Each of the first insulating pattern 388 and the second insulating pattern 188B may include, but is not limited to, a silicon nitride film. A more detailed configuration of the conductive pad 390 is substantially similar to the conductive pad 190 described with reference to FIGS. 2B and 2C.

Figure 5A:
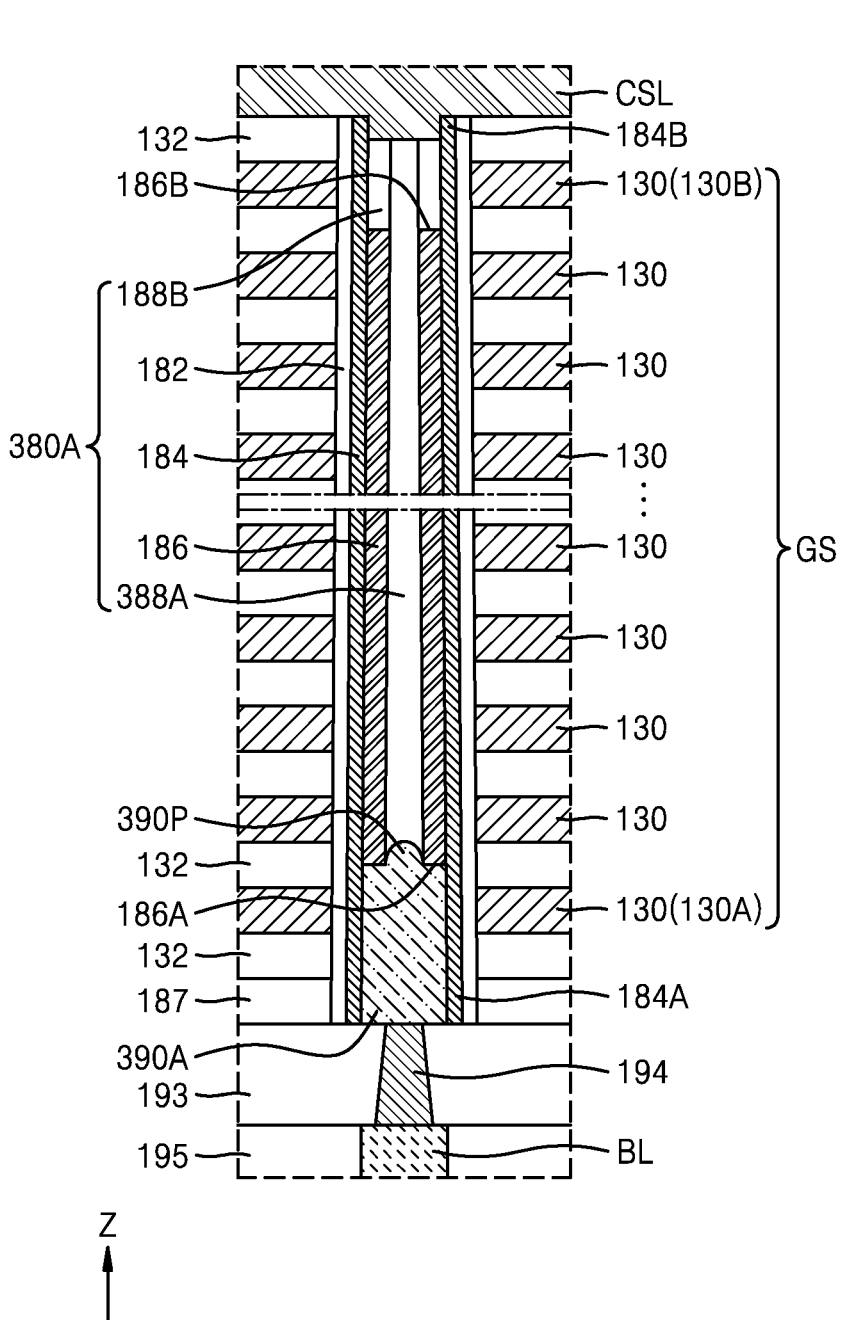
FIGS. 5A and 5B are respectively cross-sectional views illustrating a semiconductor device according to some example embodiments.

FIG. 5A is a cross-sectional view illustrating a semiconductor device 300A according to some example embodiments. FIG. 5A illustrates an enlarged configuration of a region of the semiconductor device 300A, which corresponds to the region EX1 of FIG. 2B.

Referring to FIG. 5A, the semiconductor device 300A has a configuration substantially similar to the semiconductor device 300 described with reference to FIG. 4. However, the semiconductor device 300A includes a channel structure 380A passing through the plurality of gate lines 130 in the vertical direction (Z direction), and a conductive pad 390A contacting the channel region 184 of the channel structure 380A.

The channel structure 380A and the conductive pad 390A have configurations substantially similar to the configurations of the channel structure 380 and the conductive pad 390 described with reference to FIG. 4, respectively. However, the channel structure 380A includes a first insulating pattern 388A surrounded by the variable resistance pattern 186, and the second insulating pattern 188B surrounding one end of the first insulating pattern 388A adjacent to the common source line CSL, in the columnar space defined by the channel region 184. The first insulating pattern 388A and the second insulating pattern 188B may constitute the insulating structure. Each of the first insulating pattern 388A and the second insulating pattern 188B may include, but is not limited to, a silicon nitride film.

The conductive pad 390A may include a surface contacting the first channel end 184A of the channel region 184, a surface contacting the first end 186A of the variable resistance pattern 186, and a protrusion 390P contacting the first insulating pattern 388A, in the columnar space defined by the channel region 184. The protrusion 390P of the conductive pad 390A may protrude toward the common source line CSL up to the inside of a space defined by the variable resistance pattern 186. The protrusion 390P of the conductive pad 390A may horizontally overlap the variable resistance pattern 186 (i.e., along the horizontal directions X and Y). The first insulating pattern 388A may have a concave surface that contacts the protrusion 390P and corresponds to the shape of the protrusion 390P.

Figure 5B:
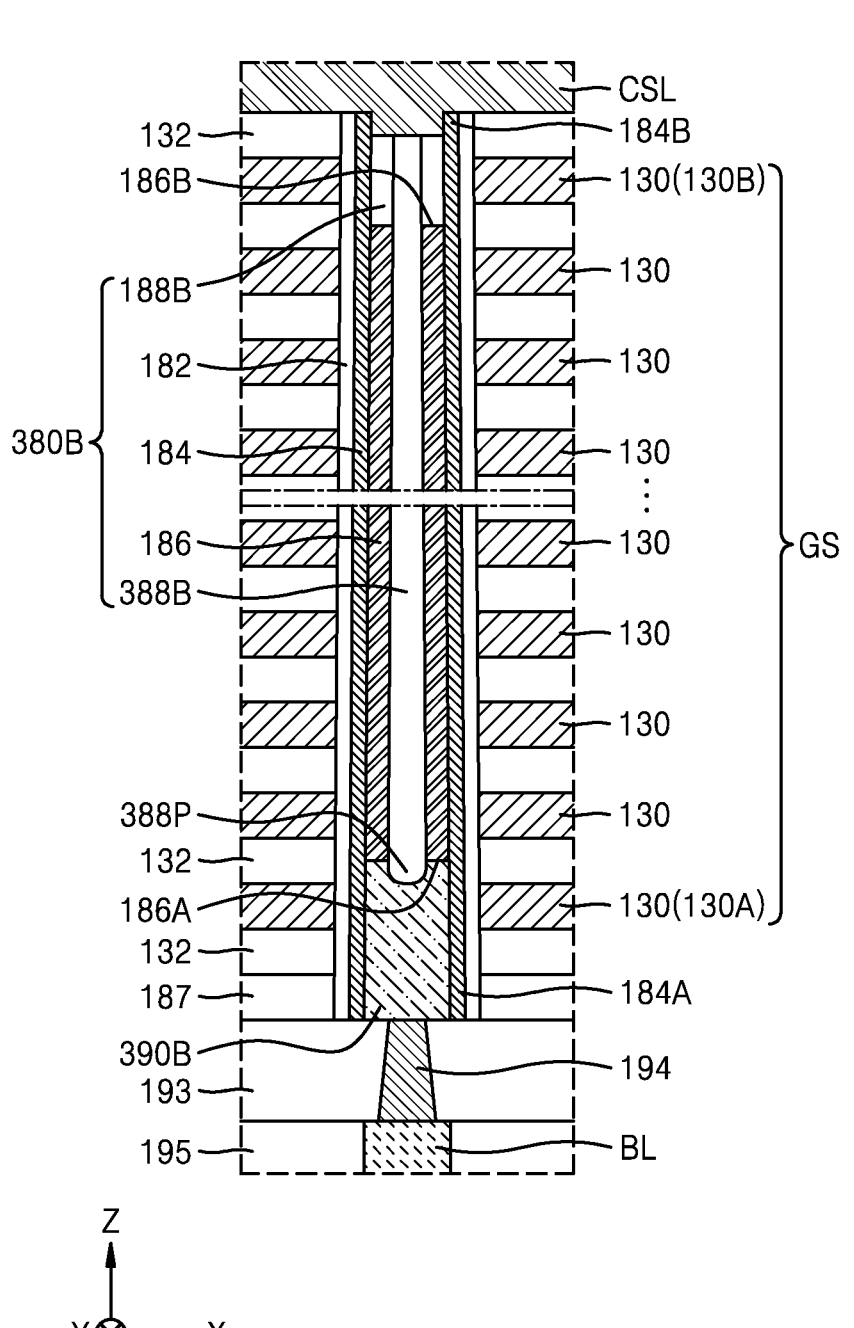

FIG. 5B is a cross-sectional view illustrating a semiconductor device 300B according to some example embodiments. FIG. 5B illustrates an enlarged configuration of a region of the semiconductor device 300B, which corresponds to the region EX1 of FIG. 2B.

Referring to FIG. 5B, the semiconductor device 300B has a configuration substantially similar to the semiconductor device 300 described with reference to FIG. 4. However, the semiconductor device 300B includes a channel structure 380B passing through the plurality of gate lines 130 in the vertical direction (Z direction), and a conductive pad 390B contacting the channel region 184 of the channel structure 380B.

The channel structure 380B and the conductive pad 390B have configurations substantially similar to the channel structure 380 and the conductive pad 390 described with reference to FIG. 4, respectively. However, the channel structure 380B includes a first insulating pattern 388B surrounded by the variable resistance pattern 186, and the second insulating pattern 188B surrounding one end of the first insulating pattern 388B adjacent to the common source line CSL, in the columnar space defined by the channel region 184. The first insulating pattern 388B and the second insulating pattern 188B may constitute the insulating structure.

The first insulating pattern 388B may include a protrusion 388P contacting the conductive pad 390B. The protrusion 388P of the first insulating pattern 388B may further protrude toward the bit line BL than the first end 186A of the variable resistance pattern 186. Each of the first insulating pattern 388B and the second insulating pattern 188B may include, but is not limited to, a silicon nitride film.

The conductive pad 390B may have a surface contacting the first channel end 184A of the channel region 184, a surface contacting the first end 186A of the variable resistance pattern 186, and a surface contacting the protrusion 388P of the first insulating pattern 388B, in the columnar space defined by the channel region 184. The surface of the conductive pad 390B, which contacts the protrusion 388P of the first insulating pattern 388B, may include a concave surface corresponding to the shape of the protrusion 388P. The protrusion 388P of the first insulating pattern 388B may horizontally overlap the conductive pad 390B (i.e., along the horizontal directions X and Y).

Figure 6A:
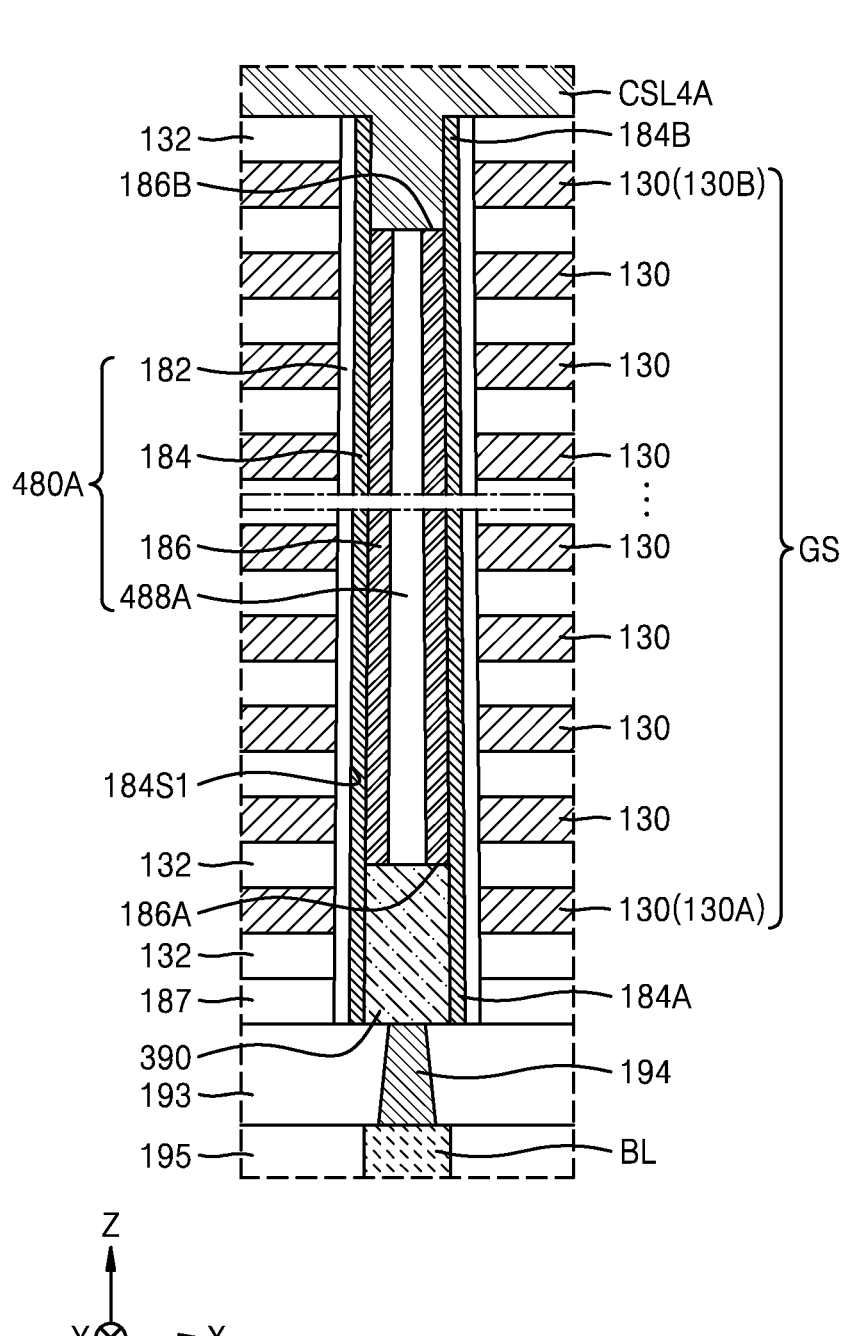
FIGS. 6A, 6B, and 6C are respectively cross-sectional views illustrating a semiconductor device according to some example embodiments.

FIG. 6A is a cross-sectional view illustrating a semiconductor device 400A according to some example embodiments. FIG. 6A illustrates an enlarged configuration of a region of the semiconductor device 400A, which corresponds to the region EX1 of FIG. 2B.

Referring to FIG. 6A, the semiconductor device 400A has a configuration substantially similar to the configuration of the semiconductor device 300 described with reference to FIG. 4. However, the semiconductor device 400A includes a channel structure 480A passing through the plurality of gate lines 130 in the vertical direction (Z direction), and a common source line CSL4A contacting the channel region 184 of the channel structure 480A.

The channel structure 480A has a configuration substantially similar to the channel structure 380 described with reference to FIG. 4. However, the channel structure 480A includes a first insulating pattern 488A surrounded by the variable resistance pattern 186 in the columnar space defined by the channel region 184. The first insulating pattern 488A may constitute the insulating structure. The first insulating pattern 488A may include, but is not limited to, a silicon nitride film.

In the channel structure 480A, the outer sidewall of the variable resistance pattern 186 may contact the first inner surface 184S1 of the channel region 184, which is adjacent to the second channel end 184B of the channel region 184, in the columnar space defined by the channel region 184.

The conductive pad 390 may have a surface contacting the first channel end 184A of the channel region 184, a surface contacting the first end 186A of the variable resistance pattern 186, and a surface contacting the first insulating pattern 488A, in the columnar space defined by the channel region 184.

The common source line CSL4A may have a surface contacting the second channel end 184B, a surface contacting the second end 186B of the variable resistance pattern 186, and a surface contacting the first insulating pattern 488A, in the columnar space defined by the channel region 184. The common source line CSL4A may horizontally overlap the second select gate line 130B (i.e., along the horizontal directions X and Y). Herein, the common source line CSL4A may be referred to as a conductive layer. A more detailed configuration of the common source line CSL4A is substantially similar to the common source line CSL described with reference to FIGS. 2B and 2C.

Figure 6B:
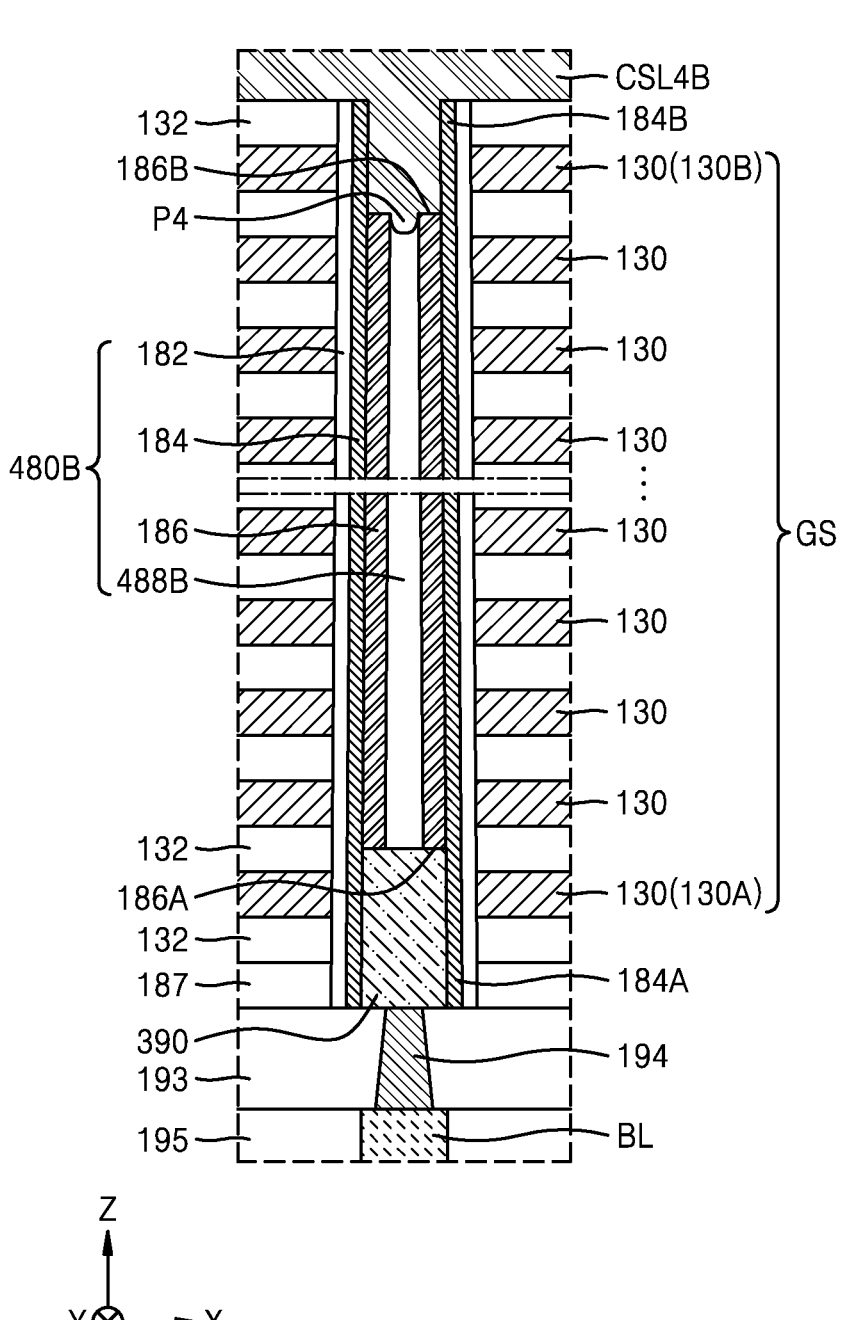

FIG. 6B is a cross-sectional view illustrating a semiconductor device 400B according to some example embodiments. FIG. 6B illustrates an enlarged configuration of a region of the semiconductor device 400B, which corresponds to the region EX1 of FIG. 2B.

Referring to FIG. 6B, the semiconductor device 400B has a configuration substantially similar to the semiconductor device 400A described with reference to FIG. 6A. However, the semiconductor device 400B includes a channel structure 480B passing through the plurality of gate lines 130 in the vertical direction (Z direction), and a common source line CSL4B contacting the channel region 184 of the channel structure 480B.

The channel structure 480B and the common source line CSL4B have substantially similar configurations as the channel structure 480A and the common source line CSL4A described with reference to FIG. 6A, respectively. However, the channel structure 480B includes a first insulating pattern 488B surrounded by the variable resistance pattern 186 in the columnar space defined by the channel region 184. The first insulating pattern 488B may constitute the insulating structure. The first insulating pattern 488B may include, but is not limited to, a silicon nitride film.

The common source line CSL4B may include a surface contacting the second channel end 184B of the channel region 184, a surface contacting the second end 186B of the variable resistance pattern 186, and a protrusion P4 contacting the first insulating pattern 488B, in the columnar space defined by the channel region 184. The protrusion P4 of the common source line CSL4B may protrude toward the conductive pad 390 up to the inside of the space defined by the variable resistance pattern 186. The first insulating pattern 488B may have a concave surface that contacts the protrusion P4 of the common source line CSL4B and corresponds to the shape of the protrusion P4. The protrusion P4 of the common source line CSL4B may horizontally overlap the variable resistance pattern 186 (i.e., along the horizontal directions X and Y).

Figure 6C:
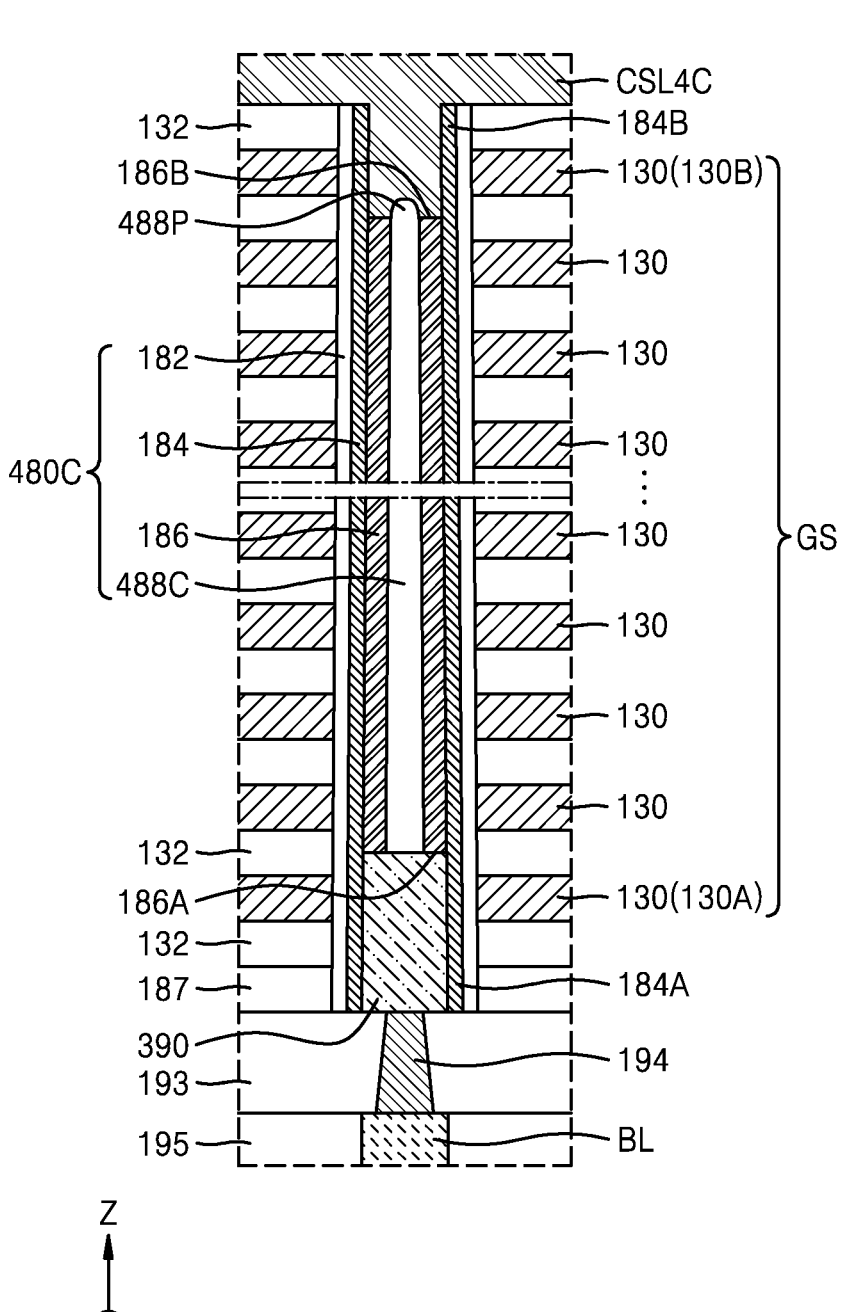
Figure 6C:
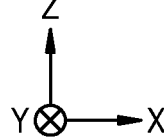

FIG. 6C is a cross-sectional view illustrating a semiconductor device 400C according to some example embodiments. FIG. 6C illustrates an enlarged configuration of a region of the semiconductor device 400C, which corresponds to the region EX1 of FIG. 2B.

Referring to FIG. 6C, the semiconductor device 400C has a configuration substantially similar to the semiconductor device 400A described with reference to FIG. 6A. However, the semiconductor device 400C includes a channel structure 480C passing through the plurality of gate lines 130 in the vertical direction (Z direction), and a common source line CSL4C contacting the channel region 184 that is included in the channel structure 480C.

The channel structure 480C and the common source line CSL4C have configurations substantially similar to the channel structure 480A and the common source line CSL4A described with reference to FIG. 6A, respectively. However, the channel structure 480C includes a first insulating pattern 488C surrounded by the variable resistance pattern 186 in the columnar space defined by the channel region 184. The first insulating pattern 488C may constitute the insulating structure.

The first insulating pattern 488C may include a protrusion 488P contacting the common source line CSL4C. The protrusion 488P of the first insulating pattern 488C may further protrude in a direction away from the bit line BL than the second end 186B of the variable resistance pattern 186. The first insulating pattern 488C may include, but is not limited to, a silicon nitride film.

The common source line CSL4C may have a surface contacting the second channel end 184B of the channel region 184, a surface contacting the second end 186B of the variable resistance pattern 186, and a surface contacting the protrusion 488P of the first insulating pattern 488C, in the columnar space defined by the channel region 184. The surface of the common source line CSL4C, which contacts the protrusion 488P of the first insulating pattern 488C, may include a concave surface corresponding to the shape of the protrusion 488P. The protrusion 488P of the first insulating pattern 488C may horizontally overlap the common source line CSL4C (i.e., along the horizontal directions X and Y).

Figure 7A:
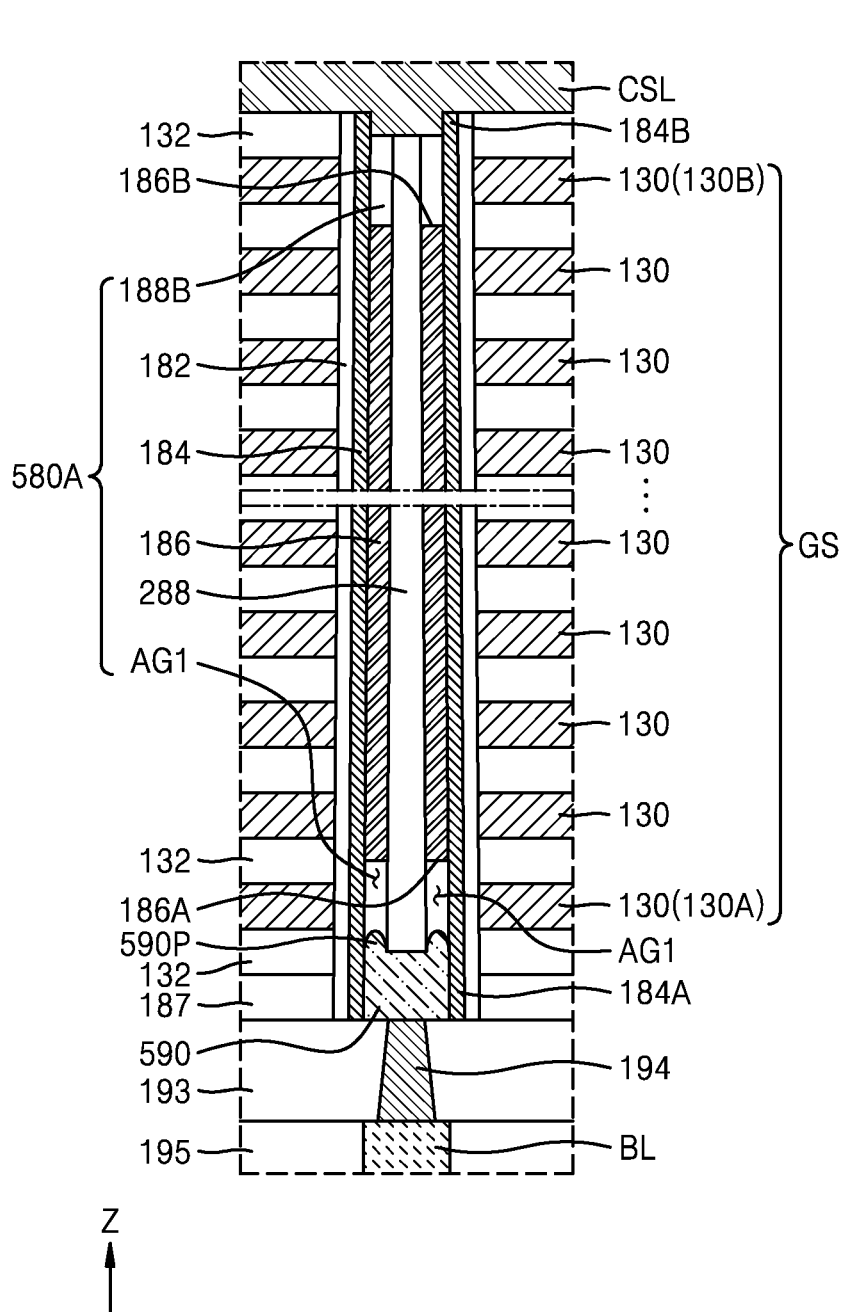
FIGS. 7A, 7B, and 7C are respectively cross-sectional views illustrating a semiconductor device according to some example embodiments.

FIG. 7A is a cross-sectional view illustrating a semiconductor device 500A according to some example embodiments. FIG. 7A illustrates an enlarged configuration of a region of the semiconductor device 500A, which corresponds to the region EX1 of FIG. 2B.

Referring to FIG. 7A, the semiconductor device 500A has a configuration substantially similar to the semiconductor device 200 described with reference to FIG. 3. However, the semiconductor device 500A includes a channel structure 580A passing through the plurality of gate lines 130 in the vertical direction (Z direction), and a conductive pad 590 contacting the channel region 184 of the channel structure 580A.

The channel structure 580A has a configuration substantially similar to the channel structure 280 described with reference to FIG. 3. However, the channel structure 580A includes the first insulating pattern 288 surrounded by the variable resistance pattern 186, the second insulating pattern 188B surrounding one end of the first insulating pattern 288 adjacent to the common source line CSL, and a first air gap AG1 surrounding the other end of the first insulating pattern 288 adjacent to the conductive pad 590, in the columnar space defined by the channel region 184. The first insulating pattern 288, the second insulating pattern 188B, and the first air gap AG1 may constitute the insulating structure. A portion of the channel region 184, a portion of the variable resistance pattern 186, a portion of the first insulating pattern 288, and a portion of the conductive pad 590 may be exposed by the first air gap AG1. Each of the first insulating pattern 288 and the second insulating pattern 188B may include, but is not limited to, a silicon nitride film.

The conductive pad 590 may be apart from the variable resistance pattern 186 in the vertical direction (Z direction) with the first air gap AG1 therebetween. The conductive pad 590 may have a surface contacting the first channel end 184A of the channel region 184, and a surface contacting the first insulating pattern 288, in the columnar space defined by the channel region 184.

The conductive pad 590 may include a protrusion 590P, which is exposed by the first air gap AG1 and protrudes toward the first end 186A of the variable resistance pattern 186. The protrusion 590P of the conductive pad 590 may surround one end of the first insulating pattern 288, which is adjacent to the conductive pad 590. The protrusion 590P of the conductive pad 590 may horizontally overlap the first insulating pattern 288 (i.e., along the horizontal directions X and Y). Other configurations of the conductive pad 590 are substantially similar to the conductive pad 190 described with reference to FIGS. 2B and 2C.

Figure 7B:
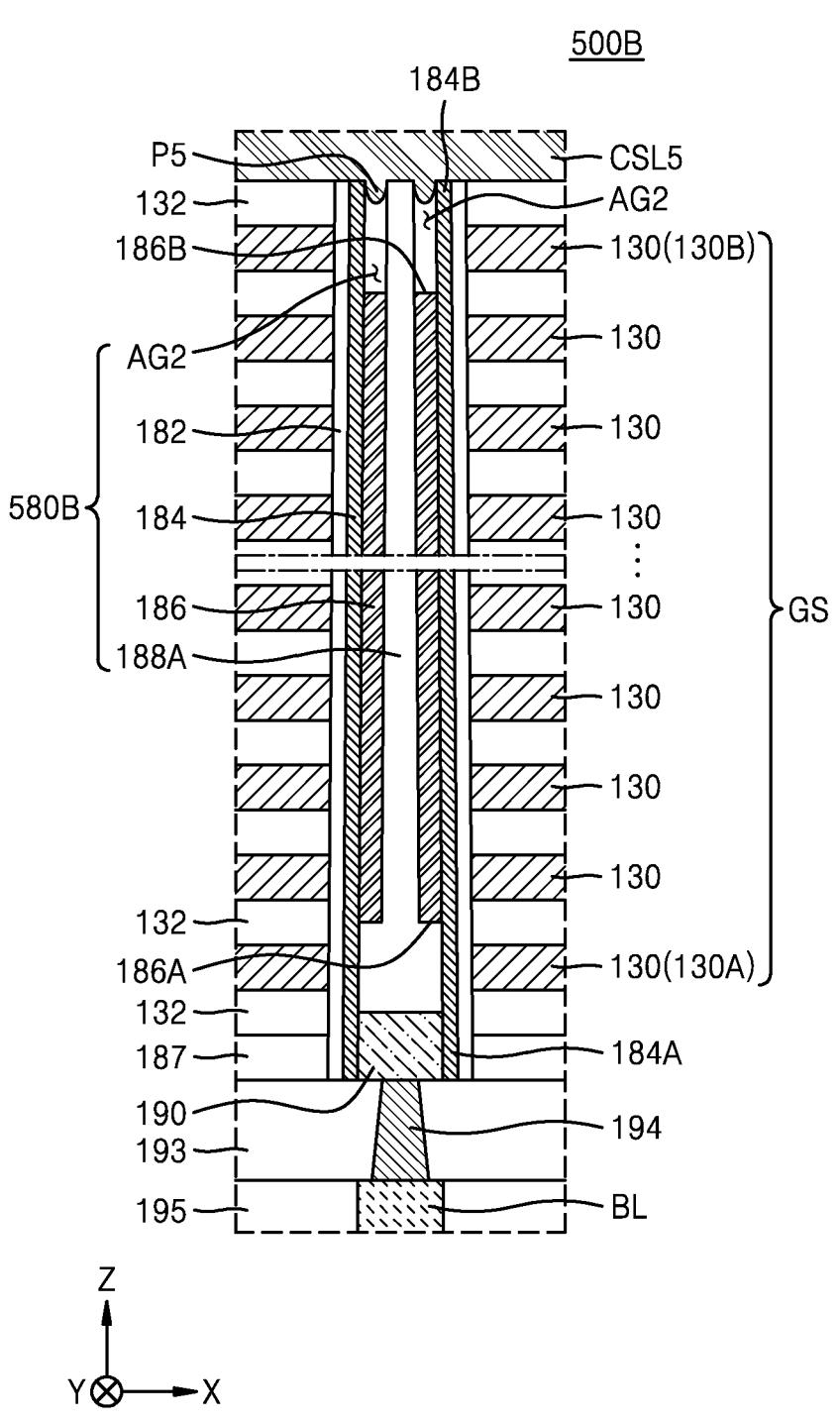

FIG. 7B is a cross-sectional view illustrating a semiconductor device 500B according to some example embodiments. FIG. 7B illustrates an enlarged configuration of a region of the semiconductor device 500B, which corresponds to the region EX1 of FIG. 2B.

Referring to FIG. 7B, the semiconductor device 500B has a configuration substantially similar to the semiconductor device 100 described with reference to FIGS. 2A to 2C. However, the semiconductor device 500B includes a channel structure 580B passing through the plurality of gate lines 130 in the vertical direction (Z direction), and a common source line CSL5 contacting the channel region 184 of the channel structure 580B.

The channel structure 580B has a configuration substantially similar to the channel structure 180 described with reference to FIGS. 2A to 2C. However, the channel structure 580B includes the first insulating pattern 188A surrounded by the variable resistance pattern 186, and a second air gap AG2 surrounding one end of the first insulating pattern 188A adjacent to the common source line CSL5, in the columnar space defined by the channel region 184. The first insulating pattern 188A and the second air gap AG2 may constitute the insulating structure. A portion of the channel region 184, a portion of the variable resistance pattern 186, a portion of the first insulating pattern 188A, and a portion of the common source line CSL5 may be exposed by the second air gap AG2.

The common source line CSL5 may be apart from the variable resistance pattern 186 in the vertical direction (Z direction) with the second air gap AG2 therebetween. The common source line CSL5 may have a surface contacting the second channel end 184B of the channel region 184, and a surface contacting the first insulating pattern 188A, in the columnar space defined by the channel region 184.

The common source line CSL5 may include a protrusion P5, which is exposed by the second air gap AG2 and protrudes toward the second end 186B of the variable resistance pattern 186. The protrusion P5 of the common source line CSL5 may surround one end of the first insulating pattern 188A, which is adjacent to the common source line CSL5. The protrusion P5 of the common source line CSL5 may horizontally overlap the first insulating pattern 188A (i.e., along the horizontal directions X and Y). Other configurations of the common source line CSL5 are substantially similar to those described regarding the common source line CSL with reference to FIGS. 2B and 2C.

Figure 7C:
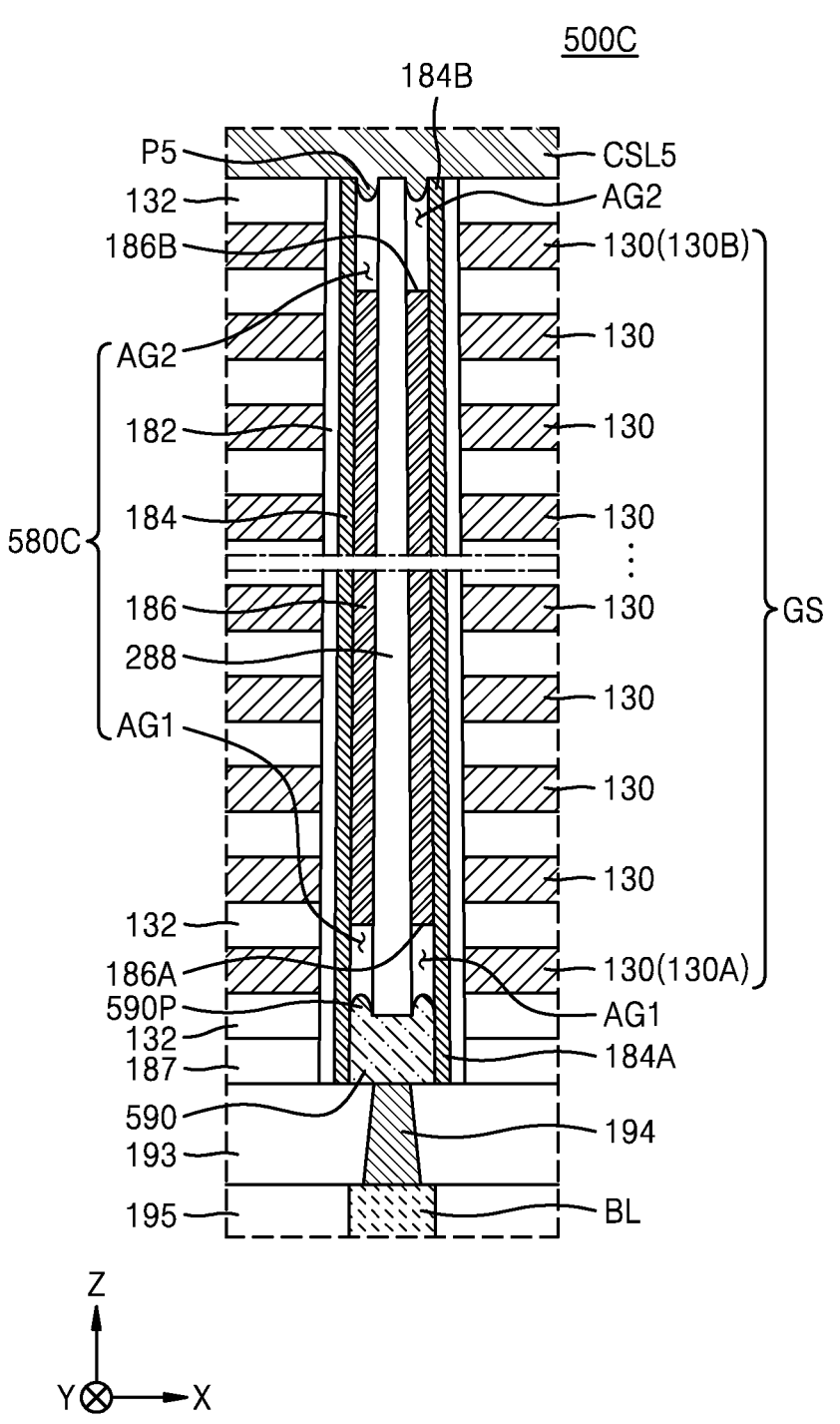

FIG. 7C is a cross-sectional view illustrating a semiconductor device 500C according to some example embodiments. FIG. 7B illustrates an enlarged configuration of a region of the semiconductor device 500C, which corresponds to the region EX1 of FIG. 2B.

Referring to FIG. 7C, the semiconductor device 500C has a configuration substantially similar to the semiconductor device 200 described with reference to FIG. 3. However, the semiconductor device 500C includes a channel structure 580C passing through the plurality of gate lines 130 in the vertical direction (Z direction), the conductive pad 590 contacting the first channel end 184A of the channel region 184 of the channel structure 580C, and the common source line CSL5 contacting the second channel end 184B of the channel region 184 of the channel structure 580C.

The channel structure 580C has a configuration substantially similar to the channel structure 280 described with reference to FIG. 3. However, the channel structure 580C includes the first insulating pattern 288 surrounded by the variable resistance pattern 186, the first air gap AG1 surrounding one end of the first insulating pattern 288 adjacent to the conductive pad 590, and the second air gap AG2 surrounding the other end of the first insulating pattern 288 adjacent to the common source line CSL5, in the columnar space defined by the channel region 184. The first insulating pattern 288, the first air gap AG1, and the second air gap AG2 may constitute the insulating structure. Other portions of the conductive pad 590 are substantially similar to those described with reference to FIG. 7A. A detailed configuration of the common source line CSL5 is substantially similar to the description with reference to FIG. 7B.

Figure 8A:
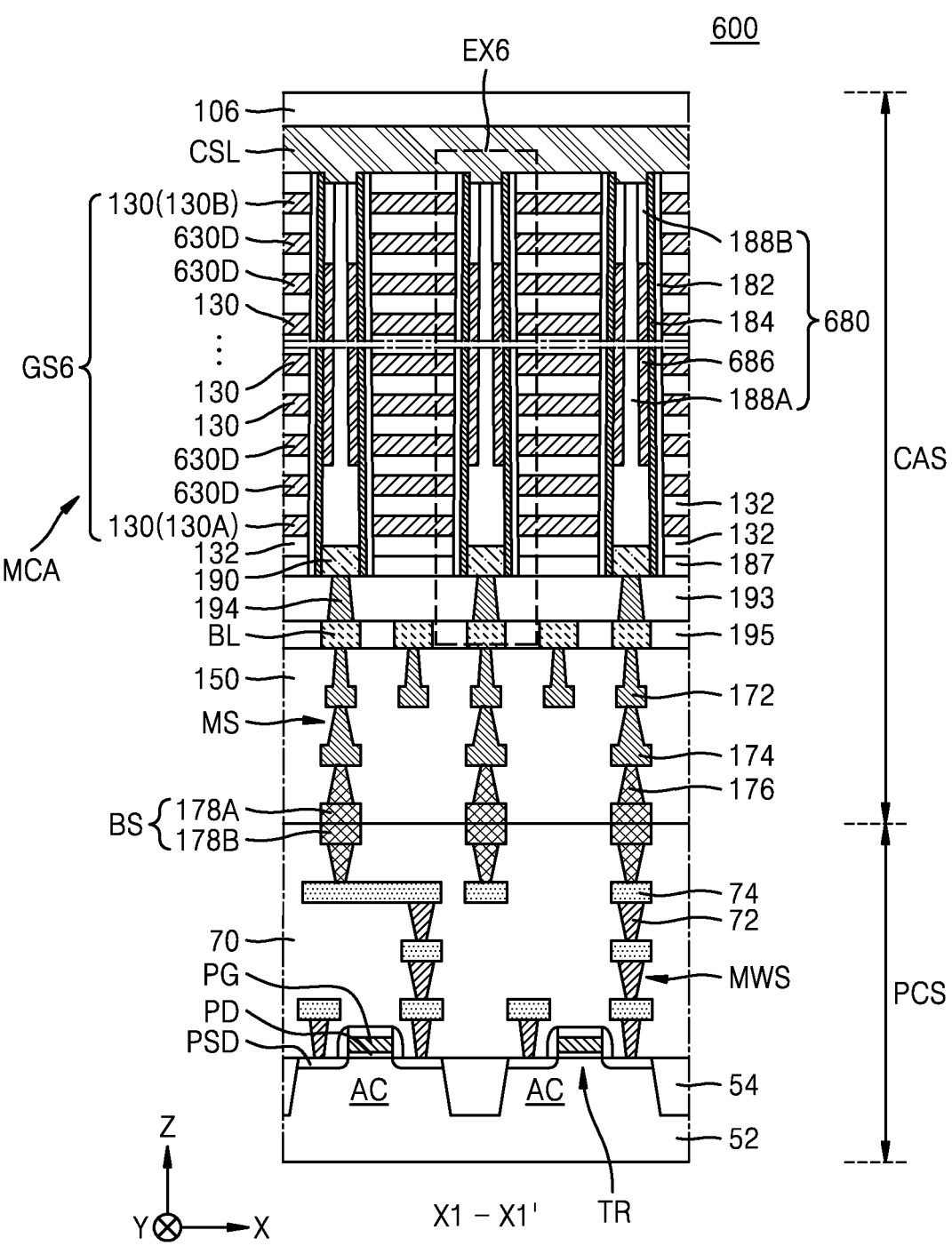
FIG. 8A is a cross-sectional view illustrating a semiconductor device according to some example embodiments.
Figure 8B:
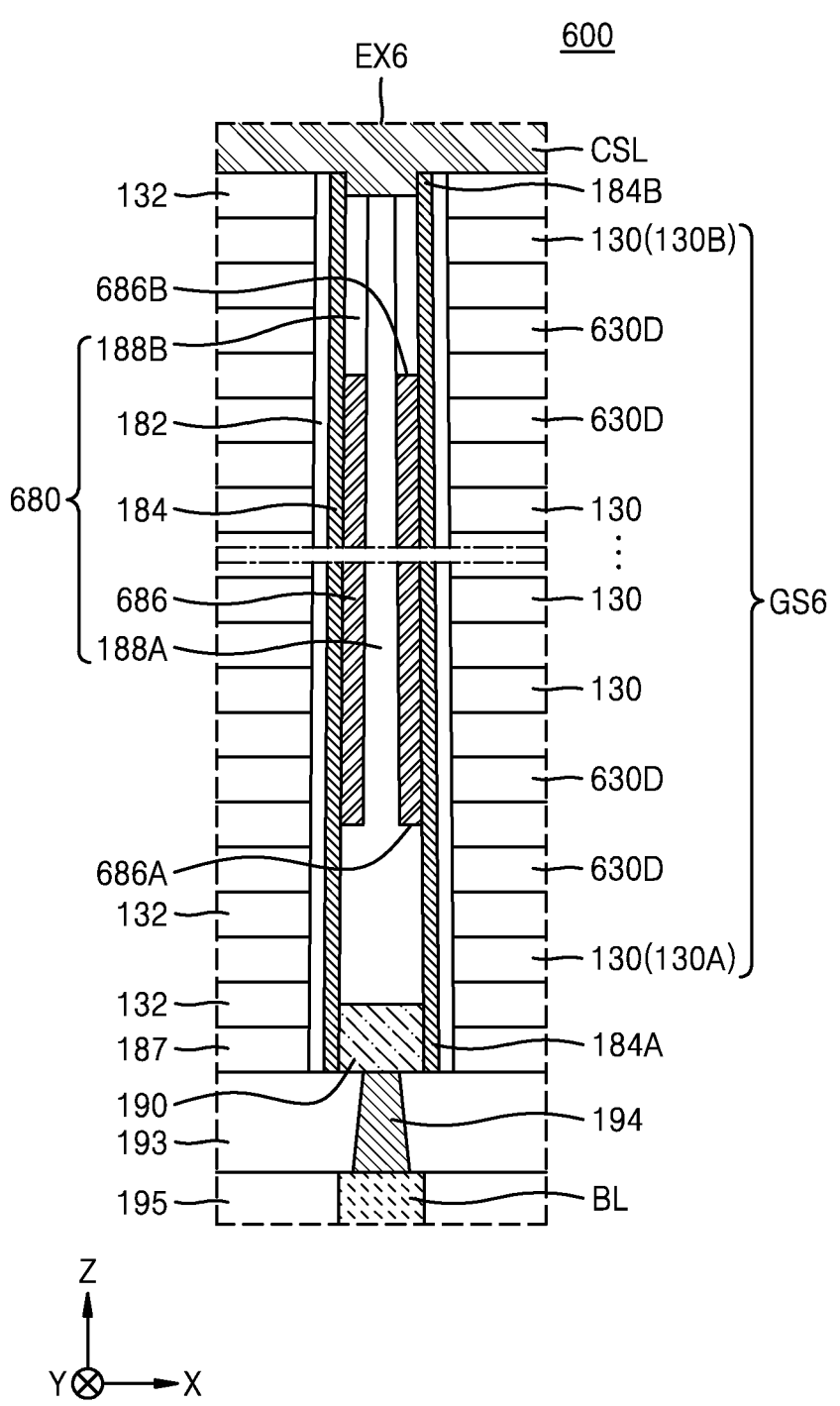
FIG. 8B is an enlarged cross-sectional view of a region EX6 of FIG. 8A.

FIG. 8A is a cross-sectional view illustrating a semiconductor device 600 according to some example embodiments. FIG. 8B is an enlarged cross-sectional view of a region EX6 of FIG. 8A.

Referring to FIGS. 8A and 8B, the semiconductor device 600 has a configuration substantially similar to the semiconductor device 100 described with reference to FIGS. 2A to 2C. However, the memory cell array MCA of the semiconductor device 600 may include a gate stack GS6 including a plurality of gate lines 130 and 630D that are arranged between the common source line CSL and the peripheral circuit structure PCS. The plurality of gate lines 130 and 630D of the gate stack GS6 may extend in the horizontal direction, which is parallel to the common source line CSL, and overlap each other in the vertical direction (Z direction). The plurality of gate lines 130 may include the plurality of word lines WL, the ground select line GSL, and the string select line SSL, which are shown in FIG. 1. The plurality of gate lines 630D may include dummy word lines that do not actually operate as word lines.

Some gate lines 630D of the plurality of gate lines 630D may be arranged between the plurality of gate lines 130 used as the word lines WL (see FIG. 1) and the first select gate line 130A adjacent to the plurality of conductive pads 190, and some other gate lines 630D of the plurality of gate lines 630D may be arranged between the plurality of gate lines 130 used as the word lines WL (see FIG. 1) and the second select gate line 130B adjacent to the common source line CSL.

The cell array structure CAS of the semiconductor device 600 may include a plurality of channel structures 680 passing through the plurality of gate lines 130 and 630D in the vertical direction (Z direction). Each of the plurality of channel structures 680 may include the gate dielectric film 182, the channel region 184, a variable resistance pattern 686, the first insulating pattern 188A, and the second insulating pattern 188B, which are sequentially stacked in the stated order in a direction from the plurality of gate lines 130 and 630D toward the center of the channel structure 680.

At least one gate line 630D of the plurality of gate lines 630D, which are dummy gate lines, may be offset, in the vertical direction (for example, the Z direction), from the variable resistance pattern 686 in the vertical direction (for example, the Z direction). Some gate lines 630D of the plurality of gate lines 630D may face the variable resistance pattern 686 in the horizontal direction (for example, the X direction). For example, some gate lines 630D of the plurality of gate lines 630D may horizontally overlap the variable resistance pattern 686.

The plurality of gate lines 630D, which are dummy word lines, are arranged between the plurality of gate lines 130 used as the word lines WL (see FIG. 1) and the first select gate line 130A and between the plurality of gate lines 130 used as the word lines WL (see FIG. 1) and the second select gate line 130B, whereby a separation distance from a first end 686A and a second end 686B of the variable resistance pattern 686 to the plurality of gate lines 130 used as the word lines WL (see FIG. 1) may be increased. Therefore, a cell transistor including the plurality of gate lines 130 may perform a stable cell operation.

Figure 9A:
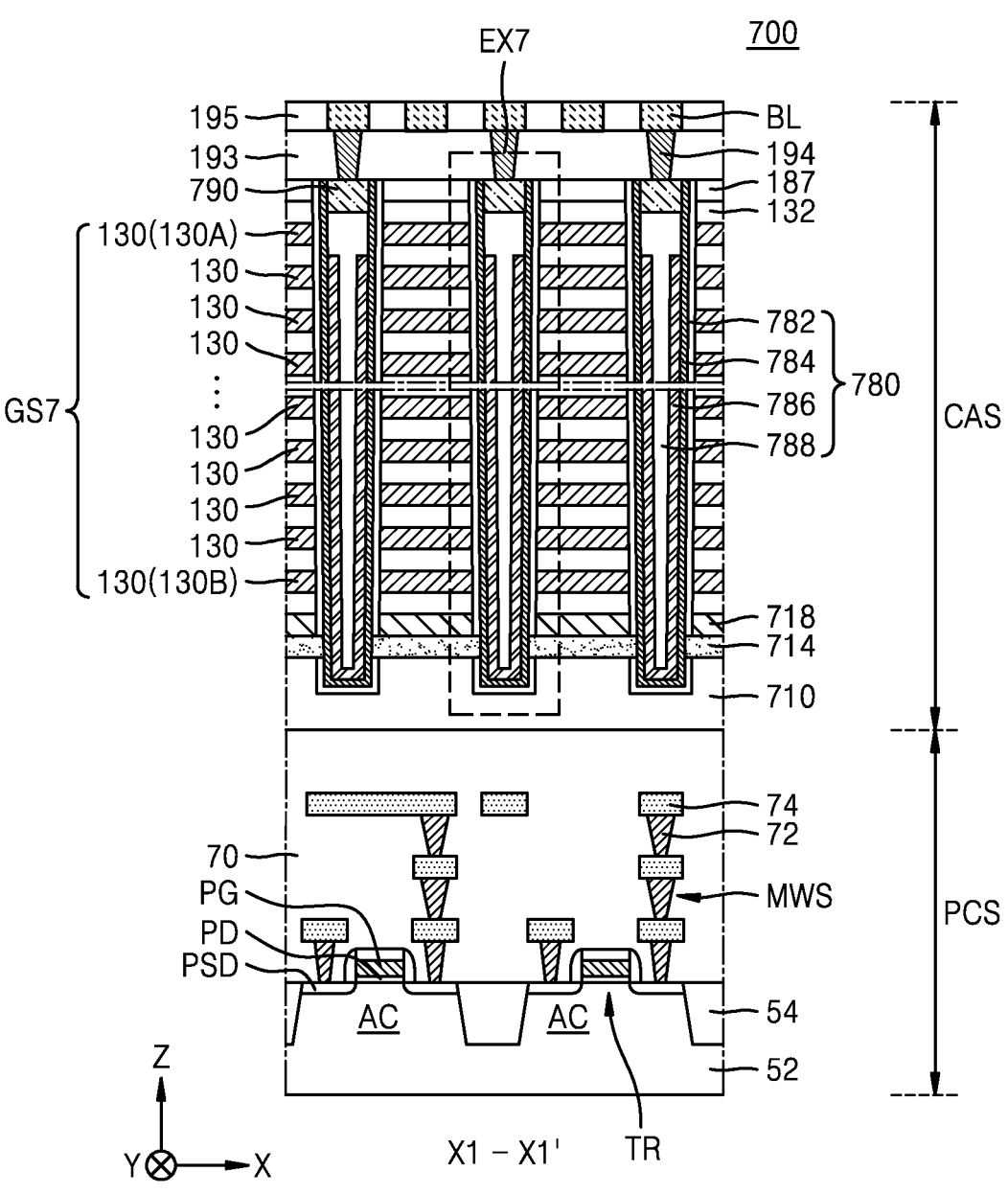
FIG. 9A is a cross-sectional view illustrating a semiconductor device according to some example embodiments.
Figure 9B:
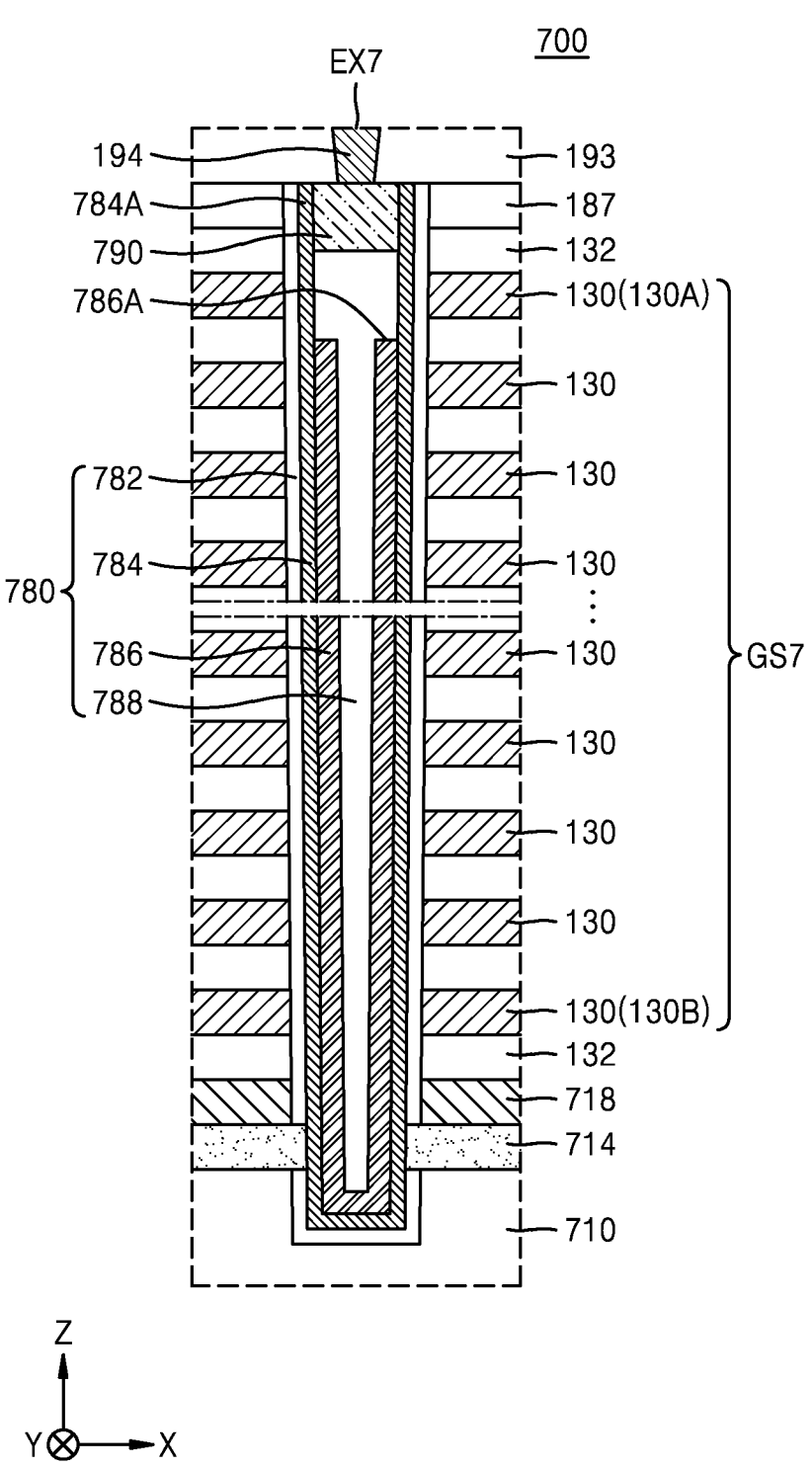
FIG. 9B is an enlarged cross-sectional view of a region EX7 of FIG. 9A.

FIG. 9A is a cross-sectional view illustrating a semiconductor device 700 according to some example embodiments. FIG. 9B is an enlarged cross-sectional view of a region EX7 of FIG. 9A.

Referring to FIGS. 9A and 9B, the semiconductor device 700 has a configuration substantially similar to the semiconductor device 100 described with reference to FIGS. 2A to 2C. However, the cell array structure CAS of the semiconductor device 700 includes a cell substrate 710 on the peripheral circuit structure PCS, and a gate stack GS7 on the cell substrate 710.

In the cell array structure CAS, a first conductive plate 714 and a second conductive plate 718 may be sequentially arranged in the stated order on the cell substrate 710, and the gate stack GS7 including the plurality of gate lines 130 may be arranged on the second conductive plate 718. The gate stack GS7 is substantially similar to the gate stack GS described with reference to FIGS. 2B and 2C.

The cell substrate 710, the first conductive plate 714, and the second conductive plate 718 may function as the common source line CSL (see FIG. 1) for supplying currents to vertical memory cells that are included in the cell array structure CAS.

In some example embodiments, the cell substrate 710 may include a semiconductor material, such as doped polysilicon. Each of the first conductive plate 714 and the second conductive plate 718 may include a doped polysilicon film, a metal film, or a combination thereof. The metal film may include, but is not limited to, tungsten (W).

The insulating film 132 may be arranged between the second conductive plate 718 and the plurality of gate lines 130 and between the plurality of gate lines 130. A gate line 130 closest to the conductive pad 790 from among the plurality of gate lines 130 may be covered by the insulating film 132 and the intermediate insulating film 187. The cell array structure CAS may include a plurality of channel structures 780, which pass through the plurality of gate lines 130, the plurality of insulating films 132, and the intermediate insulating film 187 in the vertical direction (Z direction). Each of the plurality of channel structures 780 may include a gate dielectric film 782, a channel region 784, a variable resistance pattern 786, and a first insulating pattern 788, which are sequentially stacked in the stated order in a direction from the plurality of gate lines 130 toward the center of the channel structure 780. The gate dielectric film 782, the channel region 784, the variable resistance pattern 786, and the first insulating pattern 788 may have substantially similar configurations as the gate dielectric film 182, the channel region 184, the variable resistance pattern 186, and the first insulating pattern 188A described with reference to FIGS. 2B and 2C, respectively. However, the variable resistance pattern 786 may include a first end 786A more recessed toward the inside of a columnar space defined by the channel region 784 than a first channel end 784A of the channel region 784, such that the variable resistance pattern 786 is offset, in the vertical direction (for example, the Z direction), from the at least one other gate line 130A, which is selected from the plurality of gate lines 130 and adjacent to the conductive pad 790, in the horizontal direction (for example, the X direction). In addition, the variable resistance pattern 786 may pass through a portion of the cell substrate 710 and extend lengthwise in the vertical direction (Z direction), such that the variable resistance pattern 786 faces the at least one yet other gate line 130B, which is selected from the plurality of gate lines 130 and adjacent to the first conductive plate 714 and the second conductive plate 718, in the horizontal direction (for example, the X direction). A detailed configuration of the conductive pad 790 is substantially similar to the conductive pad 790 described with reference to FIGS. 2B and 2C.

In the plurality of channel structures 780, the gate dielectric film 782 may include a portion covering a sidewall of the channel region 784 at a higher level than that of the first conductive plate 714, and a portion covering a lower surface of the channel region 784 at a lower level than that of the first conductive plate 714. The channel region 784 may be apart from the cell substrate 710 with the gate dielectric film 782 therebetween. The sidewall of the channel region 784 may be configured to be in contact with and electrically connected to the first conductive plate 714.

In the cell array structure CAS, the plurality of bit lines BL may be arranged over the plurality of channel structures 780. The plurality of bit line contact pads 194 may be arranged between the plurality of channel structures 780 and the plurality of bit lines BL. The conductive pad 790, which is arranged on one end of each of the plurality of channel structures 780, may be connected to one bit line BL corresponding to the conductive pad 790 from among the plurality of bit lines BL via the bit line contact pad 194. The plurality of bit line contact pads 194 may be insulated from each other by the first upper insulating film 193. The plurality of bit lines BL may be insulated from each other by the second upper insulating film 195.

As shown in FIG. 9A, in the semiconductor device 700, the peripheral circuit structure PCS may be apart from the bit line BL with the plurality of gate lines 130 therebetween. The cell substrate 710 may be arranged between the peripheral circuit structure PCS and the first conductive plate 714.

Figure 10A:
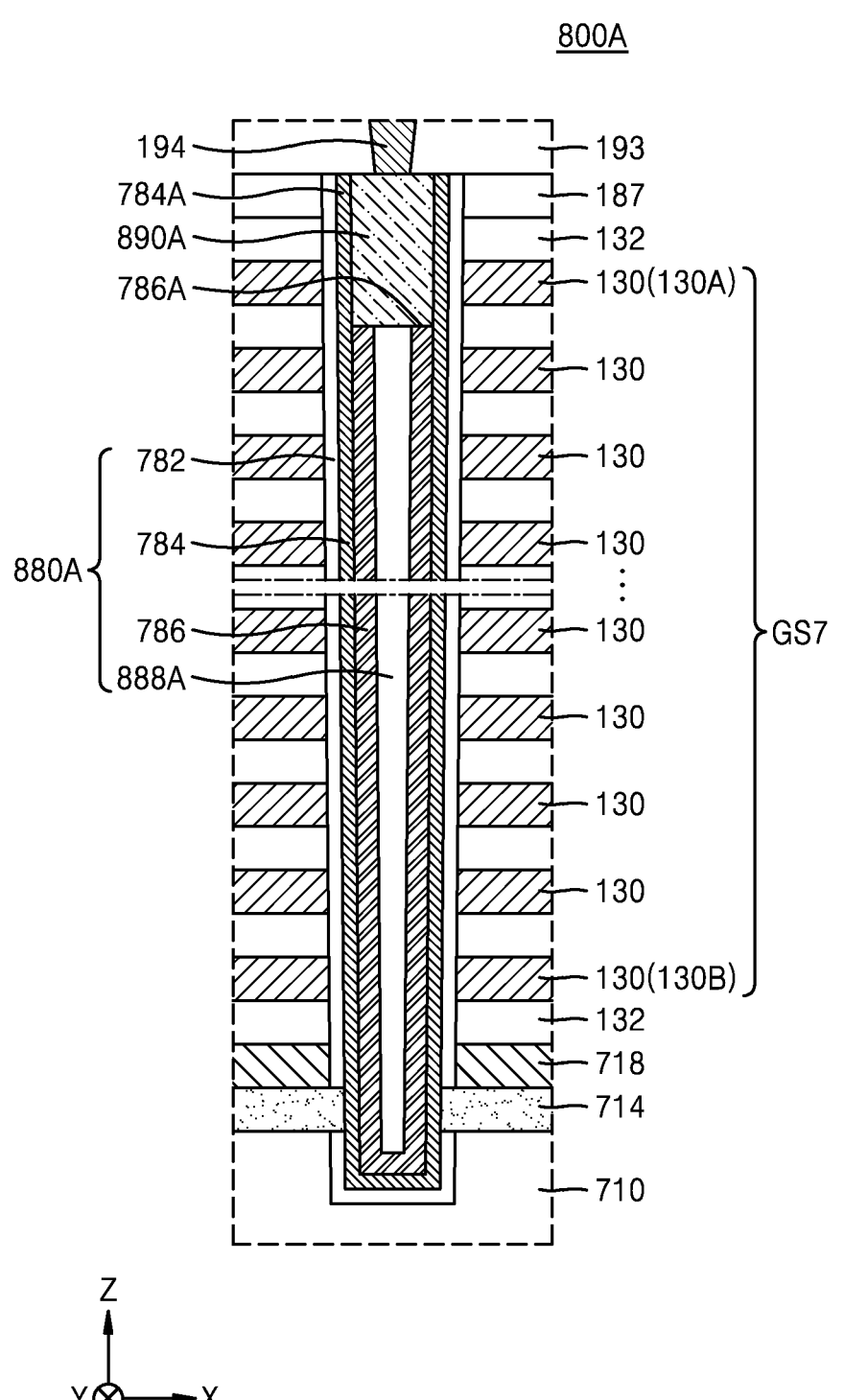

FIG. 10A is a cross-sectional view illustrating a semiconductor device 800A according to some example embodiments. FIG. 10A illustrates an enlarged configuration of a region of the semiconductor device 800A, which corresponds to the region EX7 of FIG. 9A.

Referring to FIG. 10A, the semiconductor device 800A has a configuration substantially similar to the semiconductor device 700 described with reference to FIGS. 9A and 9B. However, the semiconductor device 800A includes a channel structure 880A passing through the plurality of gate lines 130 in the vertical direction (Z direction). The channel structure 880A has a configuration substantially similar to the channel structure 780 described with reference to FIGS. 9A and 9B. However, the channel structure 880A may include an insulating pattern 888A surrounded by the variable resistance pattern 786 in the columnar space defined by the channel region 784. The insulating pattern 888A may constitute the insulating structure. The insulating pattern 888A may include, but is not limited to, a silicon nitride film.

A conductive pad 890A may have a surface contacting the first channel end 784A of the channel region 784, a surface contacting the first end 786A of the variable resistance pattern 786, and a surface contacting the insulating pattern 888A, in the columnar space defined by the channel region 784. The conductive pad 890A has a configuration substantially similar to the conductive pad 190 described with reference to FIGS. 2B and 2C.

Figure 10B:
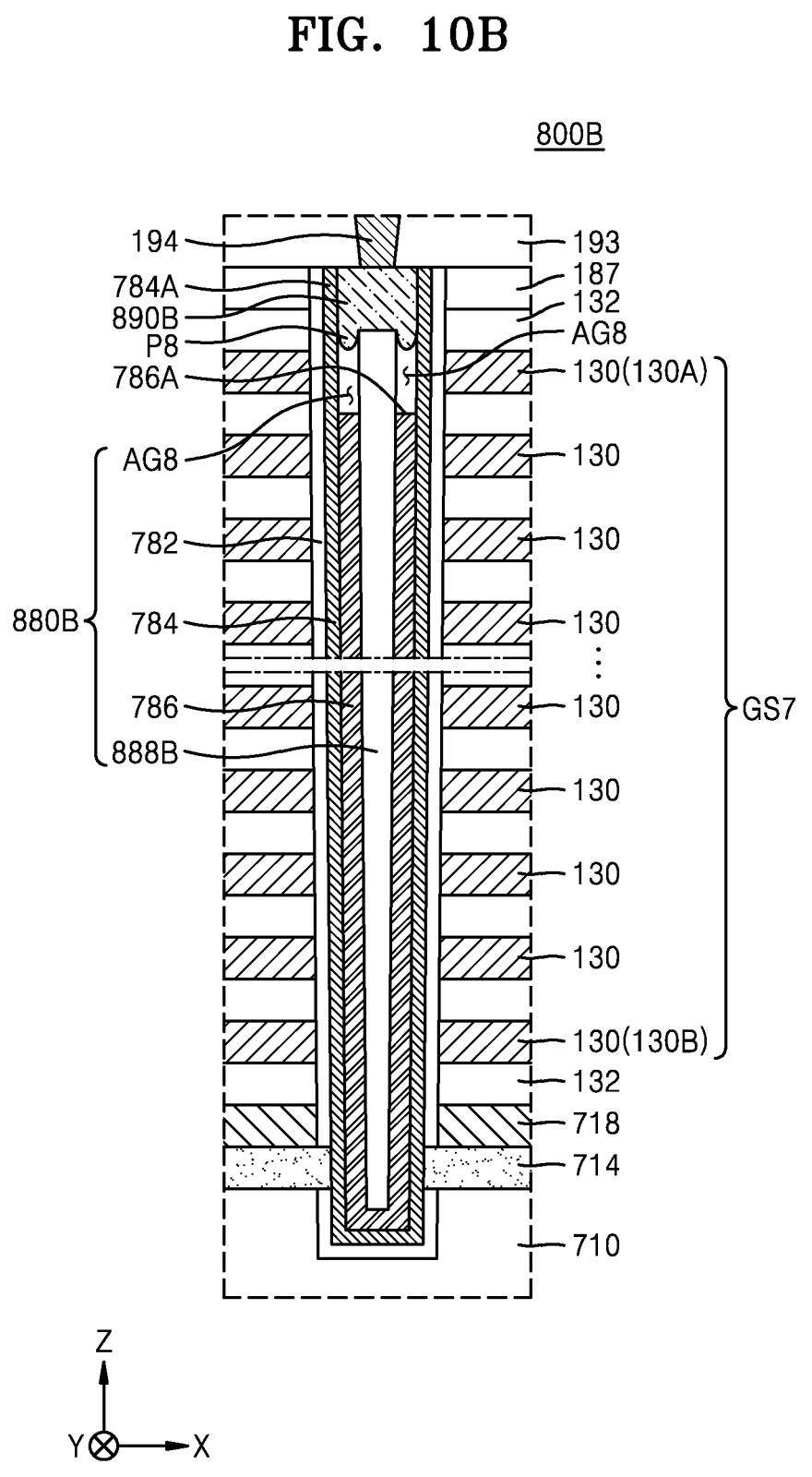

FIG. 10B is a cross-sectional view illustrating a semiconductor device 800B according to some example embodiments. FIG. 10B illustrates an enlarged configuration of a region of the semiconductor device 800B, which corresponds to the region EX7 of FIG. 9A.

Referring to FIG. 10B, the semiconductor device 800B has a configuration substantially similar to the semiconductor device 700 described with reference to FIGS. 9A and 9B. However, the semiconductor device 800B includes a channel structure 880B passing through the plurality of gate lines 130 in the vertical direction (Z direction), and a conductive pad 890B contacting the channel region 784 of the channel structure 880B.

The channel structure 880B has a configuration substantially similar to the channel structure 780 described with reference to FIGS. 9A and 9B. However, the channel structure 880B includes an insulating pattern 888B surrounded by the variable resistance pattern 786, and an air gap AG8 surrounding one end of the insulating pattern 888B adjacent to the conductive pad 890B, in the columnar space defined by the channel region 784. The insulating pattern 888B and the air gap AG8 may constitute the insulating structure. A portion of the channel region 784, the first end 786A of the variable resistance pattern 786, a portion of the insulating pattern 888B, and a portion of the conductive pad 890B may be exposed by the air gap AG8. The insulating pattern 888B may include, but is not limited to, a silicon nitride film.

The conductive pad 890B may be apart from the variable resistance pattern 786 in the vertical direction (Z direction) with the air gap AG8 therebetween. The conductive pad 890B may have a surface contacting the first channel end 784A of the channel region 784, and a surface contacting the insulating pattern 888B, in the columnar space defined by the channel region 784.

The conductive pad 890B may include a protrusion P8, which is exposed by the air gap AG8 and protrudes toward the first end 786A of the variable resistance pattern 786. The protrusion P8 of the conductive pad 890B may surround one end of the insulating pattern 888B, which is adjacent to the conductive pad 890B. The protrusion P8 of the conductive pad 890B may horizontally overlap the insulating pattern 888B (i.e., along the horizontal directions X and Y). A configuration of the conductive pad 890B is substantially similar to the conductive pad 190 described with reference to FIGS. 2B and 2C.

Figure 10C:
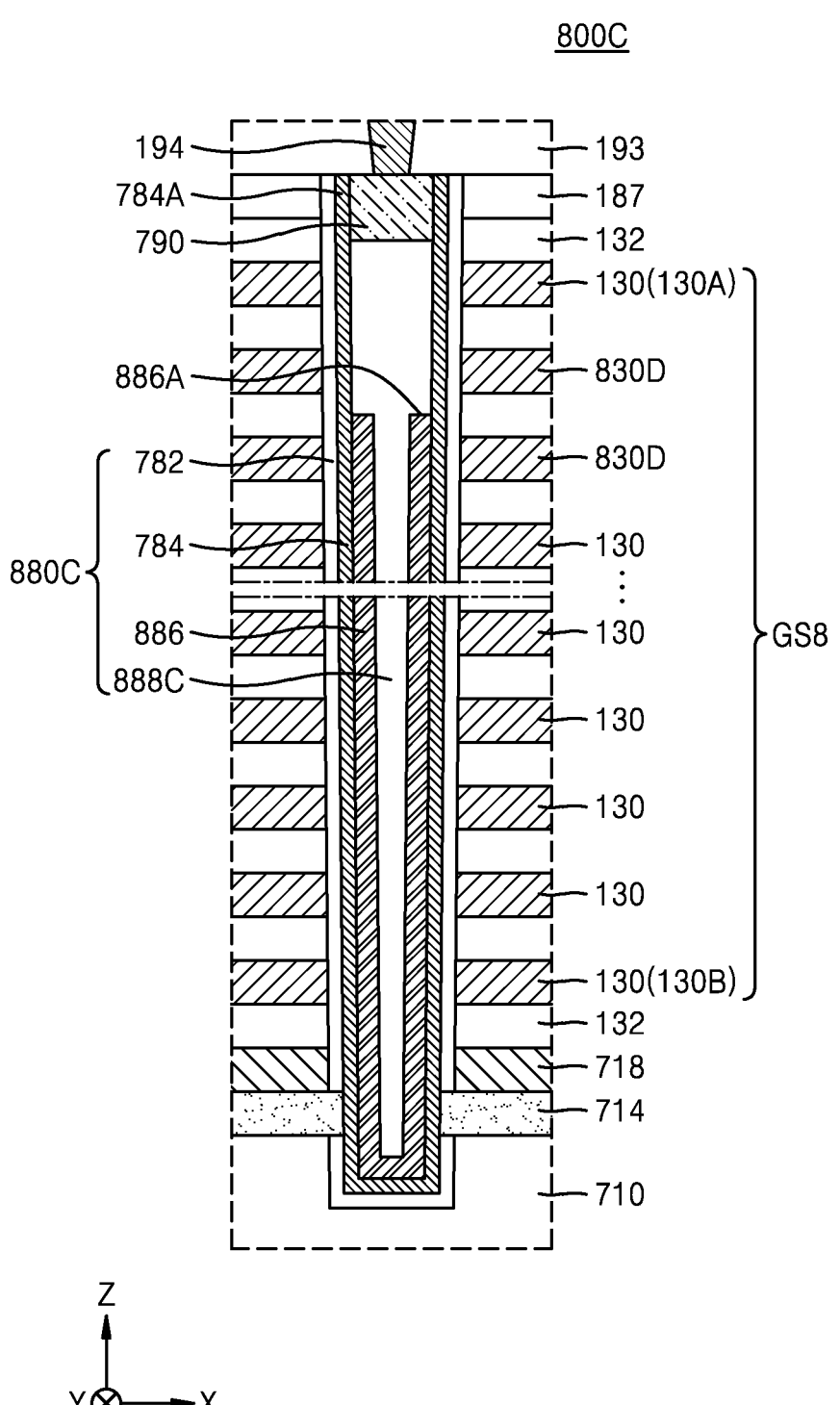

FIG. 10C is a cross-sectional view illustrating a semiconductor device 800C according to some example embodiments. FIG. 10C illustrates an enlarged configuration of a region of the semiconductor device 800C, which corresponds to the region EX7 of FIG. 9A.

Referring to FIG. 10C, the semiconductor device 800C has a configuration substantially similar to the semiconductor device 700 described with reference to FIGS. 9A and 9B. However, the semiconductor device 800C includes a gate stack GS8 including a plurality of gate lines 130 and 830D that are arranged over the second conductive plate 718. The plurality of gate lines 130 and 830D of the gate stack GS8 may extend in the horizontal direction, which is parallel to the cell substrate 710, and overlap each other in the vertical direction (Z direction). The plurality of gate lines 130 may include the plurality of word lines WL, the ground select line GSL, and the string select line SSL, which are shown in FIG. 1. The plurality of gate lines 830D may include dummy word lines that do not actually operate as word lines.

Some gate lines 830D of the plurality of gate lines 830D may be arranged between the plurality of gate lines 130 used as the word lines WL (see FIG. 1) and the first select gate line 130A adjacent to the plurality of conductive pads 790, and some other gate lines 830D of the plurality of gate lines 830D may be arranged between the plurality of gate lines 130 used as the word lines WL (see FIG. 1) and the second select gate line 130B adjacent to the second conductive plate 718.

The cell array structure CAS of the semiconductor device 800C may include a channel structure 880C passing through the plurality of gate lines 130 and 830D in the vertical direction (Z direction). The channel structure 880C may include the gate dielectric film 782, the channel region 784, a variable resistance pattern 886, and an insulating pattern 888C, which are sequentially stacked in the stated order in a direction from the plurality of gate lines 130 and 830D toward the center of the channel structure 880C. The insulating pattern 888C may constitute the insulating structure. The insulating pattern 888C may include, but is not limited to, a silicon nitride film.

At least one gate line 830D of the plurality of gate lines 830D, which are dummy word lines, may be offset, in the vertical direction (for example, the Z direction), from the variable resistance pattern 886 in the horizontal direction (for example, the X direction). Some gate lines 830D of the plurality of gate lines 830D may face (and horizontally overlap) the variable resistance pattern 886 in the horizontal direction (for example, the X direction).

The plurality of gate lines 830D, which are dummy word lines, are arranged between the plurality of gate lines 130 used as the word lines WL (see FIG. 1) and the first select gate line 130A and between the plurality of gate lines 130 used as the word lines WL (see FIG. 1) and the second select gate line 130B, whereby a separation distance from a first end 886A of the variable resistance pattern 886 to the plurality of gate lines 130 used as the word lines WL (see FIG. 1) may be increased. Therefore, a cell transistor including the plurality of gate lines 130 may perform a stable cell operation.

Similar to the semiconductor device 100 described with reference to FIGS. 2A to 2C, in the semiconductor devices 200, 300, 300A, 300B, 400A, 400B, 400C, 500A, 500B, 500C, 600, 700, 800A, 800B, and 800C described with reference to FIGS. 3 to 10C, the variable resistance pattern 186, 686, or 786 has a smaller length in the vertical direction (Z direction) than the channel region 184 or 784 such that the variable resistance pattern 186, 686, or 786 is not arranged between the channel region 184 or 784 and the first select gate line 130A and/or between the channel region 184 or 784 and the second select gate line 130B. Therefore, a defect of an unintended shift of a threshold voltage may be prevented from being generated in select transistors including the first select gate line 130A and/or the second select gate line 130B, and thus, the select transistors including the first select gate line 130A and/or the second select gate line 130B may perform stable operations, thereby improving electrical characteristics of the semiconductor devices 200, 300, 300A, 300B, 400A, 400B, 400C, 500A, 500B, 500C, 600, 700, 800A, 800B, and 800C.

Next, a method of fabricating a semiconductor device, according to some example embodiments, will be described in detail.

FIGS. 11A to 11K are cross-sectional views illustrating a method of fabricating a semiconductor device, according to some example embodiments. An example of a method of fabricating the semiconductor device 100 shown in FIGS. 2A to 2C is described with reference to FIGS. 11A to 11K. FIGS. 11A to 11K illustrate enlarged cross-sectional configurations corresponding to the region EX1 of FIG. 2B according to a sequence of processes, respectively. In FIGS. 11A to 11K, the same reference numerals as in FIGS. 2A to 2C respectively denote the same members, and here, repeated descriptions thereof are omitted.

Figure 11A:
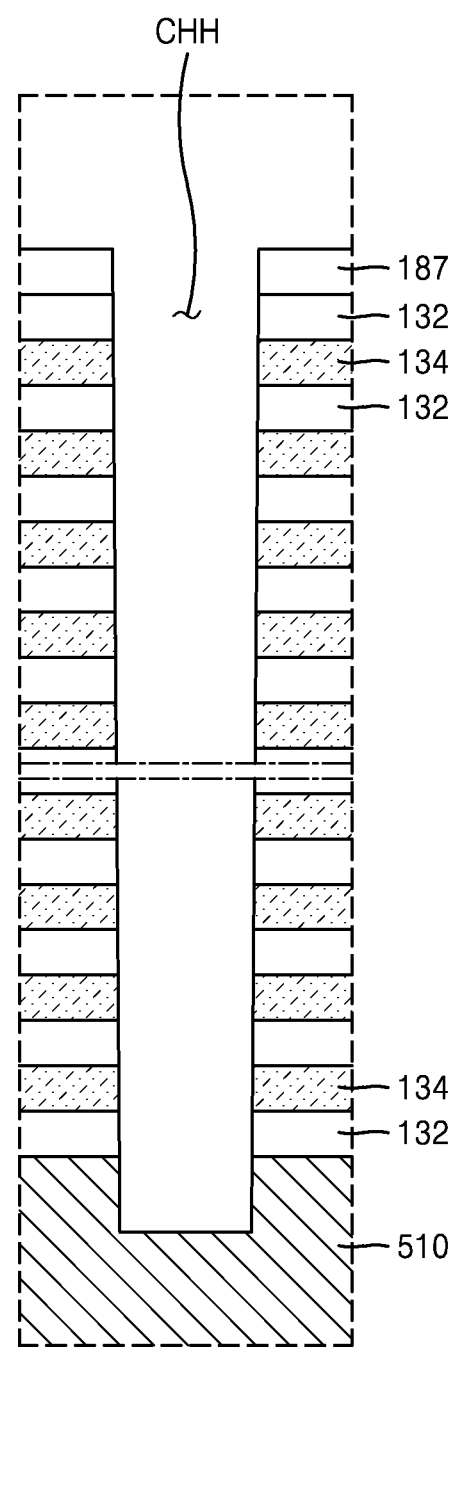
FIGS. 11A, 11B, 11C, 11D, 11E, 11F, 11G, 11H, 11I, 11J and 11K are respectively cross-sectional views illustrating a method of fabricating a semiconductor device, according to some example embodiments.
Figure 11A:
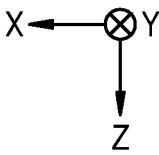

Referring to FIG. 11A, the plurality of insulating films 132 and a plurality of sacrificial insulating films 134 may be alternately stacked one by one on a sacrificial substrate 510, and the intermediate insulating film 187 may be formed on an uppermost insulating film 132.

The sacrificial substrate 510 may include silicon. The plurality of insulating films 132 may each include a silicon oxide film, and the plurality of sacrificial insulating films 134 may each include a silicon nitride film. Each of the plurality of sacrificial insulating films 134 may function to secure a space for forming the gate stack GS (see FIGS. 2B and 2C) in a subsequent process.

A channel hole CHH may be formed to extend in the vertical direction (Z direction) while passing through the plurality of insulating films 132, the plurality of sacrificial insulating films 134, and the intermediate insulating film 187. The channel hole CHH may be formed to pass through a portion of the sacrificial substrate 510.

Figure 11B:
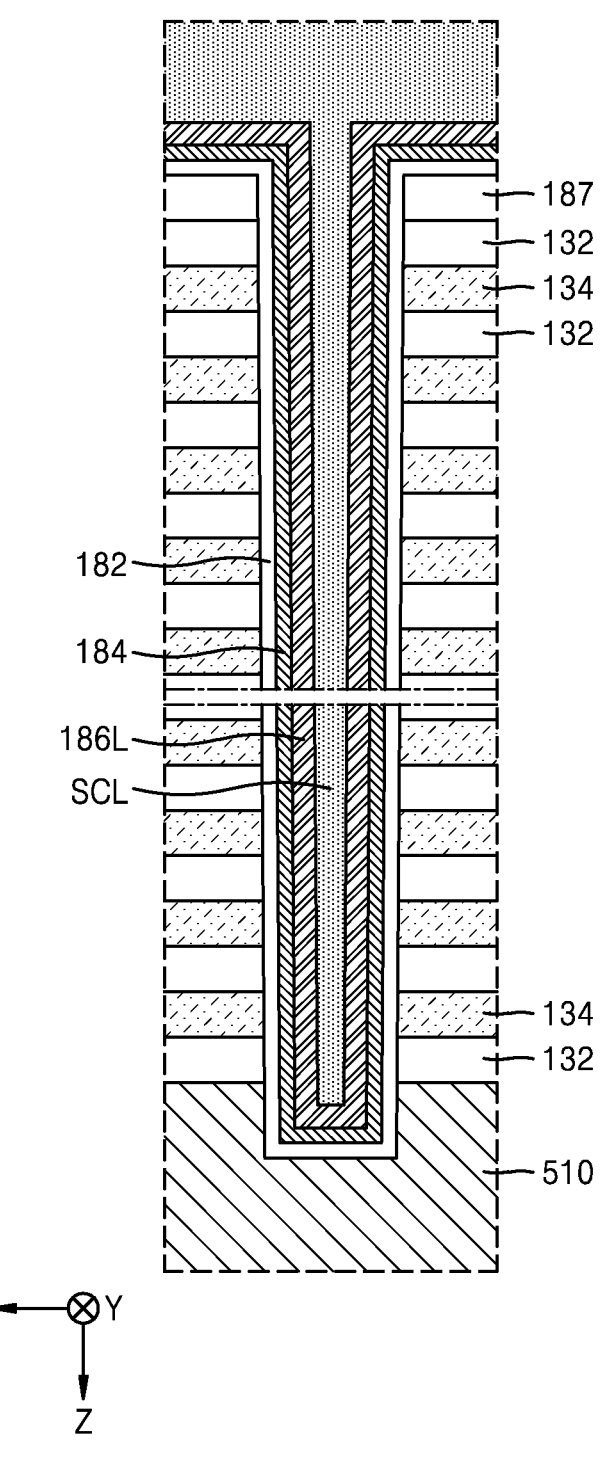

Referring to FIG. 11B, the gate dielectric film 182, the channel region 184, and a variable resistance layer 186L, and a sacrificial layer SCL may be formed in the channel hole CHH. The variable resistance layer 186L may include the same material as the variable resistance pattern 186 described with reference to FIGS. 2B and 2C. The sacrificial layer SCL may include a material having etch selectivity with respect to the variable resistance layer 186L. For example, the sacrificial layer SCL may include, but is not limited to, a silicon nitride film, a silicon oxide film, or a combination thereof.

Figure 11C:
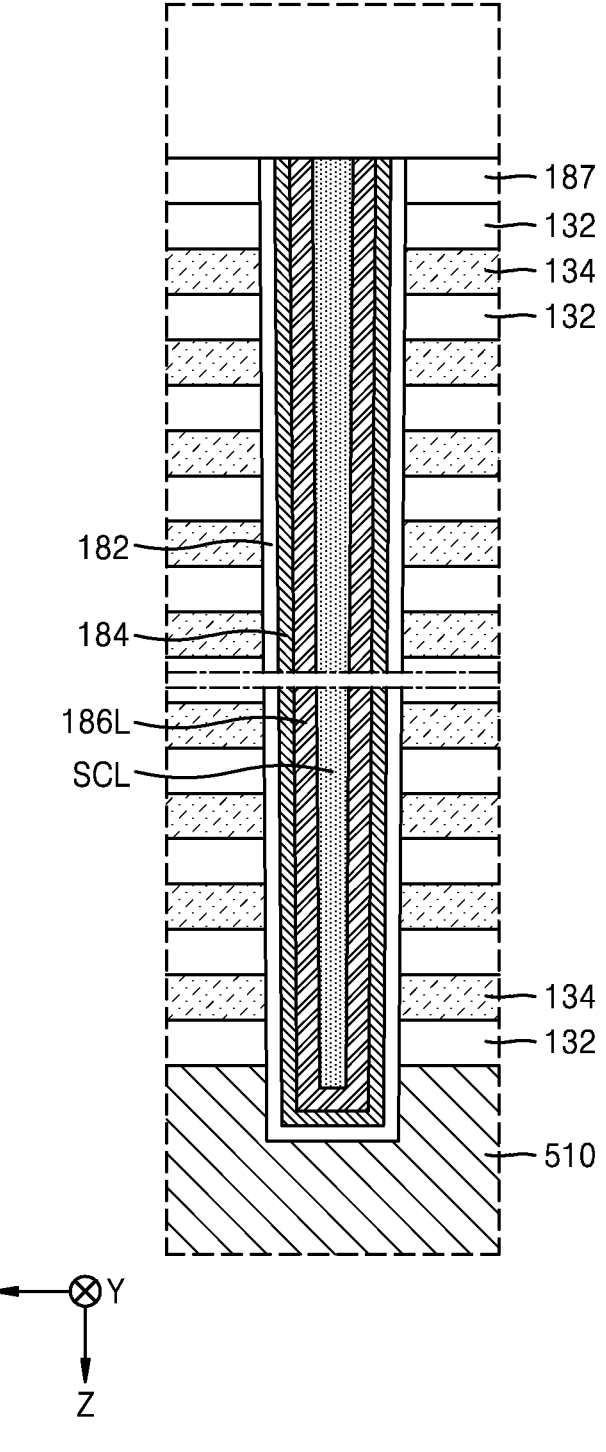

Referring to FIG. 11C, an upper surface of the intermediate insulating film 187 may be exposed by planarizing a resulting product of FIG. 11B. For example, the planarization may include a chemical mechanical polishing (CMP) process.

Figure 11D:
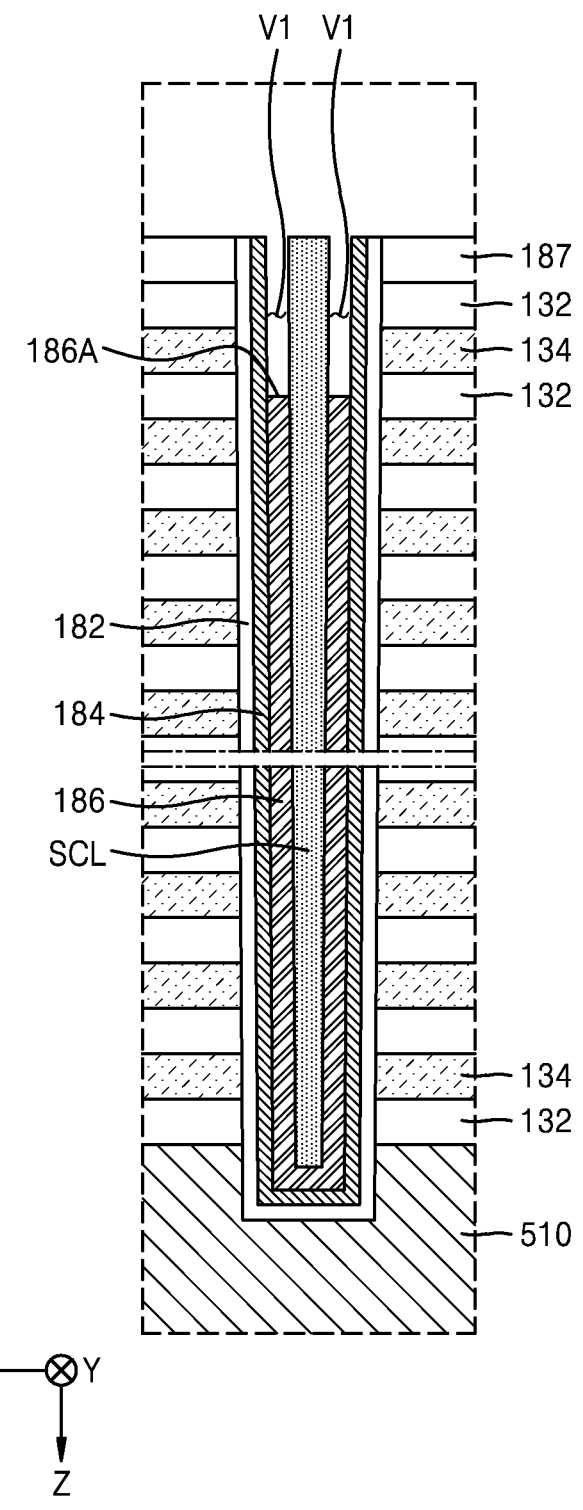

Referring to FIG. 11D, in a resulting product of FIG. 11C, the variable resistance layer 186L may be partially removed from the exposed upper surface thereof, thereby forming the variable resistance pattern 186. After the variable resistance pattern 186 is formed, a space V1, which is defined by the first end 186A of the variable resistance pattern 186, the channel region 184, and the sacrificial layer SCL, may be provided. The first end 186A of the variable resistance pattern 186 and the space V1 may have a ring shape surrounding an end of the sacrificial layer SCL, when viewed in a plane (for example, an X-Y plane). A sacrificial insulating film 134 arranged in a region, in which the first select gate line 130A is to be formed, from among the plurality of sacrificial insulating films 134 may face the space V1 in the horizontal direction.

Figure 11E:
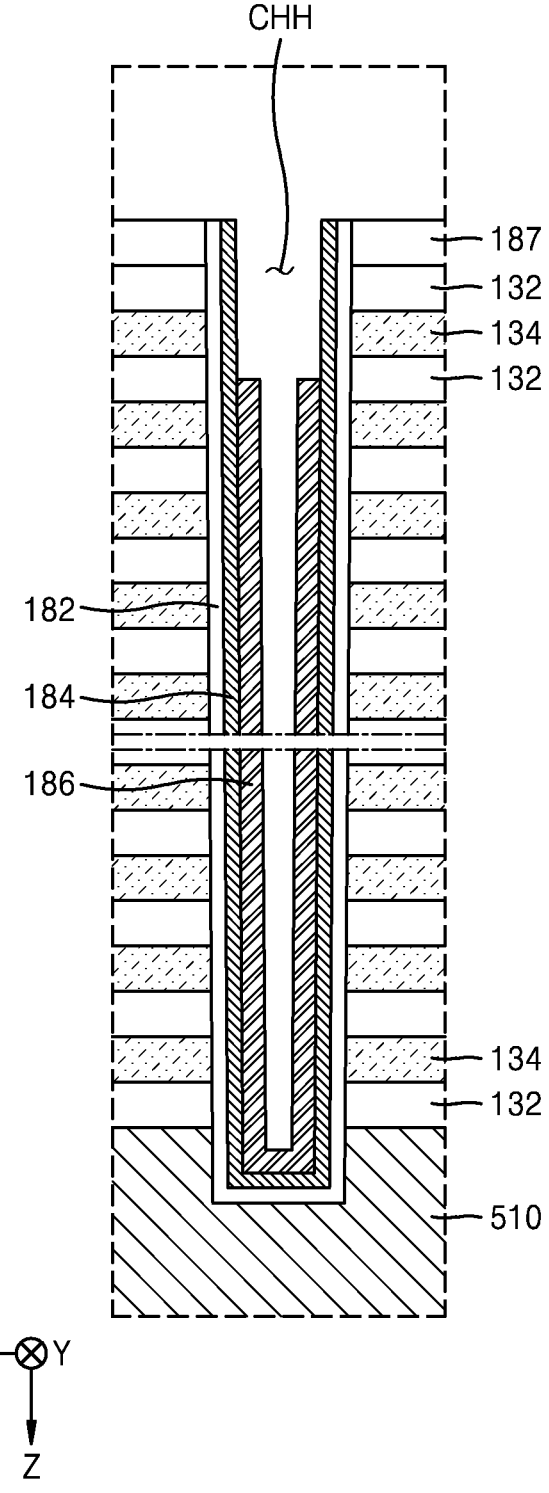

Referring to FIG. 11E, the sacrificial layer SCL may be removed from a resulting product of FIG. 11D, thereby exposing an inner surface of the variable resistance pattern 186 in the channel hole CHH.

Figure 11F:
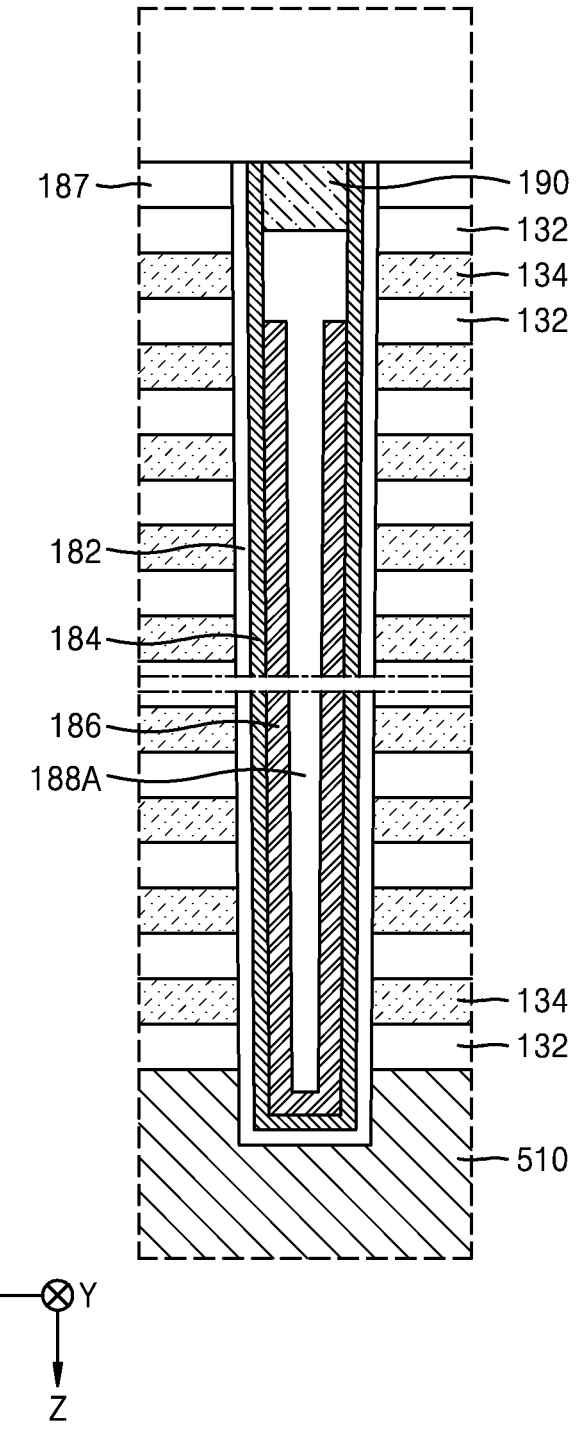

Referring to FIG. 11F, in a resulting product of FIG. 11E, the first insulating pattern 188A and the conductive pad 190 may be sequentially formed in the stated order to fill the remaining space of the channel hole CHH.

Figure 11G:
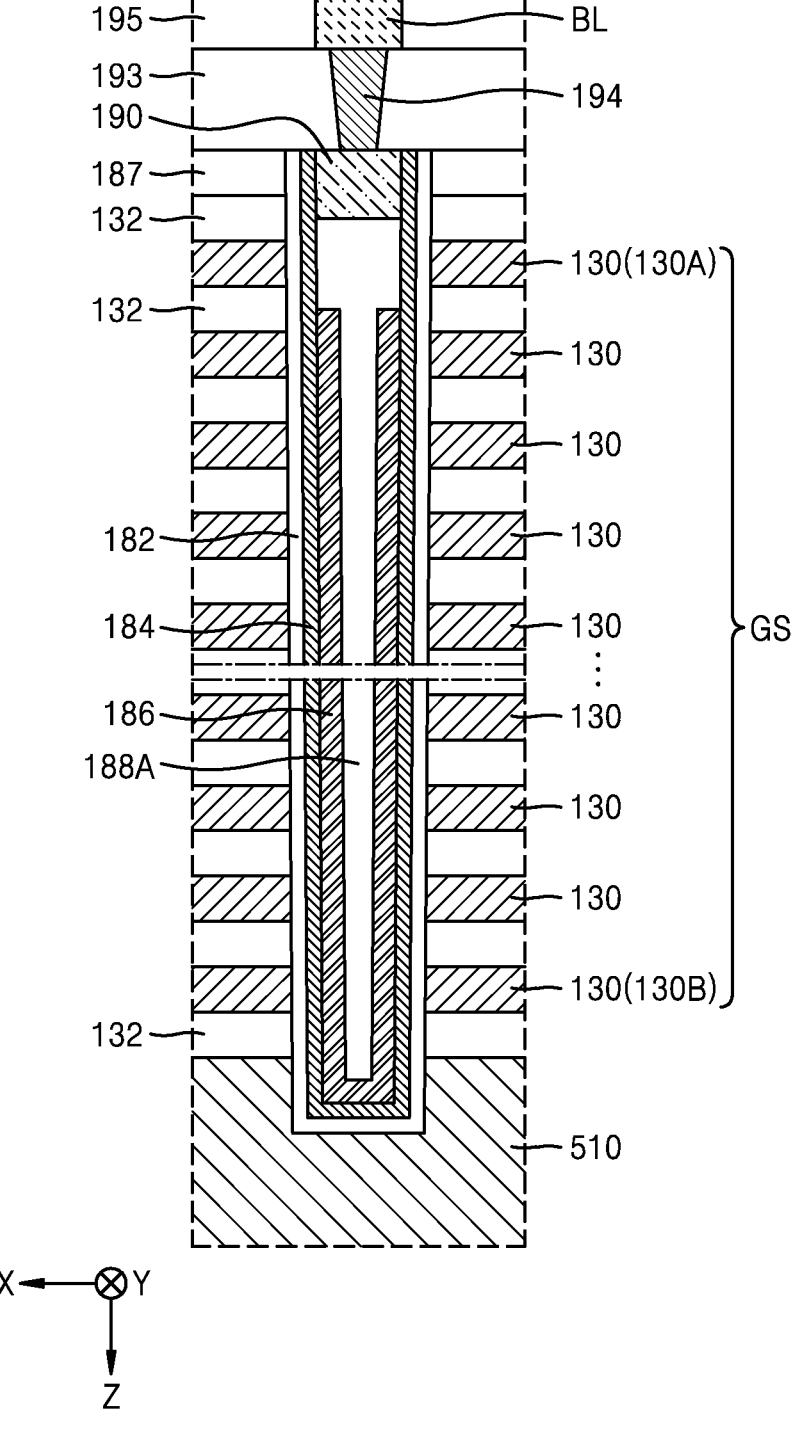

Referring to FIG. 11G, in a resulting product of FIG. 11F, the plurality of word line cut regions WLC (see FIG. 2A) may be formed to pass through the plurality of insulating films 132 and the plurality of sacrificial insulating films 134, and the plurality of sacrificial insulating films 134 may be respectively replaced by the plurality of gate lines 130 through the plurality of word line cut regions WLC (see FIG. 2A).

In some example embodiments, to replace the plurality of sacrificial insulating films 134 with the plurality of gate lines 130, each empty space between the plurality of insulating films 132 may be provided by selectively removing the plurality of sacrificial insulating films 134 exposed by the plurality of word line cut regions WLC (see FIG. 2A), and then, the plurality of gate lines 130 may be formed by filling each empty space with a conductive material. Next, as shown in FIG. 2A, the inside of each of the plurality of word line cut regions WLC may be filled with the word line cut structure 192.

Next, the first upper insulating film 193 covering the conductive pad 190 and the intermediate insulating film 187, the bit line contact pad 194 passing through the first upper insulating film 193 and connected to the conductive pad 190, the second upper insulating film 195, and the bit line BL passing through the second upper insulating film 195 and connected to the bit line contact pad 194 may be formed.

Next, as shown in FIG. 2B, the wiring structure MS, the plurality of first bonding metal pads 178A, and the interlayer dielectric 150 that fills spaces therebetween may be formed on the bit line BL, the wiring structure MS including a plurality of first upper wiring layers 172, a plurality of second upper wiring layers 174, and a plurality of third upper wiring layers 176.

The peripheral circuit structure PCS shown in FIG. 2B may be formed, and the plurality of bonding structures BS may be formed by respectively bonding the plurality of first bonding metal pads 178A of the cell array structure CAS to the plurality of second bonding metal pads 178B of the peripheral circuit structure PCS, thereby bonding the cell array structure CAS onto the peripheral circuit structure PCS.

In some example embodiments, the plurality of first bonding metal pads 178A may be directly bonded to the plurality of second bonding metal pads 178B by pressurization to each other with no separate adhesive layer, respectively. For example, while facing each other, the plurality of first bonding metal pads 178A and the plurality of second bonding metal pads 178B may be pressurized in a direction making both of them closer to each other to form atomic-level bonds, thereby forming the bonding structure BS (see FIG. 2B). In some example embodiments, before the plurality of first bonding metal pads 178A are respectively bonded to the plurality of second bonding metal pads 178B, to improve the adhesion of each thereof, a process of surface-treating, with hydrogen plasma, a surface at which the plurality of first bonding metal pads 178A are exposed, and a surface at which the plurality of second bonding metal pads 178B are exposed may be further performed.

Figure 11H:
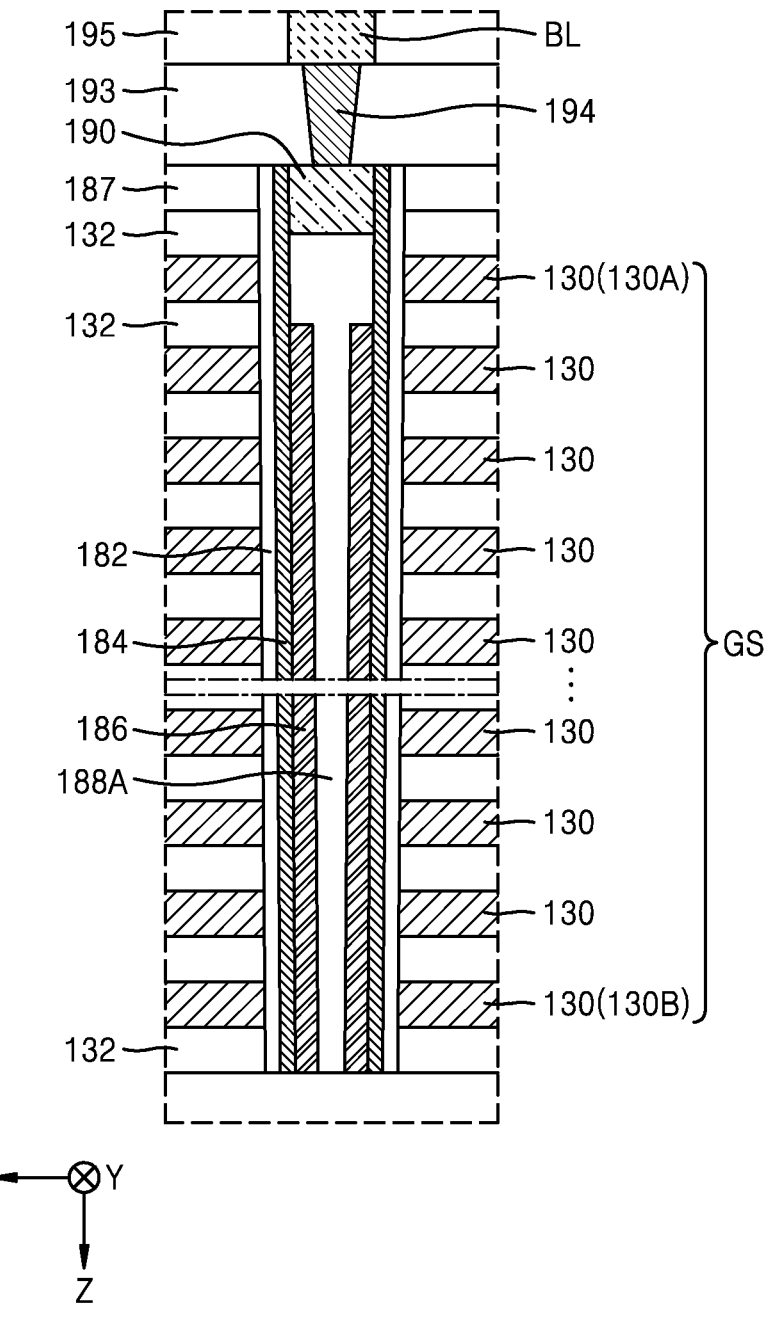

Referring to FIG. 11H, a resulting product, which is obtained by removing the sacrificial substrate 510 from the cell array structure CAS, may be planarized, thereby exposing the insulating film 132, the gate dielectric film 182, the channel region 184, the variable resistance pattern 186, and the first insulating pattern 188A, in the cell array structure CAS.

Figure 11I:
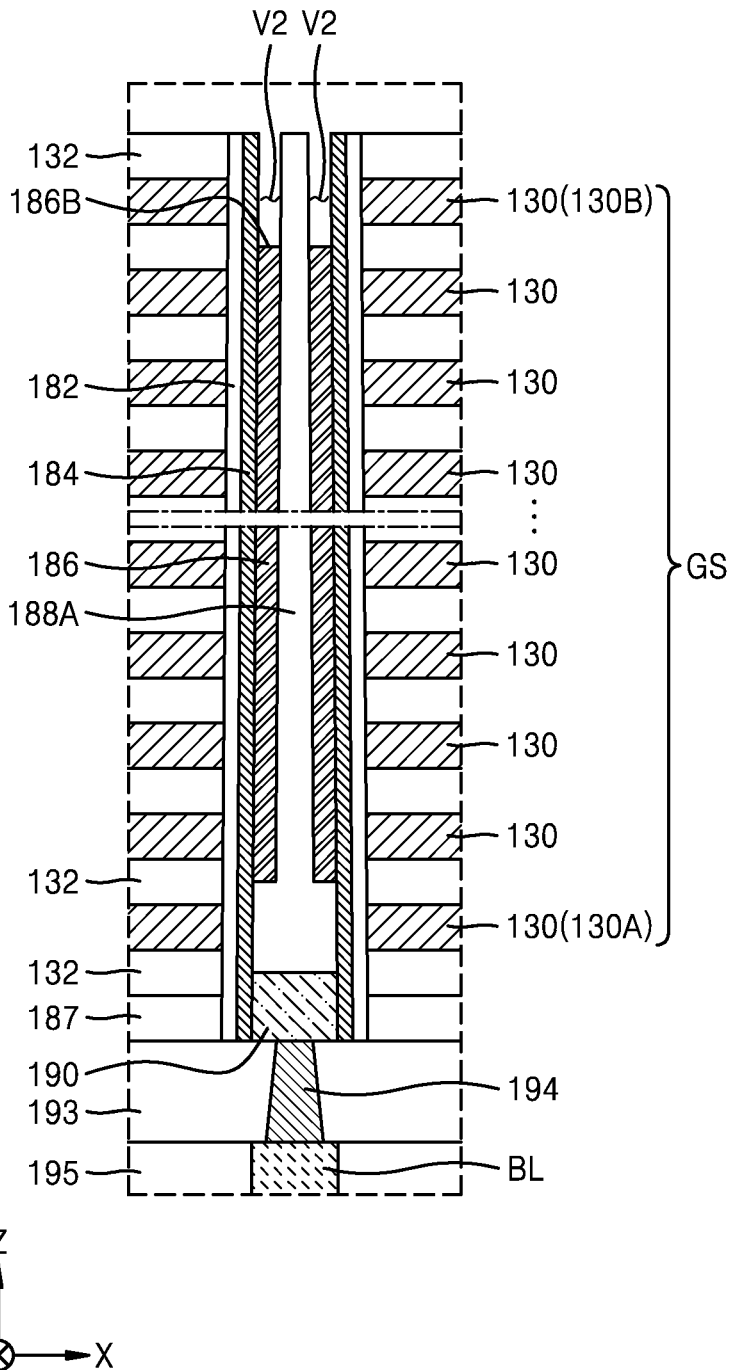

Referring to FIG. 11I, the variable resistance pattern 186 may be partially removed from the exposed surface thereof. As a result, a space V2, which is defined by the channel region 184, the first insulating pattern 188A, and the second end 186B of the variable resistance pattern 186, may be provided. The second end 186B of the variable resistance pattern 186 and the space V2 may have a ring shape surrounding an end of the first insulating pattern 188A, when viewed in a plane (for example, the X-Y plane). The second select gate line 130B may face the space V2 in the horizontal direction.

Figure 11J:
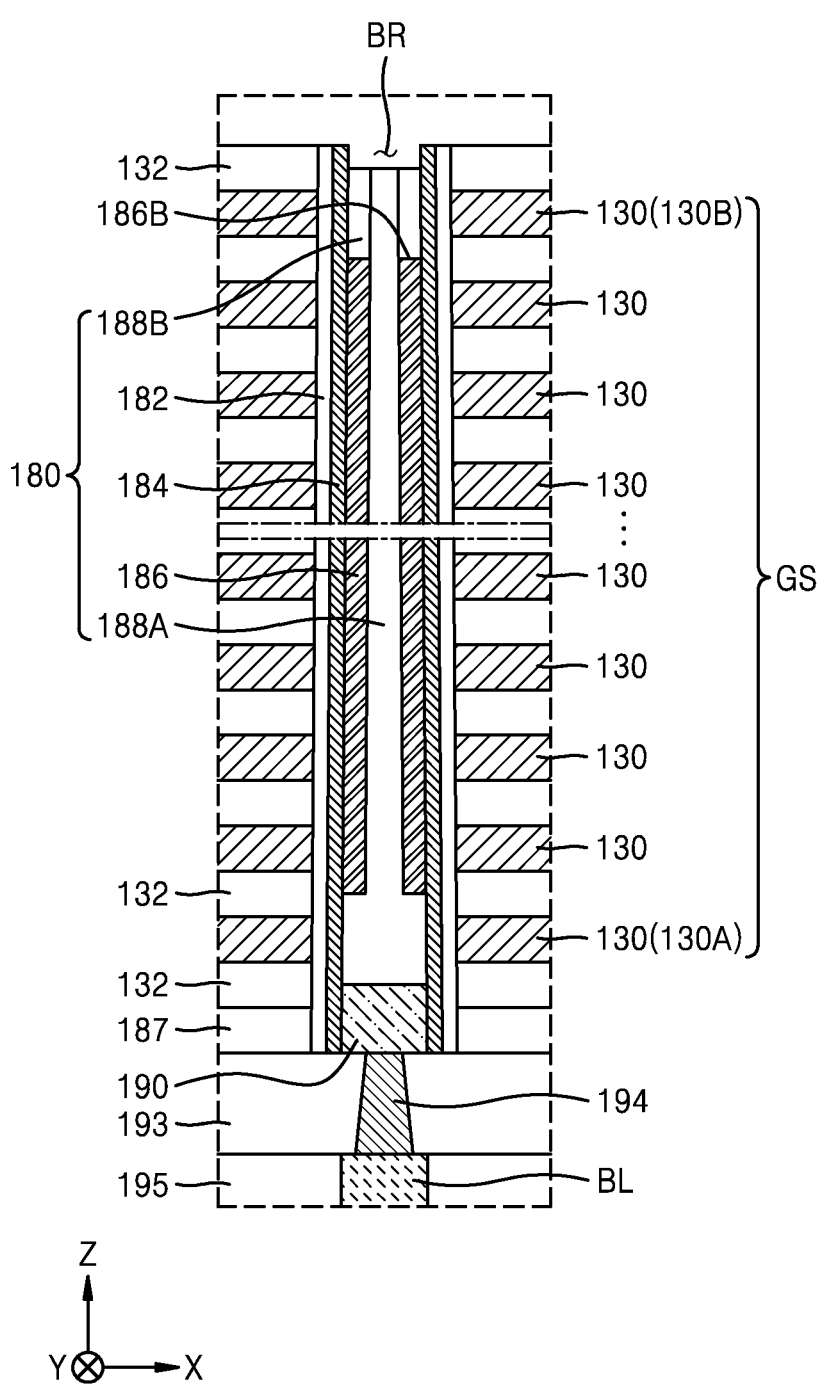

Referring to FIG. 11J, in a resulting product of FIG. 11I, the second insulating pattern 188B may be formed to fill the space V2, and each of the first insulating pattern 188A and the second insulating pattern 188B may be partially removed, thereby forming a recess region BR to expose the inner sidewall of the channel region 184.

Figure 11K:
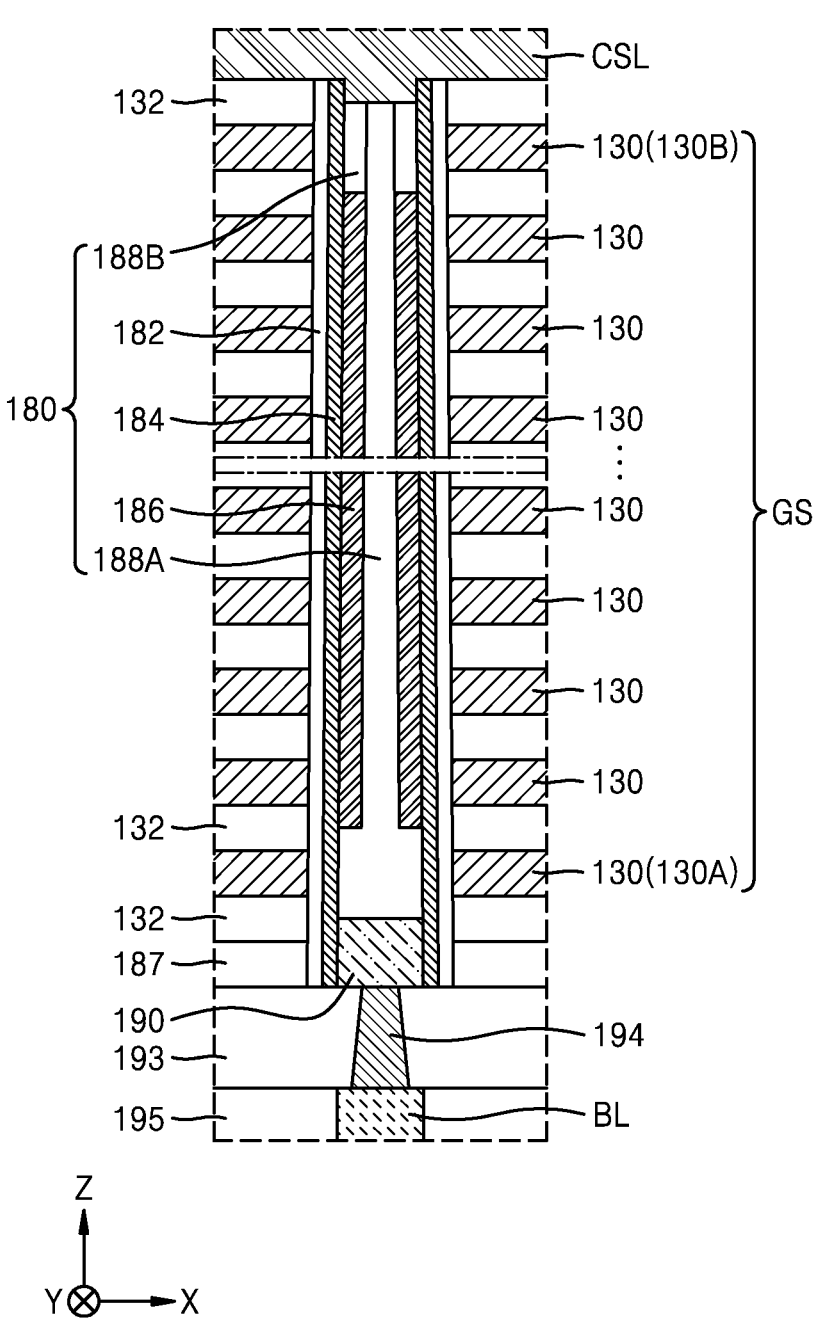

Referring to FIG. 11K, in a resulting product of FIG. 11J, the common source line CSL may be formed to fill the recess region BR and contact the channel region 184. Next, as shown in FIG. 2B, the insulating film 106 may be formed to cover the common source line CSL, thereby fabricating the semiconductor device 100 shown in FIGS. 2A to 2C.

Figure 12A:
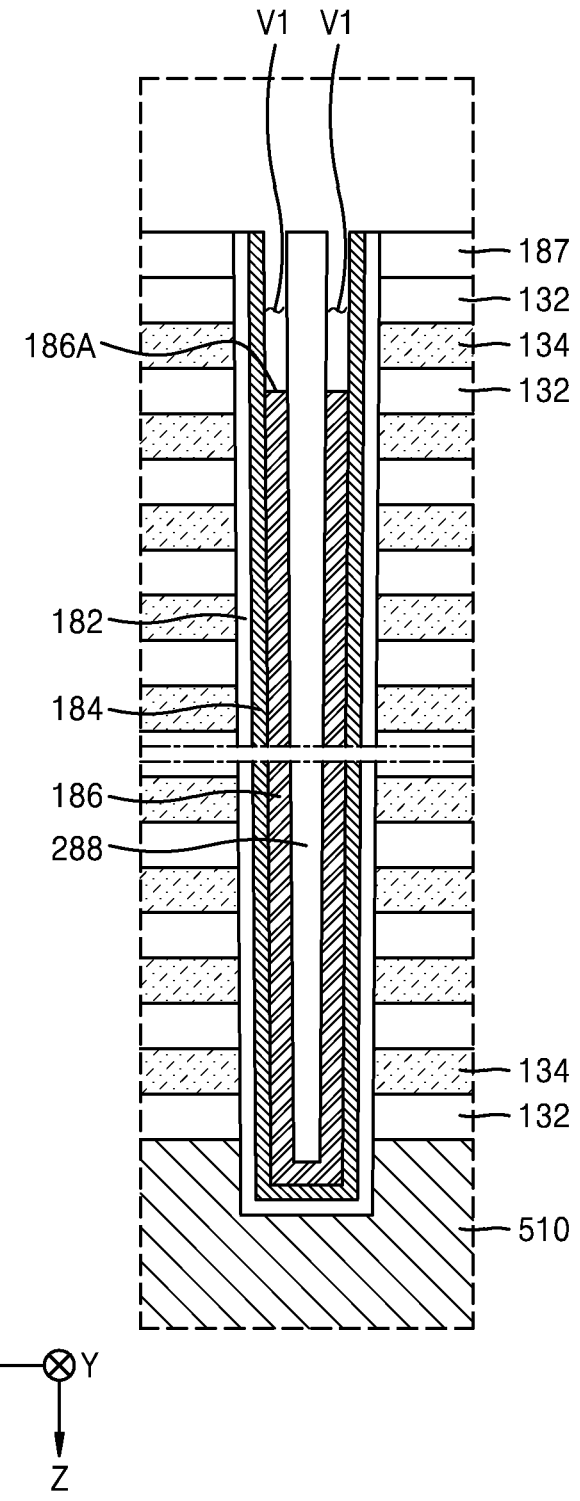
FIGS. 12A, 12B and 12C are respectively cross-sectional views illustrating a method of fabricating a semiconductor device, according to some example embodiments.
Figure 12B:
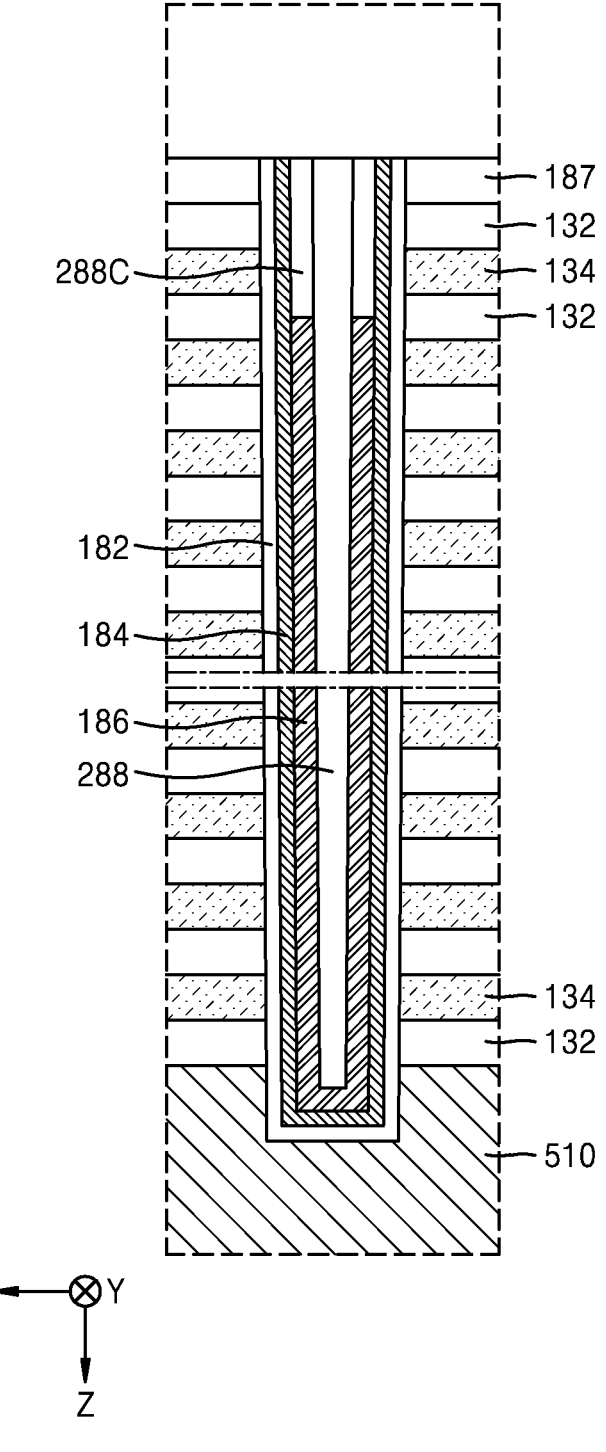
Figure 12C:
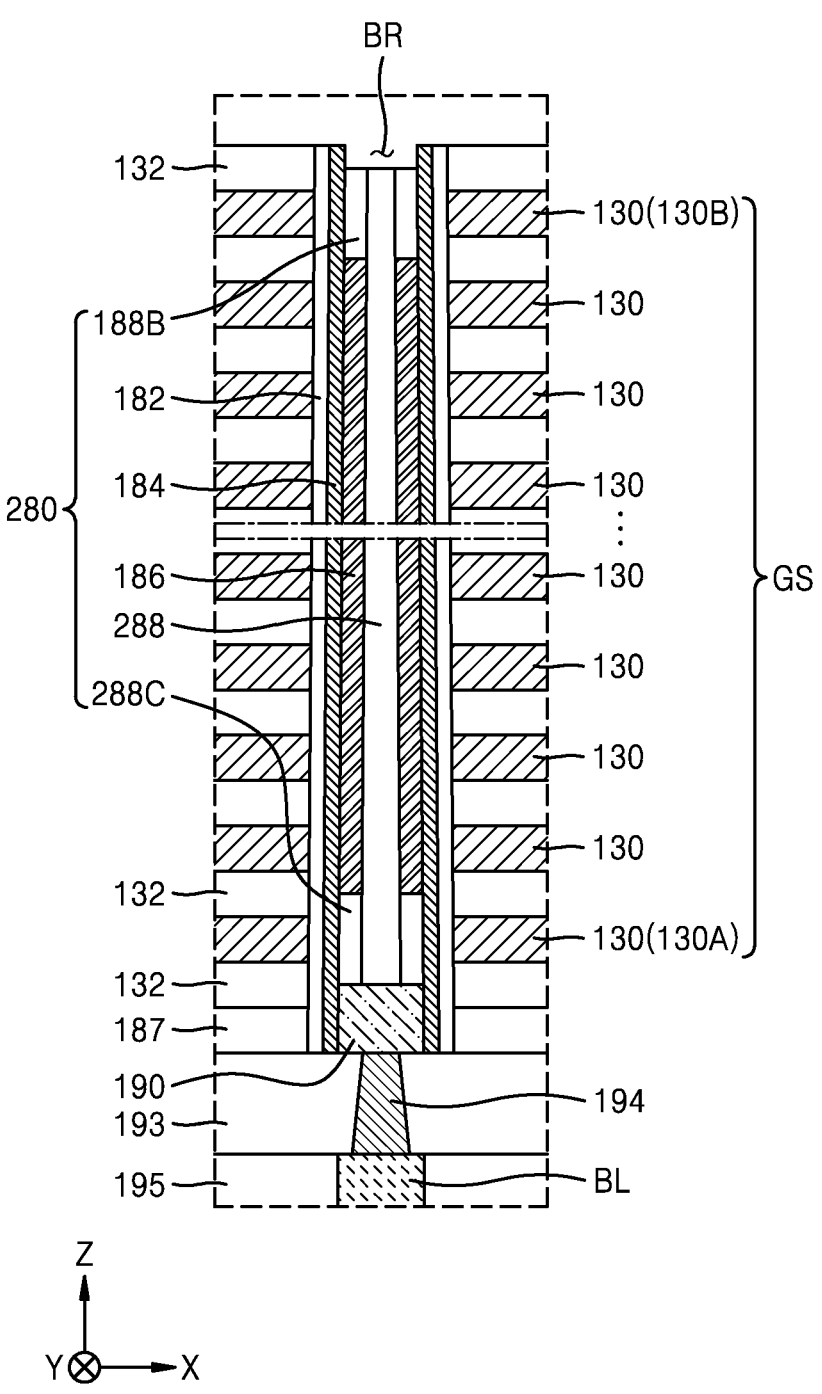

FIGS. 12A to 12C are cross-sectional views illustrating a method of fabricating a semiconductor device, according to some example embodiments. An example of a method of fabricating the semiconductor device 200 shown in FIG. 3 is described with reference to FIGS. 12A to 12C. FIGS. 12A to 12C illustrate enlarged cross-sectional configurations corresponding to the region EX1 of FIG. 2B according to a sequence of processes, respectively. In FIGS. 12A to 12C, the same reference numerals as in FIGS. 2A to 2C and 3 respectively denote the same members, and here, repeated descriptions thereof are omitted.

Referring to FIG. 12A, processes similar to those described with reference to FIGS. 11A to 11D may be performed. However, in the present example, the first insulating pattern 288, instead of the sacrificial layer SCL, may be formed. The space V1, which is defined by the first end 186A of the variable resistance pattern 186, the channel region 184, and the first insulating pattern 288, may have a ring shape surrounding an end of the first insulating pattern 288, when viewed in a plane (for example, the X-Y plane).

Referring to FIG. 12B, in a resulting product of FIG. 12A, the third insulating pattern 288C may be formed to fill the space V1.

Referring to FIG. 12C, in a resulting product of FIG. 12B, a recess space may be formed by partially removing the first insulating pattern 288 and the third insulating pattern 288C from respective exposed surfaces thereof, and then, the conductive pad 190 may be formed to fill the recess space.

Next, the processes described with reference to FIGS. 11G to 11J may be performed on a resulting product that is obtained, and each of the first insulating pattern 288 and the second insulating pattern 188B may be partially removed, thereby forming the recess region BR to expose the inner sidewall of the channel region 184. Next, the processes described with reference to FIG. 11K may be performed, thereby fabricating the semiconductor device 200 shown in FIG. 3.

Figure 13A:
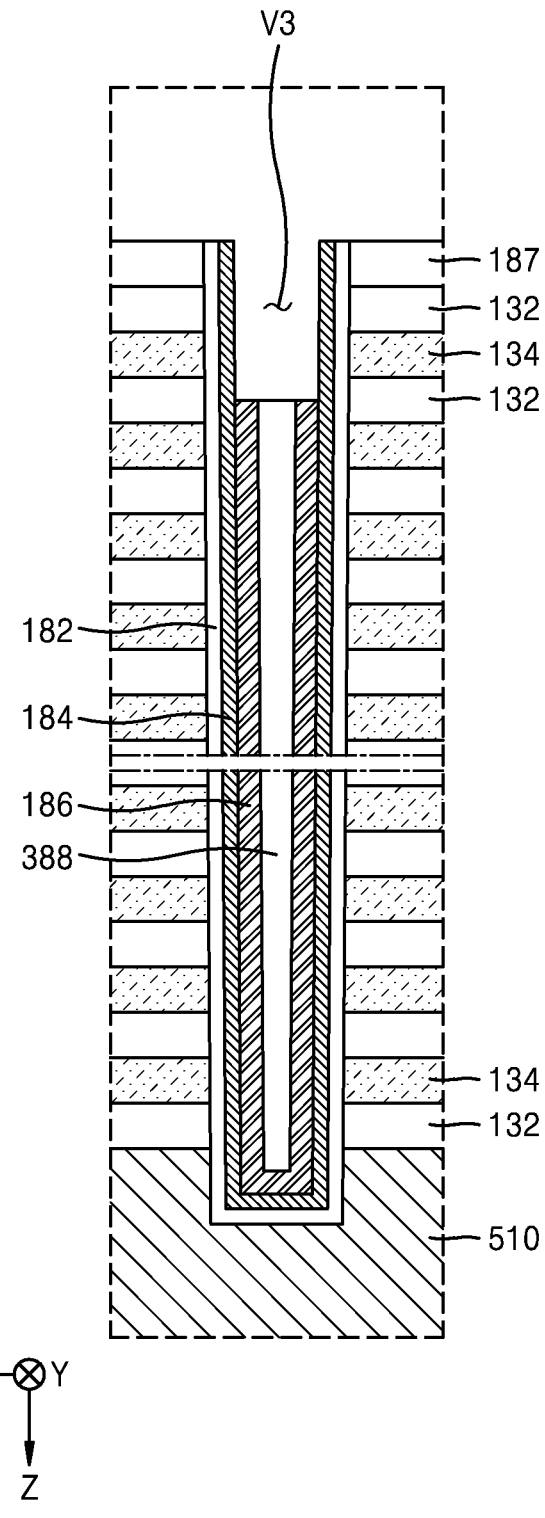
FIGS. 13A, 13B and 13C are respectively cross-sectional views illustrating a method of fabricating a semiconductor device, according to some example embodiments.
Figure 13B:
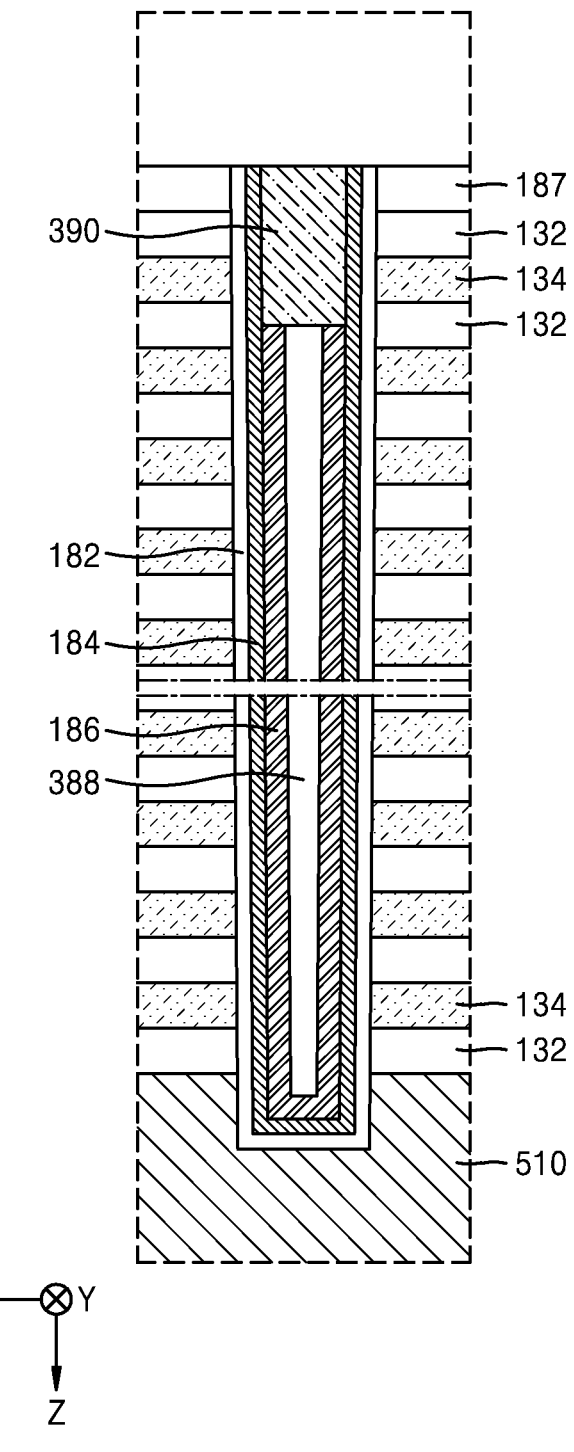
Figure 13C:
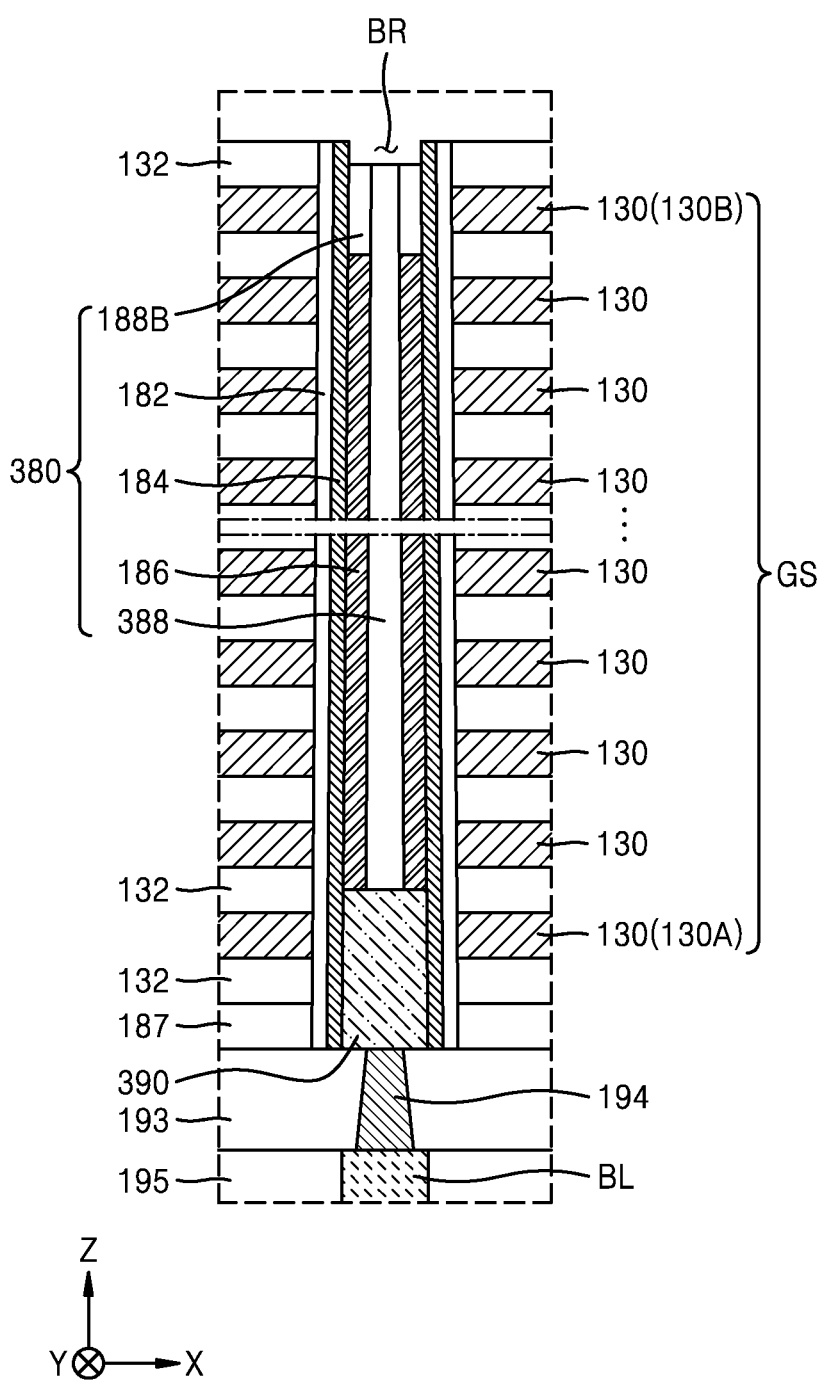

FIGS. 13A to 13C are cross-sectional views illustrating a method of fabricating a semiconductor device, according to some example embodiments. An example of a method of fabricating the semiconductor device 300 shown in FIG. 4 is described with reference to FIGS. 13A to 13C. FIGS. 13A to 13C illustrate enlarged cross-sectional configurations corresponding to the region EX1 of FIG. 2B according to a sequence of processes, respectively. In FIGS. 13A to 13C, the same reference numerals as in FIGS. 2A to 2C and 4 respectively denote the same members, and here, repeated descriptions thereof are omitted.

Referring to FIG. 13A, processes similar to those described with reference to FIG. 12A may be performed. Next, a portion of the first insulating pattern 288 shown in FIG. 12A that protrudes past the first end 186A of the variable resistance pattern 186 may be removed, thereby forming the first insulating pattern 388 from the first insulating pattern 288. As a result, the first end 186A of the variable resistance pattern 186 and an upper surface of the first insulating pattern 388 may extend on approximately the same plane, and a space V3, which is defined by the first end 186A of the variable resistance pattern 186, the first insulating pattern 388, and the inner sidewall of the channel region 184, may be provided.

Referring to FIG. 13B, in a resulting product of FIG. 13A, the conductive pad 390 may be formed to fill the space V3.

Referring to FIG. 13C, the processes described with reference to FIGS. 11G to 11J may be performed on a resulting product of FIG. 13B, and each of the first insulating pattern 388 and the second insulating pattern 188B may be partially removed, thereby forming the recess region BR to expose the inner sidewall of the channel region 184. Next, the processes described with reference to FIG. 11K may be performed, thereby fabricating the semiconductor device 300 shown in FIG. 4.

To fabricate the semiconductor device 300A shown in FIG. 5A, processes similar to those described with reference to FIGS. 13A to 13C may be performed. However, in the process described with reference to FIG. 13A, by removing the portion of the first insulating pattern 288 shown in FIG. 12A that protrudes past the first end 186A of the variable resistance pattern 186, the first insulating pattern 388A shown in FIG. 5A may be formed from the first insulating pattern 288, and the conductive pad 390A, which has the protrusion 390P contacting the first insulating pattern 388A and a surface contacting the first end 186A of the variable resistance pattern 186, may be formed. Next, the processes described with reference to FIG. 13C may be performed.

To fabricate the semiconductor device 300B shown in FIG. 5B, processes similar to those described with reference to FIGS. 13A to 13C may be performed. However, in the process described with reference to FIG. 13A, by removing the portion of the first insulating pattern 288 shown in FIG. 12A that protrudes past the first end 186A of the variable resistance pattern 186, the first insulating pattern 388B including the protrusion 388P as shown in FIG. 5B may be formed from the first insulating pattern 288. Next, the conductive pad 390B may be formed to contact the protrusion 388P of the first insulating pattern 388B and the first end 186A of the variable resistance pattern 186. Next, the processes described with reference to FIG. 13C may be performed.

Figure 14:
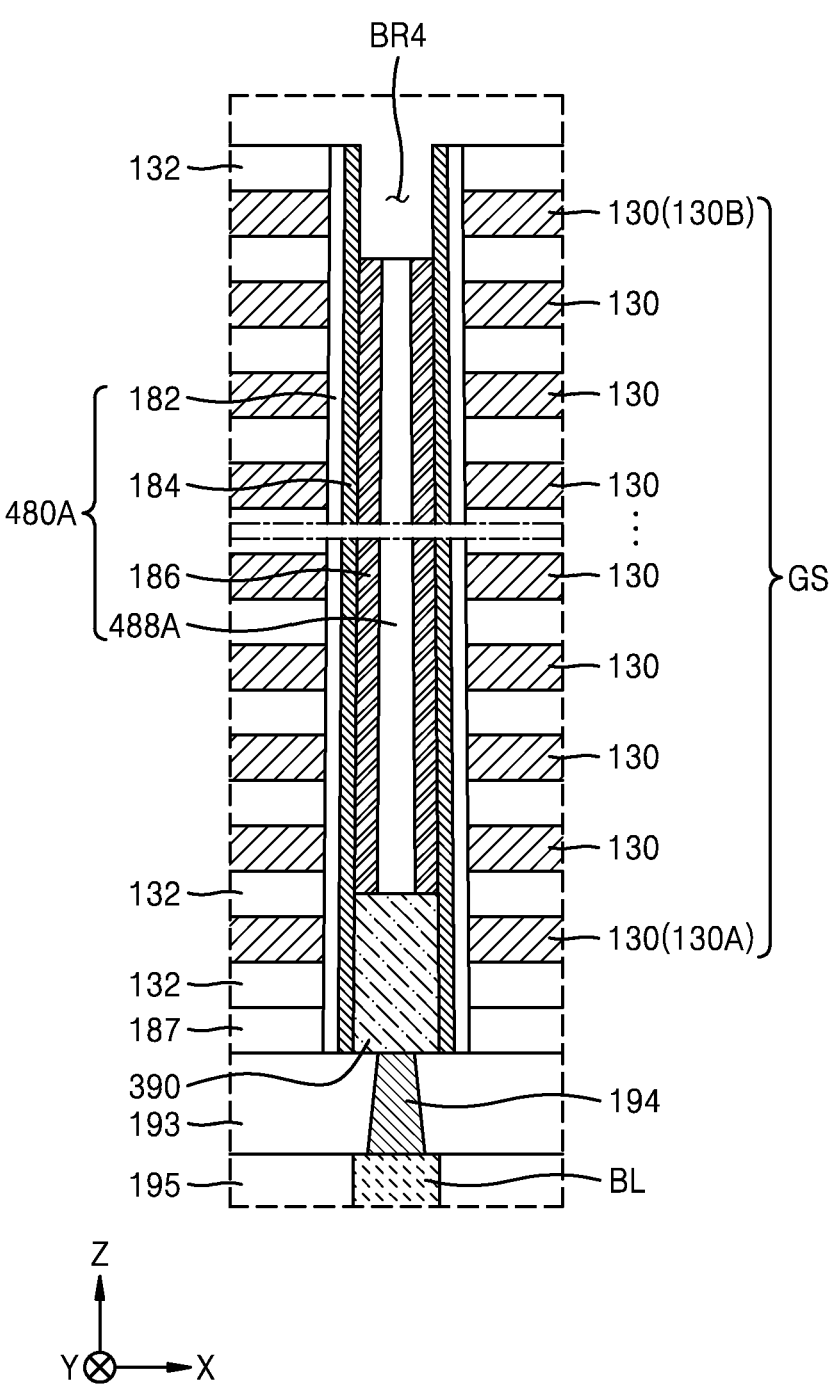
FIG. 14 is a cross-sectional view illustrating a method of fabricating a semiconductor device, according to some example embodiments.

FIG. 14 is a cross-sectional view illustrating a method of fabricating a semiconductor device, according to some example embodiments. An example of a method of fabricating the semiconductor device 400A shown in FIG. 6A is described with reference to FIG. 14. FIG. 14 illustrates an enlarged cross-sectional configuration corresponding to the region EX1 of FIG. 2B according to a sequence of processes. In FIG. 14, the same reference numerals as in FIGS. 2A to 2C and 6A respectively denote the same members, and here, repeated descriptions thereof are omitted.

Referring to FIG. 14, processes similar to those described with reference to FIGS. 13A and 13B may be performed. Next, processes similar to those described with reference to FIGS. 11G to 11I may be performed on a resulting product of FIG. 13B, and the first insulating pattern 388 may be partially removed, thereby forming the first insulating pattern 488A and forming a recess region BR4 to expose the inner sidewall of the channel region 184. Next, the common source line CSL4A may be formed to fill the recess region BR4, thereby fabricating the semiconductor device 400A shown in FIG. 6A.

To fabricate the semiconductor device 300A shown in FIG. 7A, processes similar to those described with reference to FIGS. 12A to 12C may be performed. However, the process of forming the third insulating pattern 288C, which is described with reference to FIG. 12B, may be omitted, a recess space, which is connected to the space V1, may be formed by partially removing the first insulating pattern 288 while the space V1 exposing the first end 186A of the variable resistance pattern 186 is empty, and then, the conductive pad 590 may be formed to fill the recess space. After the conductive pad 590 is formed, a portion of the space V1, which is defined by the conductive pad 590, may remain as the first air gap AG1.

To fabricate the semiconductor device 300B shown in FIG. 7B, processes similar to those described with reference to FIGS. 11A to 11K may be performed. However, the process of forming the second insulating pattern 188B, which is described with reference to FIG. 11J, may be omitted, a recess space, which is connected to the space V2, may be formed by partially removing the first insulating pattern 188A while the space V2 exposing the second end 186B of the variable resistance pattern 186 is empty, and then, the common source line CSL5 may be formed to fill the recess space. After the common source line CSL5 is formed, a portion of the space V2, which is defined by the common source line CSL5, may remain as the second air gap AG2.

To fabricate the semiconductor device 300C shown in FIG. 7C, the aforementioned method of fabricating the semiconductor device 300A shown in FIG. 7A may be combined with the aforementioned method of fabricating the semiconductor device 300B shown in FIG. 7B.

Heretofore, although the examples of the methods of fabricating the semiconductor devices, according to some example embodiments, have been described with reference to FIGS. 11A to 14, it will be understood by those of ordinary skill in the art that semiconductor devices having various structures obtained by making various modifications and changes to the examples described with reference to FIGS. 11A to 14 without departing from the spirit and scope of the present disclosure may be fabricated.

Figure 15:
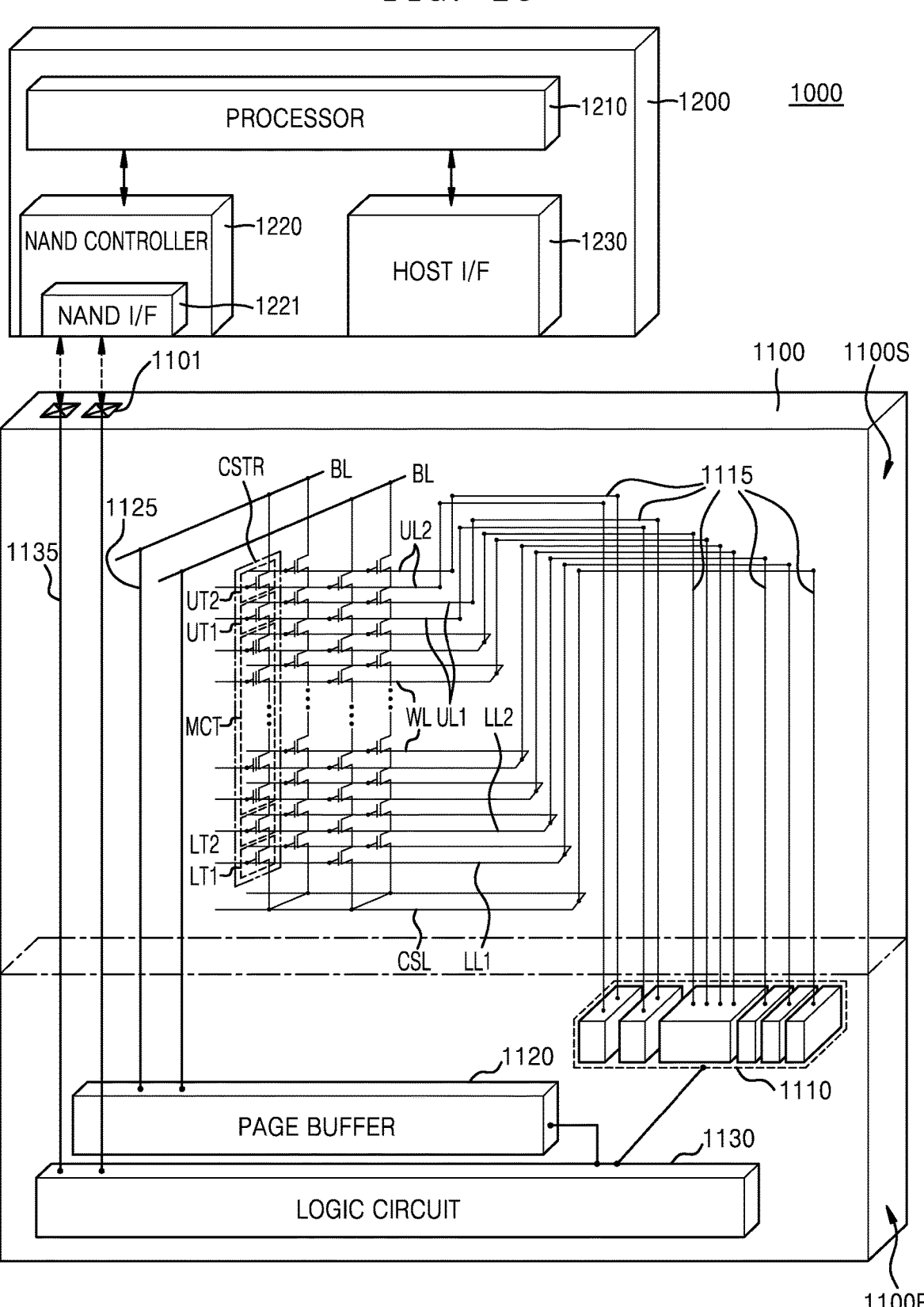
FIG. 15 is a diagram schematically illustrating an electronic system including a semiconductor device according to an example embodiment.

FIG. 15 is a diagram schematically illustrating an electronic system including a semiconductor device according to an example embodiment.

Referring to FIG. 15, an electronic system 1000 according to an example embodiment may include a semiconductor device 1100 and a controller 1200 electrically connected to the semiconductor device 1100. The electronic system 1000 may include a storage device including one semiconductor device 1100 or a plurality of semiconductor devices 1100, or may include an electronic device including the storage device. For example, the electronic system 1000 may include a solid-state drive (SSD) device, a universal serial bus (USB), a computing system, a medical device, or a communication device, which includes at least one semiconductor device 1100.

The semiconductor device 1100 may include a nonvolatile memory device. For example, the semiconductor device 1100 may include a NAND flash memory device including at least one of the structures of the semiconductor devices 100, 200, 300, 300A, 300B, 400A, 400B, 400C, 500A, 500B, 500C, 600, 700, 800A, 800B, and 800C described with reference to FIGS. 2A to 10C. The semiconductor device 1100 may include a first structure 1100F and a second structure 1100S on the first structure 1100F. In some example embodiments, the first structure 1100F may be arranged beside the second structure 1100S. The first structure 1100F may include a peripheral circuit structure, which includes a decoder circuit 1110, a page buffer 1120, and a logic circuit 1130. The second structure 1100S may include a memory cell structure, which includes the bit line BL, the common source line CSL, the plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The respective numbers of lower transistors LT1 and LT2 and upper transistors UT1 and UT2 may be variously modified depending upon example embodiments.

In some example embodiments, the upper transistors UT1 and UT2 may include a string select transistor, and the lower transistors LT1 and LT2 may include a ground select transistor. A plurality of gate lower lines LL1 and LL2 may be gate electrodes of the lower transistors LT1 and LT2, respectively. The word line WL may be a gate electrode of a memory cell transistor MCT, and the gate upper lines UL1 and UL2 may be gate electrodes of the upper transistors UT1 and UT2, respectively.

The common source line CSL, the plurality of gate upper lines LL1 and LL2, the plurality of word lines WL, and the plurality of gate upper lines UL1 and UL2 may be electrically connected to the decoder circuit 1110 via a plurality of first connection wiring lines 1115, which extend from inside the first structure 1100F to the second structure 1100S. The plurality of bit lines BL may be electrically connected to the page buffer 1120 via a plurality of second connection wiring lines 1125, which extend from inside the first structure 1100F to the second structure 1100S.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 via an input/output pad 1101 that is electrically connected to the logic circuit 1130. The input/output pad 1101 may be electrically connected to the logic circuit 1130 via an input/output connection wiring line 1135, which extends from inside the first structure 1100F to the second structure 1100S.

The controller 1200 may include a processor 1210, a NAND controller 1220, and a host interface 1230. Depending upon example embodiments, the electronic system 1000 may include a plurality of semiconductor devices 1100, and in this case, the controller 1200 may control the plurality of semiconductor devices 1100.

The processor 1210 may control overall operations of the electronic system 1000 including the controller 1200. The processor 1210 may be operated according to certain firmware and may access the semiconductor device 1100 by controlling the NAND controller 1220. The NAND controller 1220 may include a NAND interface 1221 for processing communication with the semiconductor device 1100. Via the NAND interface 1221, a control command for controlling the semiconductor device 1100, data intended to be written to the plurality of memory cell transistors MCT of the semiconductor device 1100, data intended to be read from the plurality of memory cell transistors MCT of the semiconductor device 1100, and the like may be transmitted. The host interface 1230 may provide a function of communication between the electronic system 1000 and an external host. When receiving a control command from the external host via the host interface 1230, the processor 1210 may control the semiconductor device 1100 in response to the control command.

Figure 16:
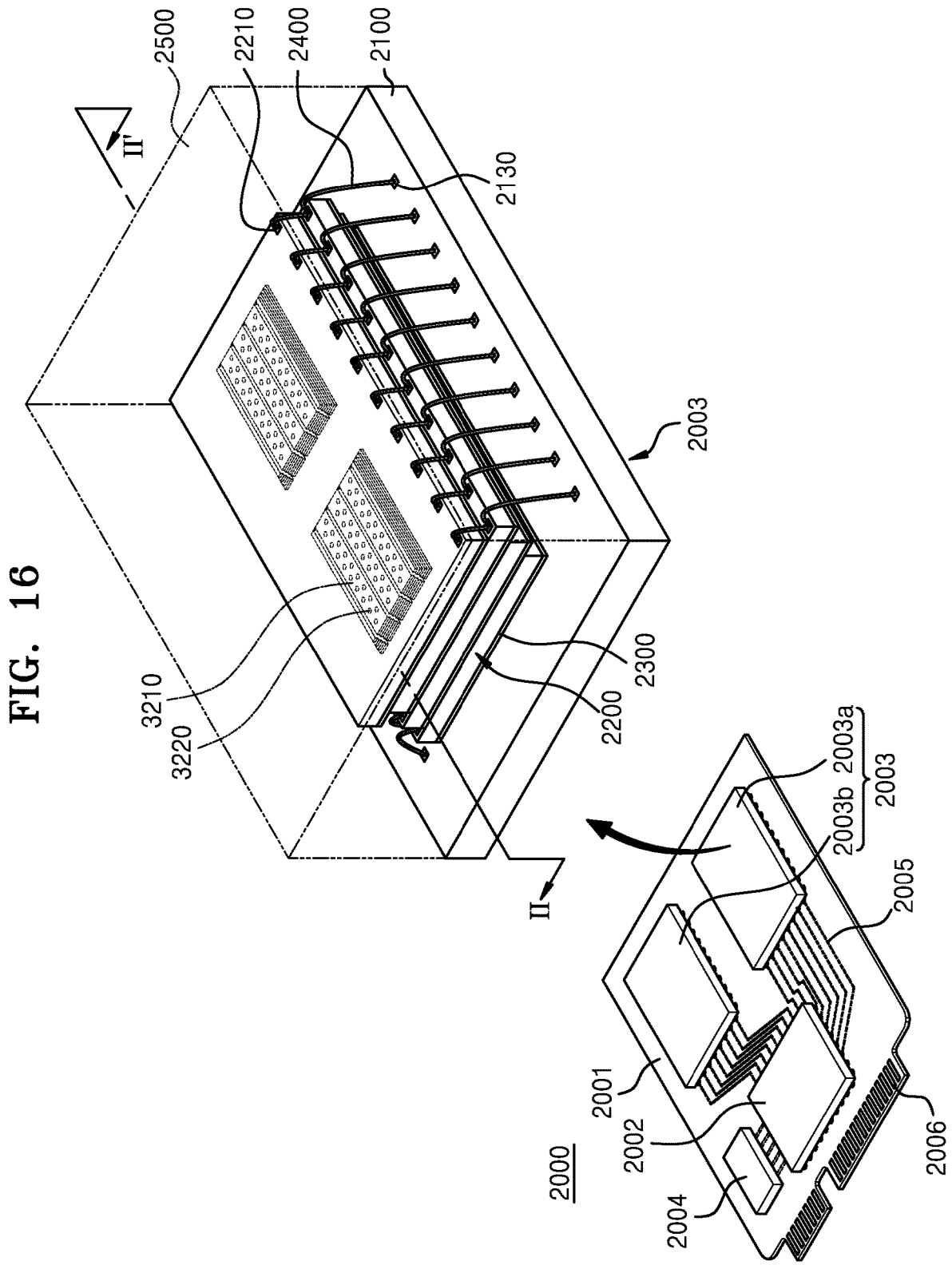
FIG. 16 is a perspective view schematically illustrating an electronic system including a semiconductor device according to an example embodiment.

FIG. 16 is a perspective view schematically illustrating an electronic system including a semiconductor device, according to an example embodiment.

Referring to FIG. 16, an electronic system 2000 according to an example embodiment may include a main substrate 2001, a controller 2002 mounted on the main substrate 2001, one or more semiconductor packages 2003, and DRAM 2004. The semiconductor packages 2003 and the DRAM 2004 may be connected to the controller 2002 by a plurality of wiring patterns 2005 formed on the main substrate 2001.

The main substrate 2001 may include a connector 2006 including a plurality of pins to be coupled to an external host. The number of pins and the arrangement of the plurality of pins, in the connector 2006, may vary depending upon a communication interface between the electronic system 2000 and the external host. In some example embodiments, the electronic system 2000 may communicate with the external host according to one of interfaces, such as Universal Serial Bus (USB), Peripheral Component Interconnect Express (PCI-Express), Serial Advanced Technology Attachment (SATA), and M-Phy for Universal Flash Storage (UFS). In some example embodiments, the electronic system 2000 may be operated by power supplied from the external host via the connector 2006. The electronic system 2000 may further include a power management integrated circuit (PMIC) distributing the power, which is supplied from the external host, to the controller 2002 and the semiconductor packages 2003.

The controller 2002 may write data to or read data from the semiconductor packages 2003 and may improve an operation speed of the electronic system 2000.

The DRAM 2004 may be a buffer memory for alleviating a speed difference between the external host and the semiconductor packages 2003, which are data storage spaces. The DRAM 2004 in the electronic system 2000 may operate as a cache memory and may provide a space for temporarily storing data in a control operation on the semiconductor packages 2003. The controller 2002 may further include a DRAM controller for controlling the DRAM 2004, in addition to a NAND controller for controlling the semiconductor packages 2003.

The semiconductor packages 2003 may include first and second semiconductor packages 2003a and 2003b, which are apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 arranged on the package substrate 2100 to cover the plurality of semiconductor chips 2200 and the connection structure 2400.

The package substrate 2100 may include a printed circuit board including a plurality of package upper pads 2130. Each of the plurality of semiconductor chips 2200 may include an input/output pad 2210. The input/output pad 2210 may correspond to the input/output pad 1101 of FIG. 15. Each of the plurality of semiconductor chips 2200 may include a plurality of gate stacks 3210 and a plurality of channel structures 3220. Each of the plurality of semiconductor chips 2200 may include at least one of the structures of the semiconductor devices 100, 200, 300, 300A, 300B, 400A, 400B, 400C, 500A, 500B, 500C, 600, 700, 800A, 800B, and 800C described with reference to FIGS. 2A to 10C.

In some example embodiments, the connection structure 2400 may include a bonding wire electrically connecting the input/output pad 2210 to a package upper pad 2130. Accordingly, in the first and second semiconductor packages 2003a and 2003b, the plurality of semiconductor chips 2200 may be electrically connected to each other in a bonding wire manner and may be electrically connected to the package upper pads 2130 of the package substrate 2100. In some example embodiments, in the first and second semiconductor packages 2003a and 2003b, the plurality of semiconductor chips 2200 may be electrically connected to each other by a connection structure including a through-silicon via (TSV) rather than by the connection structure 2400 of a bonding wire type.

In some example embodiments, the controller 2002 and the plurality of semiconductor chips 2200 may be included in one package. In some example embodiments, the controller 2002 and the plurality of semiconductor chips 2200 may be mounted on a separate interposer substrate, which is different from the main substrate 2001, and may be connected to each other by wiring lines formed on the interposer substrate.

Figure 17:
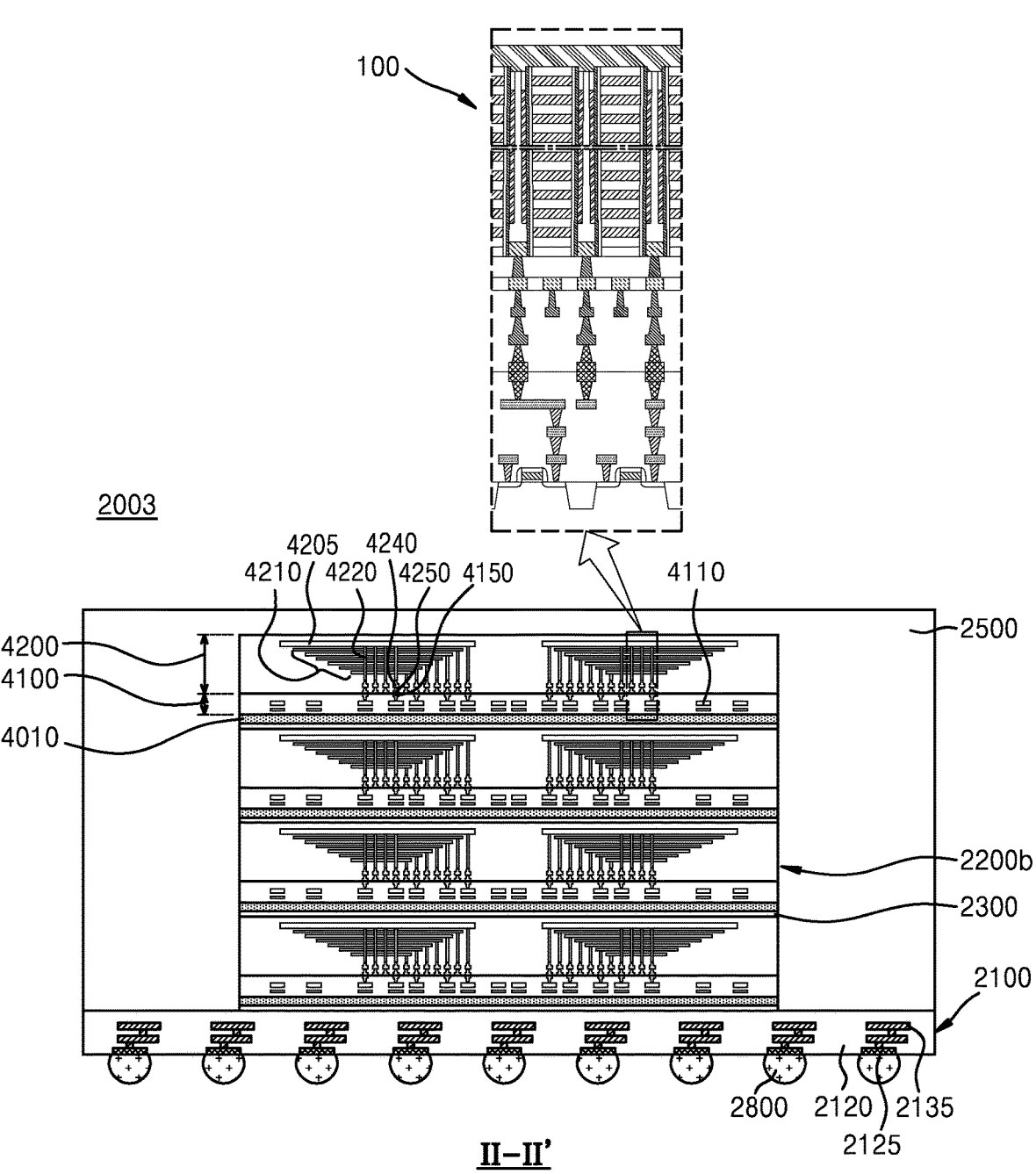
FIG. 17 is a cross-sectional view schematically illustrating semiconductor packages according to an example embodiment.

FIG. 17 is a cross-sectional view schematically illustrating semiconductor packages according to an example embodiment. FIG. 17 illustrates a configuration corresponding to a cross-section taken along a line II-IF of FIG. 16, in more detail.

Referring to FIG. 17, in the semiconductor package 2003, semiconductor chips 2200b may each include a semiconductor substrate 4010, a first structure 4100 on the semiconductor substrate 4010, and a second structure 4200 arranged on the first structure 4100 to be bonded to the first structure 4100 in a wafer bonding manner.

The first structure 4100 may include a peripheral circuit area including a peripheral wiring line 4110 and first bonding structures 4150. The second structure 4200 may include a common source line 4205, a gate stack structure 4210 between the common source line 4205 and the first structure 4100, memory channel structures 4220 passing through the gate stack structures 4210, and second bonding structures 4250 respectively and electrically connected to the memory channel structures 4220 and the word lines WL (see FIG. 15) of the gate stack structure 4210. For example, the second bonding structures 4250 may be respectively and electrically connected to the memory channel structures 4220 and the word lines WL (see FIG. 15) via bit lines 4240, which are electrically connected to the memory channel structures 4220, and gate connection wiring lines electrically connected to the word lines WL (see FIG. 15). The first bonding structures 4150 of the first structure 4100 may be brought into contact with and bonded to the second bonding structures 4250 of the second structure 4200, respectively. Bonded portions of the first bonding structures 4150 and the second bonding structures 4250 may include, for example, copper (Cu).

Each of the semiconductor chips 2200b may further include the input/output pad 2210 (see FIG. 16) that is electrically connected to peripheral wiring lines 4110 of the first structure 4100.

Electrical connections between the semiconductor chips 2200 of FIG. 16 as well as electrical connections between the semiconductor chips 2200b of FIG. 17 may be made by the connection structures 2400 of a bonding wire type. However, in some example embodiments, semiconductor chips in one semiconductor package, such as the semiconductor chips 2200 of FIG. 16 and the semiconductor chips 2200b of FIG. 17, may be electrically connected to each other by a connection structure including a TSV.

While aspects of example embodiments have been particularly shown and described, it will be understood that various changes in form and details may be made therein without departing from the spirit and scope of the following claims.

What is claimed is:

1. A semiconductor device comprising:
a conductive layer;
a conductive pad spaced apart from the conductive layer in a vertical direction;
a plurality of gate lines spaced apart from each other in the vertical direction between the conductive layer and the conductive pad; and
a channel structure extending in the vertical direction through the plurality of gate lines,
wherein the channel structure comprises:
a channel region which defines a columnar space, and comprises a first channel end in contact with the conductive pad and a second channel end in contact with the conductive layer; and
a variable resistance pattern comprising an outer sidewall and a first end, the outer sidewall overlapping a plurality of first gate lines, from among the plurality of gate lines, in a horizontal direction with the channel region therebetween, the first end being spaced apart from the first channel end of the channel region in the vertical direction, and the variable resistance pattern being offset from, in the vertical direction, at least one second gate line that is closest, from among the plurality of gate lines, to the conductive pad.

2. The semiconductor device of claim 1, further comprising an insulating structure provided in the columnar space and surrounded by the variable resistance pattern,

wherein the variable resistance pattern is in contact with a first inner surface of the channel region and is spaced apart from the first channel end of the channel region, in the columnar space, and
wherein the insulating structure is in contact with a second inner surface of the channel region between the first inner surface and the first channel end of the channel region, in the columnar space, and overlaps the at least one second gate line in the horizontal direction with the channel region therebetween.

3. The semiconductor device of claim 1, wherein the outer sidewall of the variable resistance pattern is in contact with a first inner surface of the channel region, which is spaced apart from the first channel end of the channel region, in the columnar space,
wherein the first end of the variable resistance pattern is spaced apart from the conductive pad in the vertical direction, and
wherein the conductive pad is in contact with the first channel end of the channel region, in the columnar space.

4. The semiconductor device of claim 1, wherein the conductive pad comprises a first surface contacting the first channel end of the channel region, and a second surface contacting the first end of the variable resistance pattern, in the columnar space.

5. The semiconductor device of claim 1, further comprising an insulating structure provided in the columnar space and surrounded by the variable resistance pattern,
wherein the outer sidewall of the variable resistance pattern is in contact with a first inner surface of the channel region, which is spaced apart from the first channel end of the channel region, in the columnar space, and
wherein the conductive pad comprises a first surface contacting the first channel end of the channel region, a second surface contacting the first end of the variable resistance pattern, and a third surface contacting the insulating structure, in the columnar space.

6. The semiconductor device of claim 1, further comprising an insulating structure provided in the columnar space and surrounded by the variable resistance pattern,
wherein a first air gap is provided in the insulating structure, and exposes a portion of the channel region and a portion of the conductive pad.

7. The semiconductor device of claim 1, wherein the variable resistance pattern further comprises a second end that is spaced apart from the second channel end of the channel region in the vertical direction, and
wherein the variable resistance pattern is offset from at least one third gate line in the vertical direction, the at least one third gate line being closest to the conductive layer, from among the plurality of gate lines.

8. The semiconductor device of claim 1, further comprising an insulating structure provided in the columnar space and surrounded by the variable resistance pattern,
wherein the variable resistance pattern is in contact with a first inner surface of the channel region,
wherein the insulating structure is in contact with a third inner surface of the channel region between the first inner surface of the channel region and the second channel end of the channel region, in the columnar space, and overlaps the at least one second gate line in the horizontal direction with the channel region therebetween.

9. The semiconductor device of claim 1, wherein the outer sidewall of the variable resistance pattern is in contact with a first inner surface of the channel region, which is spaced apart from the first channel end of the channel region, in the columnar space,
    wherein a second end of the variable resistance pattern that is spaced apart from the second channel end of the channel region and the conductive layer in the vertical direction, and
    wherein the conductive layer is in contact with the second channel end of the channel region, in the columnar space.
10. The semiconductor device of claim 1, wherein the conductive layer comprises a first surface contacting the second channel end of the channel region, and a second surface contacting a second end of the variable resistance pattern that is spaced apart, along the vertical direction, from the second channel end of the channel region, in the columnar space.
11. The semiconductor device of claim 1, further comprising an insulating structure provided in the columnar space and surrounded by the variable resistance pattern,
    wherein the outer sidewall of the variable resistance pattern is in contact with a first inner surface of the channel region, which is closest to the second channel end of the channel region, in the columnar space, and
    wherein the conductive layer has a first surface contacting the second channel end of the channel region, a second surface contacting a second end of the variable resistance pattern that is spaced apart from the second channel end of the channel region along the vertical direction, and a third surface contacting the insulating structure.
12. The semiconductor device of claim 1, further comprising an insulating structure provided in the columnar space and surrounded by the variable resistance pattern,
    wherein a second air gap is provided in the insulating structure, and exposes a portion of the channel region and a portion of the conductive layer.
13. The semiconductor device of claim 1, further comprising:
    a bit line connected to the conductive pad;
    a first bonding metal pad connected to the bit line; and
    a peripheral circuit structure spaced apart from the channel structure with the bit line therebetween, the peripheral circuit structure comprising a plurality of circuits and a second bonding metal pad connected to the plurality of circuits,
    wherein the bit line is connected to at least one circuit, which is selected from among the plurality of circuits, via a bonding structure comprising the first bonding metal pad and the second bonding metal pad.
14. The semiconductor device of claim 1, further comprising a gate dielectric film between the channel region and the plurality of gate lines.
15. The semiconductor device of claim 1, further comprising an insulating structure provided in the columnar space and surrounded by the variable resistance pattern,
    wherein, in the horizontal direction, a maximum width of the insulating structure is greater than a maximum width of the variable resistance pattern.
16. A semiconductor device comprising:
    a common source line;
    a conductive pad spaced apart from the common source line in a vertical direction;
    a plurality of gate lines spaced apart from each other in the vertical direction between the common source line and the conductive pad; and

34 a channel structure extending in the vertical direction through the plurality of gate lines,
    wherein the plurality of gate lines comprise a first select gate line, a second select gate line, and a plurality of word lines between the first select gate line and the second select gate line, wherein the first select gate line is between the conductive pad and the plurality of word lines, and wherein the second select gate line is between the plurality of word lines and the common source line, and
    wherein the channel structure comprises:
        a channel region, which comprises a first channel end contacting the conductive pad and a second channel end contacting the common source line;
        a gate dielectric film between the channel region and the plurality of gate lines; and
        a variable resistance pattern comprising an outer sidewall and a first end, the outer sidewall facing the plurality of word lines in a horizontal direction with the channel region and the gate dielectric film therebetween, and the first end being spaced apart from the first channel end of the channel region in the vertical direction and offset from the first select gate line in the vertical direction.
17. The semiconductor device of claim 16, wherein the plurality of gate lines further comprise at least one dummy word line between the first select gate line and the plurality of word lines, and
    wherein the at least one dummy word line is offset from the variable resistance pattern in the vertical direction.
18. The semiconductor device of claim 16, wherein the variable resistance pattern further comprises a second end that is spaced apart from the second channel end of the channel region along the vertical direction and is offset from the second select gate line in the horizontal direction.
19. An electronic system comprising:
    a semiconductor device on a substrate; and
    a controller provided on the substrate and electrically connected with the semiconductor device,
    wherein the semiconductor device comprises:
        a conductive layer;
        a conductive pad spaced apart from the conductive layer in a vertical direction;
        a plurality of gate lines spaced apart from each other in the vertical direction between the conductive layer and the conductive pad; and
        a channel structure extending in the vertical direction through the plurality of gate lines, and
    wherein the channel structure comprises:
        a channel region which defines a columnar space, and comprises a first channel end in contact with the conductive pad and a second channel end in contact with the conductive layer; and
        a variable resistance pattern comprising an outer sidewall and a first end, the outer sidewall overlapping a plurality of first gate lines, from among the plurality of gate lines, in a horizontal direction with the channel region therebetween, the first end being spaced apart from the first channel end of the channel region in the vertical direction, and the variable resistance pattern being offset from, in the vertical direction, at least one second gate line that is closest, from among the plurality of gate lines, to the conductive pad.
20. The electronic system of claim 19, wherein the substrate comprises wiring patterns that electrically connect the semiconductor device with the controller, and wherein the variable resistance pattern further comprises a second end spaced apart from the second channel end of the channel region in the vertical direction and is offset from at least one third gate line in the horizontal direction, the at least one third gate line being closest to the conductive layer.

* * * * *